United States Patent
Yamaoka et al.

(10) Patent No.: US 10,510,806 B2
(45) Date of Patent: Dec. 17, 2019

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Ryohei Yamaoka, Kanagawa (JP); Satoshi Seo, Kanagawa (JP); Shogo Uesaka, Kanagawa (JP); Shiho Nomura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/825,831

(22) Filed: Nov. 29, 2017

(65) Prior Publication Data
US 2018/0151630 A1  May 31, 2018

(30) Foreign Application Priority Data
Nov. 30, 2016 (JP) ................. 2016-232765

(51) Int. Cl.
*H01L 27/32* (2006.01)
*H01L 51/52* (2006.01)
(Continued)

(52) U.S. Cl.
CPC ....... *H01L 27/3209* (2013.01); *G09G 3/3233* (2013.01); *G09G 3/3258* (2013.01);
(Continued)

(58) Field of Classification Search
CPC .............. H01L 27/3209; H01L 51/504; H01L 51/5056; H01L 51/5203; H01L 51/5265
See application file for complete search history.

(56) References Cited

U.S. PATENT DOCUMENTS 7,906,226 B2   3/2011 Matsuura et al.
8,105,701 B2   1/2012 Matsuura et al.
(Continued)

FOREIGN PATENT DOCUMENTS

JP   2003-187977 A   7/2003
JP   2008-218320 A   9/2008
(Continued)

OTHER PUBLICATIONS

International Search Report re Application No. PCT/IB2017/057400, dated Feb. 6, 2018.
(Continued)

*Primary Examiner* — Seahvosh Nikmanesh
(74) *Attorney, Agent, or Firm* — Husch Blackwell LLP

(57) ABSTRACT

A highly reliable light-emitting element which can keep favorable characteristics throughout long-time driving is provided. In addition, a light-emitting element with high color purity and high emission efficiency is provided. Furthermore, a light-emitting device having a long lifetime in which the light-emitting element is used is provided. Moreover, an electronic device and a lighting device each of which has a long lifetime are provided. In the light-emitting element including an EL layer between a pair of electrodes, the EL layer has a stacked-layer structure of a first light-emitting layer, a second light-emitting layer, and a third light-emitting layer. The light-emitting layer includes an electron-transport material, a hole-transport material, and a light-emitting material. Furthermore, light emitted from the first light-emitting layer and light emitted from the third light-emitting layer have the same color and each have a longer wavelength than light emitted from the second light-emitting layer.

21 Claims, 27 Drawing Sheets

(51) Int. Cl.
*H01L 51/50* (2006.01)
*G09G 3/3258* (2016.01)
*G09G 3/3233* (2016.01)

(52) U.S. Cl.
CPC ........ *H01L 51/504* (2013.01); *H01L 51/5056* (2013.01); *H01L 51/5203* (2013.01); *H01L 51/5265* (2013.01); *H01L 51/5278* (2013.01); *G09G 2300/0842* (2013.01); *H01L 51/5016* (2013.01)

(56) References Cited

U.S. PATENT DOCUMENTS

| | | | |
|---|---|---|---|
| 8,470,455 | B2 | 6/2013 | Matsuura et al. |
| 8,736,157 | B2 | 5/2014 | Seo et al. |
| 8,853,680 | B2 | 10/2014 | Yamazaki et al. |
| 8,969,854 | B2 | 3/2015 | Takemura et al. |
| 8,981,355 | B2 | 3/2015 | Seo |
| 8,981,393 | B2 | 3/2015 | Seo et al. |
| 8,994,013 | B2 | 3/2015 | Seo |
| 8,994,263 | B2 | 3/2015 | Shitagaki et al. |
| 9,059,421 | B2 | 6/2015 | Seo et al. |
| 9,059,430 | B2 | 6/2015 | Seo et al. |
| 9,065,066 | B2 | 6/2015 | Seo et al. |
| 9,076,976 | B2 | 7/2015 | Seo et al. |
| 9,142,710 | B2 | 9/2015 | Seo et al. |
| 9,159,942 | B2 | 10/2015 | Seo et al. |
| 9,175,213 | B2 | 11/2015 | Seo et al. |
| 9,219,243 | B2 | 12/2015 | Matsubara et al. |
| 9,276,228 | B2 | 3/2016 | Seo et al. |
| 9,299,944 | B2 | 3/2016 | Seo et al. |
| 9,379,345 | B2 | 6/2016 | Seo et al. |
| 9,391,289 | B2 | 7/2016 | Seo et al. |
| 9,412,962 | B2 | 8/2016 | Hamada et al. |
| 9,604,928 | B2 | 3/2017 | Shitagaki et al. |
| 9,905,617 | B2 | 2/2018 | Seo et al. |
| 9,929,350 | B2 | 3/2018 | Yamazaki et al. |
| 2008/0238305 | A1 | 10/2008 | Kondo et al. |
| 2012/0217487 | A1 | 8/2012 | Yamazaki et al. |
| 2014/0034932 | A1 | 2/2014 | Seo et al. |
| 2015/0102331 | A1 | 4/2015 | Seo et al. |

FOREIGN PATENT DOCUMENTS

| | | |
|---|---|---|
| JP | 2008-270190 A | 11/2008 |
| JP | 2010-129252 A | 6/2010 |
| JP | 2010-182699 A | 8/2010 |
| JP | 2014-078037 A | 5/2014 |
| JP | 2015-232993 A | 12/2015 |
| KR | 10-0852122 | 8/2008 |
| KR | 2015-0044402 A | 4/2015 |
| TW | 201034507 | 9/2010 |
| TW | 201521222 | 6/2015 |
| WO | WO 2010/061788 A1 | 6/2010 |

OTHER PUBLICATIONS

Written Opinion re Application No. PCT/IB2017/057400, dated Feb. 6, 2018.

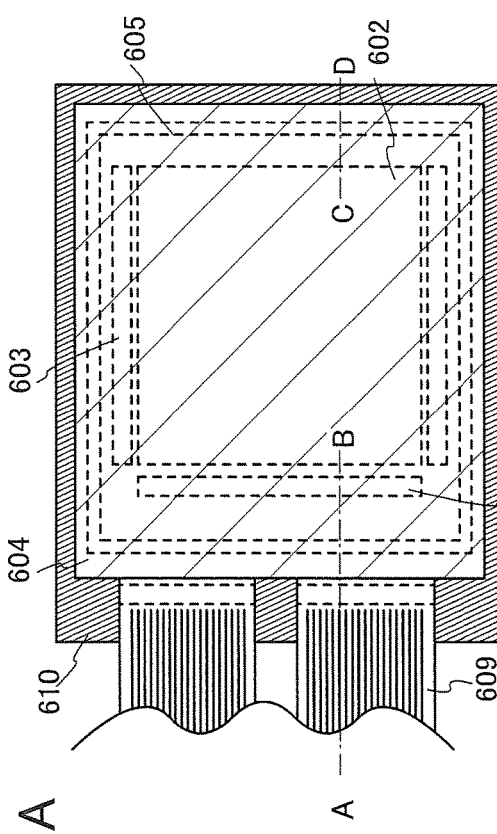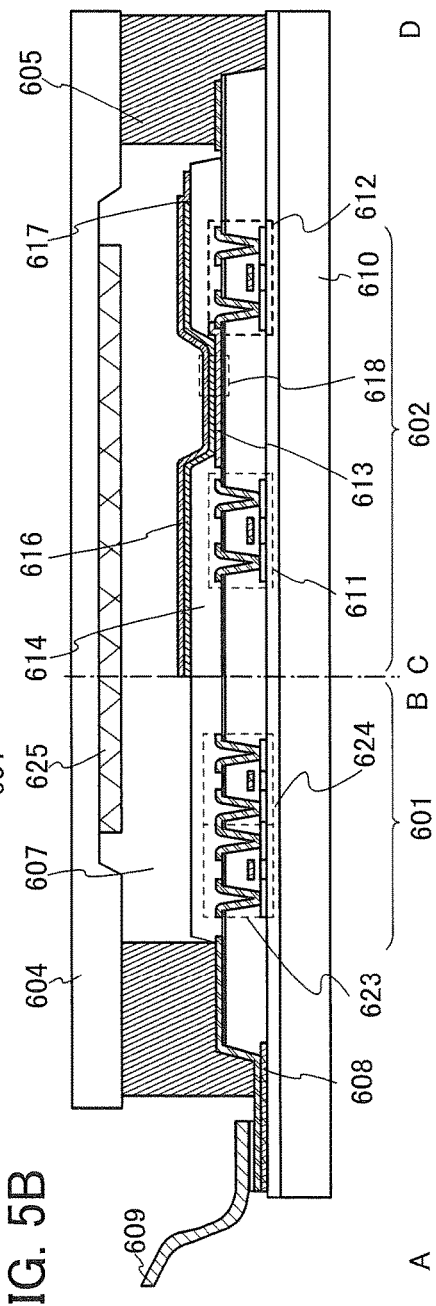

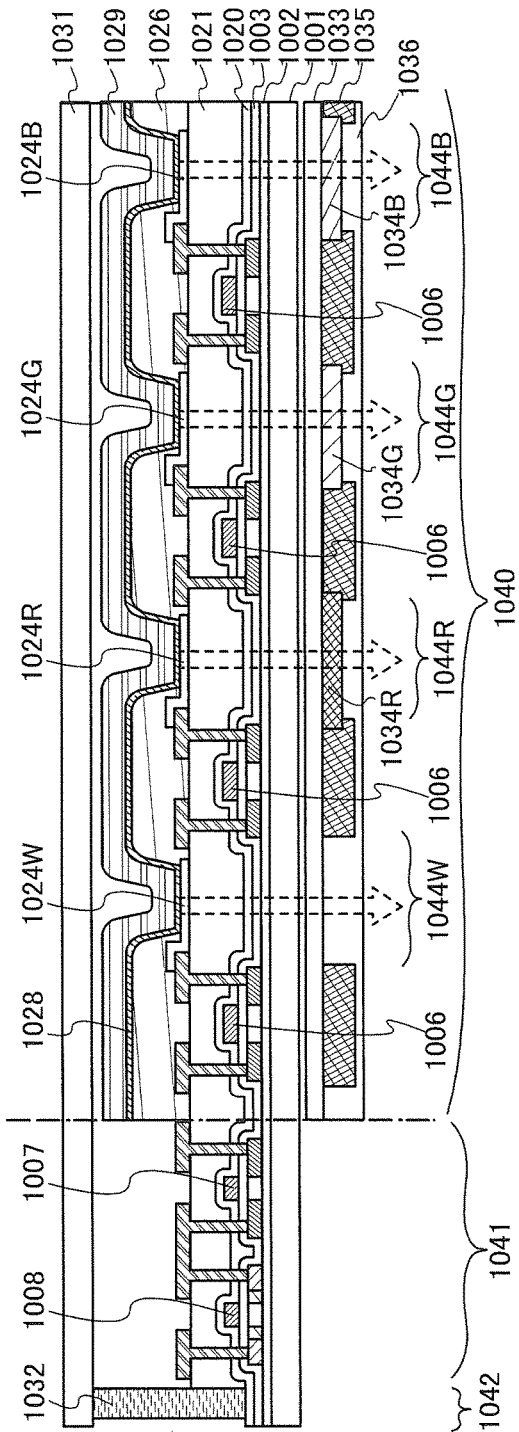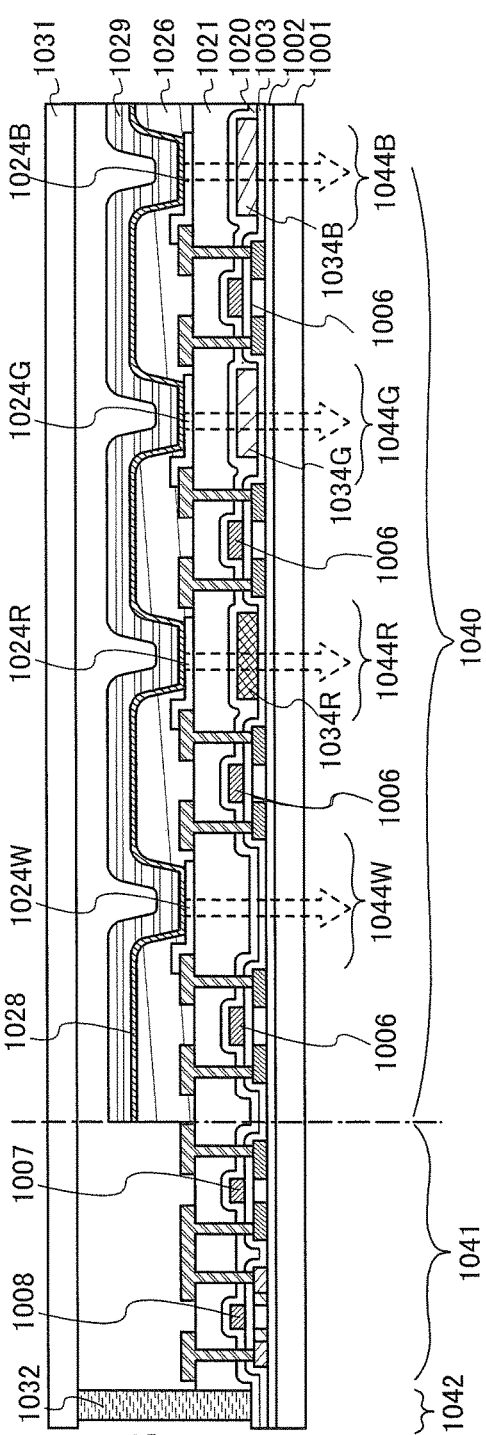

FIG. 8A
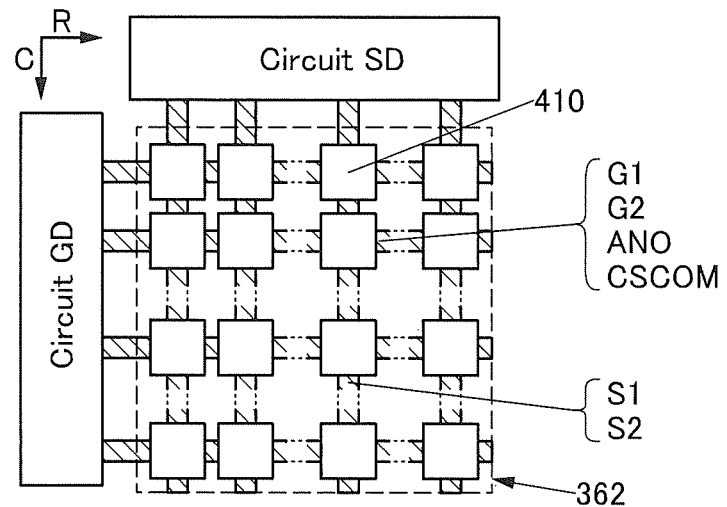
FIG. 8B1
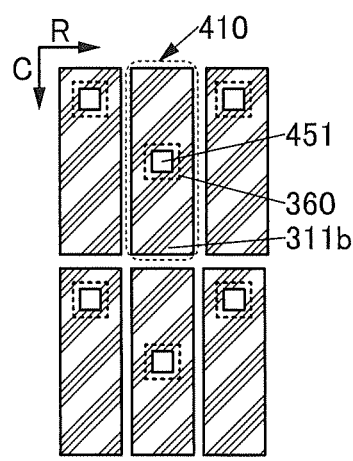
FIG. 8B2
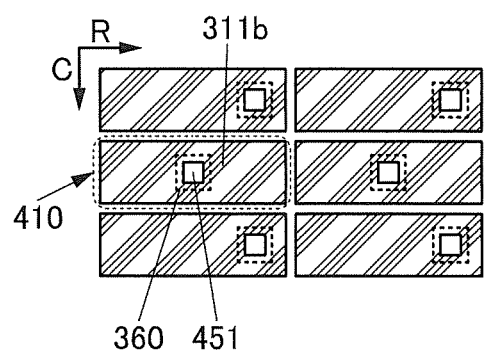

LIGHT-EMITTING ELEMENT, LIGHT-EMITTING DEVICE, ELECTRONIC DEVICE, AND LIGHTING DEVICE

TECHNICAL FIELD

One embodiment of the present invention relates to a novel light-emitting element. One embodiment of the present invention also relates to a light-emitting device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a light-emitting device, a display device, a lighting device, a power storage device, a memory device, a method for driving any of them, and a method for manufacturing any of them.

BACKGROUND ART

In recent years, research and development of light-emitting elements using electroluminescence (EL) have been actively carried out. In a basic structure of such a light-emitting element, a layer containing a light-emitting substance (an EL layer) is interposed between a pair of electrodes. By application of a voltage between the electrodes of this element, light emission from the light-emitting substance can be obtained.

Since the above light-emitting element is a self-luminous type, a light-emitting device using this light-emitting element has advantages such as high visibility, no necessity of a backlight, and low power consumption. Furthermore, such a light-emitting element also has advantages in that the element can be formed to be thin and lightweight, and that response time is high.

In the case where the above light-emitting element is used for a light-emitting device, there are the following two methods: a method of providing subpixels in a pixel with EL layers having functions of emitting light of different colors (hereinafter referred to as a separate coloring method) and a method of providing subpixels in a pixel with, for example, a common EL layer having a function of emitting white light and color filters having functions of transmitting light of different colors (hereinafter referred to as a color filter method).

One of the advantages of the color filter method is that the EL layer can be shared by all of the subpixels. Therefore, compared with the separate coloring method, loss of a material of the EL layer is small and the number of steps needed for formation of the EL layer can be reduced; thus, light-emitting devices can be manufactured at low cost with high productivity. Furthermore, although it is necessary, in the separate coloring method, to provide a space between the subpixels to prevent mixture of the materials of the EL layers in the subpixels, the color filter method does not need such a space and therefore enables a high-definition light-emitting device having higher pixel density.

The light-emitting element can emit light of a variety of colors depending on the kind of light-emitting substance included in the EL layer. In the view of application of the light-emitting element to lighting devices, a light-emitting element that emits white light or light of color close to white and has high efficiency is demanded. In the view of application of the light-emitting element to a light-emitting device utilizing the color filter method, a high efficiency light-emitting element emitting light with high color purity is demanded. In addition, for the light-emitting element used for the lighting device and the light-emitting device, low power consumption is demanded.

Increasing the extraction efficiency of light is important for higher emission efficiency of the light-emitting element. In order to increase the extraction efficiency of light from the light-emitting element, a method has been proposed, in which a micro optical resonator (microcavity) structure utilizing a resonant effect of light between a pair of electrodes is used to increase the intensity of light having a specific wavelength (e.g., see Patent Document 1).

As a light-emitting element that emits white light, an element including a charge-generation layer between a plurality of EL layers (a tandem element) has been proposed.

In order to improve element characteristics of such light-emitting elements, improvement of an element structure, development of a material, and the like have been actively carried out.

REFERENCE

Patent Document

[Patent Document 1] Japanese Published Patent Application No. 2010-182699

DISCLOSURE OF INVENTION

In development of a light-emitting element, the reliability is one of the important factors in evaluation of the light-emitting element. Even if the characteristics of the light-emitting element in the initial stage are favorable, in the case where the light-emitting element cannot withstand long-time driving and the lifetime as an element is short, the utility value is low and the commercialization is difficult. Thus, it is desirable to develop a light-emitting element which can keep the favorable characteristics in the initial stage and can withstand driving as long as possible. Furthermore, with an increase in the definition of a light-emitting device, a light-emitting element that emits light with high color purity has been required.

An object of one embodiment of the present invention is to provide a light-emitting element with high reliability which can keep favorable characteristics throughout long-time driving. Another object of one embodiment of the present invention is to provide a light-emitting element with high color purity. Another object of one embodiment of the present invention is to provide a light-emitting element with high emission efficiency. Another object of one embodiment of the present invention is to provide a light-emitting element with low power consumption.

Another object of one embodiment of the present invention is to provide a light-emitting device having a long lifetime in which the light-emitting element is used. Another object of one embodiment of the present invention is to provide a light-emitting device with high color purity in which the light-emitting element is used. Another object of one embodiment of the present invention is to provide a light-emitting device with high emission efficiency in which the light-emitting element is used. Another object of one embodiment of the present invention is to provide an electronic device and a lighting device each of which has a long lifetime. Another object of one embodiment of the present invention is to provide a light-emitting device with low power consumption in which the light-emitting element is used.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting element including an EL layer between a pair of electrodes. A light-emitting layer included in the EL layer has a stacked-layer structure which is different from the conventional structure, whereby the light-emitting element can keep favorable characteristics throughout long-time driving even in the case where carrier balance is changed over time due to driving of the light-emitting element or a light-emitting region is shifted due to the change.

Specifically, in the case where the light-emitting layer of the light-emitting element includes a first layer, a second layer, and a third layer, the second layer emits light of the same color as the first layer, and the third layer containing a light-emitting material exhibiting emission at a shorter wavelength than those of the first layer and the second layer is sandwiched between the first layer and the second layer. With such a structure, even when the light-emitting region is shifted due to the change of carrier balance, the first layer or the second layer can compensate for the change, and the stable state of the whole light-emitting layer can be kept, so that the light-emitting element which keeps favorable characteristics throughout long-time driving can be obtained.

Thus, one embodiment of the present invention is a light-emitting element including an EL layer between an anode and a cathode. The EL layer has a structure where a first light-emitting layer, a second light-emitting layer, and a third light-emitting layer are stacked in this order from the anode side. Light emitted from the first light-emitting layer and light emitted from the third light-emitting layer have the same color and each have a longer wavelength than light emitted from the second light-emitting layer.

Another embodiment of the present invention is a light-emitting element including a first light-emitting unit and a second light-emitting unit between an anode and a cathode. The first light-emitting unit and the second light-emitting unit are stacked with an intermediate layer positioned therebetween. The second light-emitting unit includes an EL layer. The EL layer has a structure where a first light-emitting layer, a second light-emitting layer, and a third light-emitting layer are stacked in this order. Light emitted from the first light-emitting layer and light emitted from the third light-emitting layer have the same color and each have a longer wavelength than light emitted from the second light-emitting layer.

In any of the above structures, emission spectra of light emitted from the first light-emitting layer and light emitted from the third light-emitting layer each preferably have at least one peak wavelength at greater than or equal to 600 nm and less than or equal to 740 nm, and an emission spectrum of light emitted from the second light-emitting layer preferably has at least one peak wavelength at greater than or equal to 480 nm and less than or equal to 550 nm.

In any of the above structures, the emission spectra of light emitted from the first light-emitting layer and light emitted from the third light-emitting layer each preferably have a half width of greater than or equal to 5 nm and less than or equal to 120 nm and a peak wavelength at greater than or equal to 620 nm and less than or equal to 680 nm.

In any of the above structures, the first light-emitting layer and the third light-emitting layer preferably contain the same light-emitting material.

In any of the above structures, the light-emitting material is preferably capable of converting triplet excitation energy into light emission.

In each of the above structures, the light-emitting material contained in the light-emitting layer is preferably a substance emitting phosphorescence.

In each of the above structures, it is preferable that the first light-emitting layer contain a first hole-transport material and a first electron-transport material, the second light-emitting layer contain a second hole-transport material and a second electron-transport material, and the third light-emitting layer contain a third hole-transport material and a third electron-transport material.

In each of the above structures, it is preferable that the first hole-transport material and the first electron-transport material form a first exciplex, the second hole-transport material and the second electron-transport material form a second exciplex, and the third hole-transport material and the third electron-transport material form a third exciplex.

In each of the above structures, the thickness of the second light-emitting layer is preferably larger than each of the thickness of the first light-emitting layer and the third light-emitting layer.

In each of the above structures, it is preferable that one of the anode and the cathode be a reflective electrode and the other be a transflective electrode.

Another embodiment of the present invention is a light-emitting device including a plurality of the above light-emitting elements. Light emitted from the first light-emitting element obtained through a first color filter has a chromaticity x of greater than 0.680 and less than or equal to 0.720 and a chromaticity y of greater than or equal to 0.260 and less than or equal to 0.320 on the CIE 1931 chromaticity coordinates. Light emitted from the second light-emitting element obtained through a second color filter has a chromaticity x of greater than or equal to 0.130 and less than or equal to 0.250 and a chromaticity y of greater than 0.710 and less than or equal to 0.810 on the CIE 1931 chromaticity coordinates.

Another embodiment of the present invention is a light-emitting device in which an area of a triangle formed by connecting the CIE 1931 chromaticity coordinates of red light obtained from the first light-emitting element, green light obtained from the first light-emitting element, and blue light obtained from the light-emitting device is 80% or more and 100% or less of an area of a triangle formed by connecting the CIE 1931 chromaticity coordinates of red, green, and blue of the BT.2020 standard.

Other embodiments of the present invention are not only a light-emitting device including the light-emitting element but also an electronic device and a lighting device each including the light-emitting device. Accordingly, a light-emitting device in this specification refers to an image display device or a light source (including a lighting device). In addition, the light-emitting device might include any of the following modules in its category: a module in which a connector such as a flexible printed circuit (FPC) or a tape carrier package (TCP) is attached to a light-emitting element; a module having a TCP provided with a printed wiring board at the end thereof; and a module having an integrated circuit (IC) directly mounted on a light-emitting element by a chip on glass (COG) method.

According to one embodiment of the present invention, a light-emitting element with high reliability which can keep favorable characteristics throughout long-time driving is provided. According to another embodiment of the present invention, a light-emitting element with high color purity is provided. According to another embodiment of the present invention, a light-emitting element with high emission efficiency is provided. According to another embodiment of the present invention, a light-emitting element with low power consumption is provided.

According to another embodiment of the present invention, a light-emitting device having a long lifetime in which the light-emitting element is used is provided. According to another embodiment of the present invention, a light-emitting device with high color purity in which the light-emitting element is used is provided. According to another embodiment of the present invention, a light-emitting device with high emission efficiency in which the light-emitting element is used is provided. According to another embodiment of the present invention, an electronic device and a lighting device each of which has a long lifetime are provided. According to another embodiment of the present invention, a light-emitting device with low power consumption in which the light-emitting element is used is provided.

BRIEF DESCRIPTION OF DRAWINGS

In the accompanying drawings:

FIGS. 5A and 5B are conceptual diagrams of an active matrix light-emitting device of one embodiment of the present invention;

FIGS. 6A and 6B are each a conceptual diagram of an active matrix light-emitting device of one embodiment of the present invention;

FIGS. 8A, 8B1, and 8B2 are schematic views of a display device of one embodiment of the present invention;

BEST MODE FOR CARRYING OUT THE INVENTION

Figure 1A:
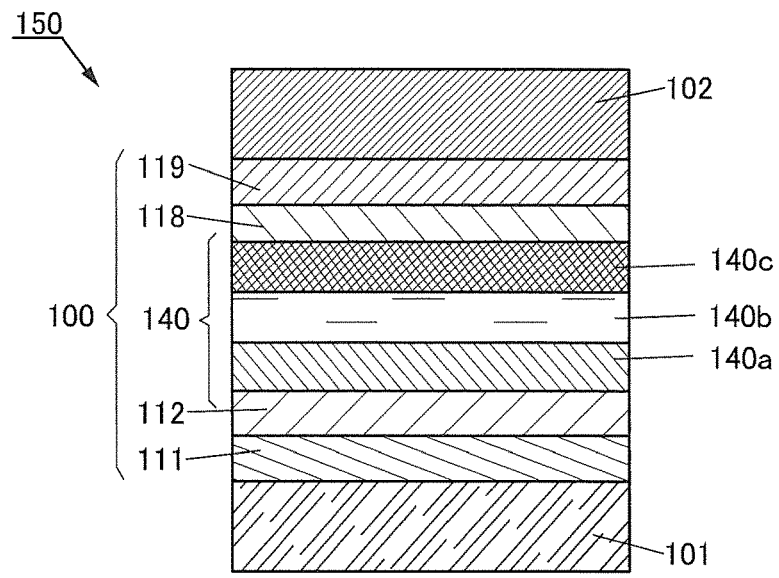
FIGS. 1A to 1C are schematic cross-sectional views of a light-emitting element of one embodiment of the present invention.

Embodiments of the present invention will be described below with reference to the drawings. However, the present invention is not limited to the following description, and the mode and details can be variously changed unless departing from the scope and spirit of the present invention. Accordingly, the present invention should not be interpreted as being limited to the content of the embodiments below.

Note that the position, the size, the range, or the like of each structure illustrated in the drawings and the like are not accurately represented in some cases for easy understanding. Therefore, the disclosed invention is not necessarily limited to the position, size, range, or the like as disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a singlet excited state refers to a singlet state having excitation energy. The lowest level of the singlet excitation energy level (S1 level) refers to the excitation energy level of the lowest singlet excited state (S1 state). A triplet excited state means a triplet state with excitation energy. The lowest level of the triplet excitation energy level (T1 level) refers to the excitation energy level of the lowest triplet excited state (T1 state). Note that in this specification and the like, simple expressions "singlet excited state" and "singlet excitation energy level" mean the S1 state and the S1 level, respectively, in some cases. In addition, expressions "triplet excited state" and "triplet excitation energy level" mean the T1 state and the T1 level, respectively, in some cases.

In this specification and the like, a fluorescent material refers to a material that emits light in the visible light region when the singlet excited state relaxes to the ground state. A phosphorescent material refers to a material that emits light in the visible light region at room temperature when the triplet excited state relaxes to the ground state. That is, a phosphorescent material refers to a material that can convert triplet excitation energy into visible light.

Note that in this specification and the like, "room temperature" refers to a temperature higher than or equal to 0° C. and lower than or equal to 40° C.

In general, color is defined by three aspects of hue (corresponding to the wavelength of light of a single color), chroma (saturation, i.e., the degree to which it differs from white), and value (brightness, i.e., the intensity of light). In this specification and the like, color may be defined by only one of the above three aspects or two of the aspects which are selected arbitrarily. In this specification, a difference between two colors of light means a difference in at least one of the above three aspects and includes a difference in the shape between two spectra of light or in the distribution of the relative intensity of the peaks between two spectra of light.

In this specification and the like, a wavelength range of blue refers to a wavelength range of greater than or equal to 400 nm and less than 480 nm, and blue light has at least one peak in that wavelength range in an emission spectrum. A wavelength range of green refers to a wavelength range which is greater than or equal to 480 nm and less than 550 nm, and green light has at least one peak in that wavelength range in an emission spectrum. A wavelength range of yellow refers to a wavelength range which is greater than or equal to 550 nm and less than 600 nm, and yellow light has at least one peak in that wavelength range in an emission spectrum. A wavelength range of red refers to a wavelength range which is greater than or equal to 600 nm and less than or equal to 740 nm, and red light has at least one peak in that wavelength range in an emission spectrum.

Embodiment 1

In this embodiment, a light-emitting element of one embodiment of the present invention is described.

The light-emitting element of one embodiment of the present invention is formed in a manner that an EL layer including a light-emitting layer is sandwiched between a pair of electrodes, and the EL layer has a stacked-layer structure of at least a first light-emitting layer, a second light-emitting layer, and a third light-emitting layer.

An element structure of the light-emitting element of one embodiment of the present invention is described below with reference to FIGS. 1A to 1C.

In a light-emitting element 150 illustrated in FIG. 1A, an EL layer 100 that includes a light-emitting layer 140 is provided between a pair of electrodes (an electrode 101 and an electrode 102). The EL layer 100 has a structure in which a hole-injection layer 111, a hole-transport layer 112, a light-emitting layer 140 (140a, 140b, and 140c), an electron-transport layer 118, an electron-injection layer 119, and the like are stacked over the electrode 101 in this order.

Although description is given assuming that the electrode 101 serves as an anode and the electrode 102 serves as a cathode in this embodiment, the structure of the light-emitting element is not limited thereto. That is, it is possible that the electrode 101 serves as a cathode and the electrode 102 serves as an anode. In that case, the stacking order of layers is reversed. In other words, the hole-injection layer, the hole-transport layer, the light-emitting layer, the electron-transport layer, and the electron-injection layer may be stacked in this order from the anode side.

Figure 1B:
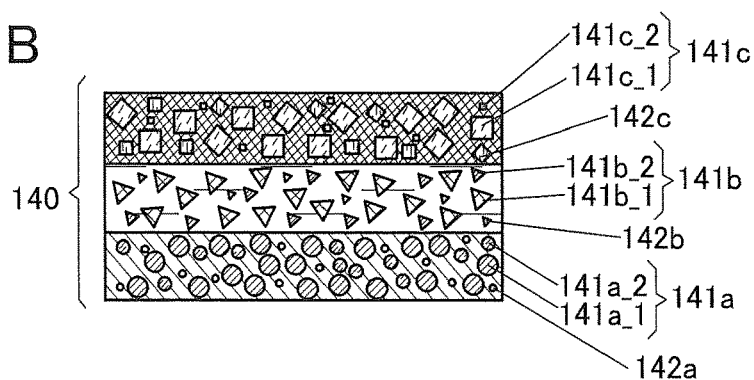

Note that the light-emitting layer 140 has a stacked-layer structure in which the light-emitting layer 140a, the light-emitting layer 140b, and the light-emitting layer 140c are stacked, and as illustrated in FIG. 1B, the light-emitting layer 140a includes a host material 141a and a light-emitting material 142a. Furthermore, the host material 141a preferably includes an electron-transport material 141a_1 and a hole-transport material 141a_2. Similarly, the light-emitting layer 140b includes a host material 141b and a light-emitting material 142b. Furthermore, the host material 141b preferably includes an electron-transport material 141b_1 and a hole-transport material 141b_2. The light-emitting layer 140c includes a host material 141c and a light-emitting material 142c. Furthermore, the host material 141c preferably includes an electron-transport material 141c_1 and a hole-transport material 141c_2.

Like the above-described light-emitting layer 140 containing a plurality of light-emitting materials, with a structure where light of a plurality of colors can be extracted from one light-emitting layer, a light-emitting element exhibiting multi-color light emission can be easily fabricated, which is preferable.

In the case where a light-emitting element exhibiting a plurality of emission colors, such as the light-emitting element 150, is driven for a long time and luminance degradation rates of the emission colors are different from each other, the emission color of light extracted from the light-emitting element 150 is changed over time in some cases, leading to degradation of display quality when the light-emitting element is used in a display or the like. The present inventors have found that when the light-emitting layer 140 includes three layers of the light-emitting layers 140a, 140b, and 140c, and light emitted from the light-emitting layer 140a and light emitted from the light-emitting layer 140c have the same color and each have a longer wavelength than light emitted from the light-emitting layer 140b, a difference of luminance degradation between the emission colors can be reduced and the reliability of the light-emitting element can be improved.

Here, the light-emitting material 142a and the light-emitting material 142c are preferably the same material. With such a structure, a change in emission color when the light-emitting element is driven for a long time can be reduced. In addition, with such a structure, the light-emitting element can be easily manufactured as compared with the case where different light-emitting materials are used, which is preferable.

Note that the electron-transport material 141a_1, the electron-transport material 141b_1, and the electron-transport material 141c_1 are preferably the same material. In addition, the hole-transport material 141a_2, the hole-transport material 141b_2, and the hole-transport material 141c_2 are preferably the same material. With such a structure, a change in emission color when the light-emitting element is driven for a long time can be reduced. In addition, with such a structure, the light-emitting element can be easily manufactured as compared with the case where different light-emitting materials are used, which is preferable.

The electron-transport material 141a_1 and the hole-transport material 141a_2, the electron-transport material 141b_1 and the hole-transport material 141b_2, and the electron-transport material 141c_1 and the hole-transport material 141c_2 each preferably form an exciplex. With such a structure, the driving voltage of the light-emitting element can be reduced as described above. In addition, the light-emitting materials 142a, 142b, and 142c are each preferably a substance which can convert triplet excitation energy into light emission, further preferably a substance which emits phosphorescence. With such a structure, the light-emitting element can have high emission efficiency. Furthermore, ExTET, which will be described later, can be used; thus, the light-emitting element can have high emission efficiency and can have high reliability.

When the light-emitting element is driven, the carrier balance in the light-emitting layer is changed over time due to the deterioration of the material, whereby a recombination region (a region where an exciton is generated in the light-emitting layer) is shifted in some cases. In this case, as time passes, the emission intensity of the light-emitting layer 140a becomes relatively smaller than the emission intensity of the light-emitting layer 140b, which leads to a change in emission color over time. Here, like the light-emitting layer 140, the light-emitting layer 140c, which emits light whose color is the same as that of the light-emitting layer 140a, is formed over the light-emitting layer 140b, whereby even when the recombination region is shifted as described above, the light-emitting layer 140c can emit light of the same color, and a difference in luminance degradation between the emission colors can be reduced. That is, degradation of the characteristics of the whole light-emitting layer can be suppressed; thus, the favorable characteristics can be kept throughout long-time driving.

In this case, the thickness of the light-emitting layer 140b is preferably larger than those of the light-emitting layers 140a and 140c. With such a structure, light emission from the light-emitting layer 140b and light emission from the light-emitting layer 140a and the light-emitting layer 140c can be efficiently obtained. In addition, the intensity of emission from the light-emitting layer 140b and the intensity of emission from the light-emitting layer 140a and the light-emitting layer 140c can be adjusted. With such a structure, a difference in luminance degradation between the emission obtained from the light-emitting layer 140b and the emission obtained from the light-emitting layers 140a and 140c can be reduced.

One embodiment of the present invention is a light-emitting element having a plurality of emission colors, and full-color display can be achieved using a color filter. That is, the plurality of emission colors are separated using a color filter, whereby a plurality of light-emitting elements exhibiting the colors (e.g., a first emission color mainly obtained from the light-emitting layers 140a and 140c and a second emission color mainly obtained from the light-emitting layer 140b) can be obtained. When these light-emitting elements are used for the pixel, full-color display is possible. In this case, the above effect of the present invention of reducing the difference in luminance degradation between the emission colors leads to a reduction in difference in luminance degradation between the light-emitting elements exhibiting the colors, that is, the pixels. Thus, a full-color display device with a small difference in luminance degradation between the pixels, that is, with less color shift over time, can be obtained.

In this case, emission spectra of light emitted from the light-emitting layers 140a and 140c each preferably have at least one peak at greater than or equal to 600 nm and less than or equal to 740 nm, and an emission spectrum of light emitted from the light-emitting layer 140b preferably has at least one peak at greater than or equal to 480 nm and less than or equal to 550 nm. With such a structure, full-color display with high display quality can be achieved. At present, some standards are established as quality indicators for full-color displays.

For example, the sRGB standard, which is an international standard for color spaces defined by the International Electrotechnical Commission (TFC) to standardize color reproduction on devices such as displays, printers, digital cameras, and scanners, is widely used. Note that in the sRGB standard, the chromaticities (x,y) on the CIE1931 chromaticity coordinates (x,y chromaticity coordinates) defined by the International Commission on Illumination (CIE) are (0.640,0.330) for red (R), (0.300,0.600) for green (G), and (0.150,0.060) for blue (B).

In the NTSC standard, which is a color gamut standard for analog television systems defined by the National Television System Committee (NTSC) in America, the chromaticities (x,y) are (0.670,0.330) for red (R), (0.210,0.710) for green (G), and (0.140,0.080) for blue (B).

In the DCI-P3 standard (defined by Digital Cinema Initiatives, LLC), which is the international unified standard used when distributing digital movies (cinema), the chromaticities (x,y) are (0.680,0.320) for red (R), (0.265,0.690) for green (G), and (0.150,0.060) for blue (B).

In Recommendation ITU-R BT.2020 (hereinafter referred to as BT.2020) for ultra high definition television (UHDTV, also referred to as Super Hi-Vision), which is the standard defined by Japan Broadcasting Corporation (NHK), the chromaticities (x,y) are (0.708,0.292) for red, (0.170,0.797) for green, and (0.131,0.046) for blue.

Although various standards relating to image display are established, in the light-emitting element of one embodiment of the present invention, the emission spectrum of light obtained from the light-emitting layers 140a and 140c preferably has a half width of greater than or equal to 5 nm and less than or equal to 120 nm and a peak at greater than or equal to 620 nm and less than or equal to 680 nm. Further preferably, the emission spectrum has a half width of greater than or equal to 15 nm and less than or equal to 90 nm and a peak at greater than or equal to 625 nm and less than or equal to 660 nm. With a structure which can emit light as described above, the light-emitting element having high color reproducibility of red light through the color filter can be obtained.

<<Microcavity Structure>>

Figure 1C:
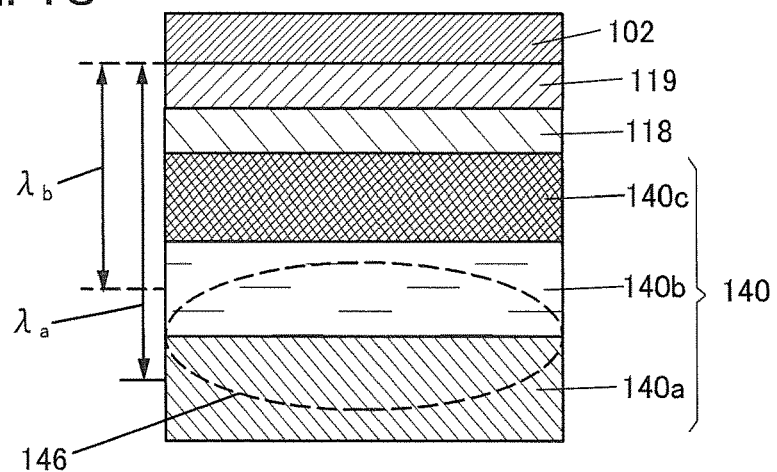

In the light-emitting element of one embodiment of the present invention, for example, a micro optical resonator (microcavity) structure in which the electrode 101 is a reflective electrode and the electrode 102 is a transflective electrode can be employed in FIG. 1C, whereby light emission from the light-emitting layer 140 in the EL layer 100 can be resonated between the electrodes and light emitted from the electrode 102 can be intensified.

Note that in this embodiment, light is extracted to the electrode 102 side (cathode side); however, light may be extracted to the electrode 101 side (anode side). In this case, the electrode 101 is a transflective electrode and the electrode 102 is a reflective electrode.

Note that when the electrode 101 of the light-emitting element is a reflective electrode having a structure in which a reflective conductive material and a light-transmitting conductive material (transparent conductive film) are stacked, optical adjustment can be performed by controlling the thickness of the transparent conductive film. Specifically, when the wavelength of light from the light-emitting layer 140 is $\lambda$, the distance between the electrode 101 and the electrode 102 is preferably adjusted to around $m\lambda/2$ (m is a natural number).

To amplify desired light (wavelength: $\lambda$) obtained from the light-emitting layer 140, the optical length from the electrode 101 to a region where the desired light is obtained in the light-emitting layer 140 (light-emitting region) and the optical length from the electrode 102 to the region where the desired light is obtained in the light-emitting layer 140 (light-emitting region) are preferably adjusted to around $(2m'-1)\lambda/4$ (m' is a natural number). Here, the light-emitting region means a region where holes and electrons are recombined in the light-emitting layer 140.

By such optical adjustment, the spectrum of specific monochromatic light from the light-emitting layer 140 can be narrowed and light emission with high color purity can be obtained.

In the above-described microcavity structure in a light-emitting element which emits light of two or more colors, the optical length for resonating light between the electrodes varies depending on emission colors; thus, it is difficult to perform optical adjustment suitable for all of the emission colors (in which the distance between the light-emitting region and the electrode 102 is set to around $(2m'-1)\lambda/4$). Furthermore, in the case where ultra-high color gamut of the BT.2020 standard or the like is required, it is difficult to efficiently obtain the effect of the microcavity from all of the emission colors.

Here, the present inventors have found that when the light-emitting layer 140 of the light-emitting element emitting light of two or more colors in which the microcavity structure is employed includes three layers of the light-emitting layers 140a, 140b, and 140c, and light emitted from the light-emitting layer 140a and light emitted from the light-emitting layer 140c have the same color and each have a longer wavelength than light emitted from the light-emitting layer 140b, the effect of the microcavity can be efficiently obtained and a light-emitting element with high color purity and high emission efficiency can be obtained.

In the case where the emission intensity of the light-emitting element which emits light of two or more colors is increased with the microcavity structure, the thicknesses of layers need to be adjusted so that the optical length between the light-emitting region and the electrode 102 is $(2m'-1)\lambda/4$ (m' is a natural number). Here, $\lambda$ represents a wavelength; thus, it is found that as $\lambda$ is shorter, the optical length between the light-emitting region and the electrode 102 becomes shorter. In other words, as $\lambda$ is longer, the optical length between the light-emitting region and the electrode 102 becomes longer.

FIG. 1C is a conceptual diagram of a distance between the light-emitting region and the electrode 102 in the light-emitting element of one embodiment of the present invention. FIG. 1C illustrates only the light-emitting layer 140, the electron-transport layer 118, the electron-injection layer 119, and the electrode 102 for simplification of the description. In FIG. 1C, a light-emitting region 146 is located in the vicinity of an interface between the light-emitting layers 140a and 140b, whereby light emission from the light-emitting layer 140a and light emission from the light-emitting layer 140b both can be extracted. Here, as in the light-emitting element of one embodiment of the present invention, the light-emitting layer 140 includes three layers of the light-emitting layers 140a, 140b, and 140c, and light emitted from the light-emitting layer 140a and light emitted from the light-emitting layer 140c have the same color and each have a longer wavelength than light emitted from the light-emitting layer 140b. Accordingly, a distance $\lambda_a$ between the electrode 102 and the light-emitting region of the light-emitting layer 140a having a longer emission wavelength can be long, and a distance $\lambda_b$ between the electrode 102 and the light-emitting region of the light-emitting layer 140b having a shorter emission wavelength can be short. That is, in the light-emitting element of one embodiment of the present invention, the distance between the light-emitting region and the electrode 102 is easily adjusted to the optical length of each color. Thus, the effect of the microcavity structure can be efficiently utilized, and the light-emitting element can correspond to the ultra-high color gamut of the BT.2020 standard or the like. Then, a light-emitting element with good chromaticity and high emission efficiency can be obtained.

In addition, the position of the light-emitting region 146 or the thickness of the light-emitting layer 140b is appropriately adjusted, whereby the emission color can be adjusted. Although FIG. 1C shows an example in which the light-emitting region 146 extends over the light-emitting layers 140a and 140b, the light-emitting region 146 may further extend over the light-emitting layer 140c. In this case, since the light-emitting region 146 is provided over a wide range, the luminance degradation of the emission color obtained from the light-emitting layers 140a and 140c is suppressed, which is preferable.

In this manner, the light-emitting element of one embodiment of the present invention which has high color purity and high emission efficiency can be obtained, and the light-emitting element can correspond to the ultra-high color gamut of the BT.2020 standard or the like. Furthermore, a highly reliable light-emitting element in which a change in chromaticity of each color due to driving is less likely to occur can be obtained.

In the case where it is difficult to precisely determine the reflective regions of the electrodes 101 and 102, the optical length for intensifying light emitted from the light-emitting layer 140 may be derived on the assumption that certain regions of the electrodes 101 and 102 are the reflective regions. In the case where it is difficult to precisely determine the light-emitting region of the light-emitting layer 140, the optical length for intensifying light emitted from the light-emitting layer 140 may be derived on the assumption that certain region of the light-emitting layer 140 is the light-emitting region. That is, in this specification and the like, "around $\lambda$" is $\lambda \pm 20$ nm.

<Material>

Next, components of a light-emitting element of one embodiment of the present invention are described in detail below.

<<Light-Emitting Layer>>

The light-emitting layer 140 includes the light-emitting layer 140a, the light-emitting layer 140b, and the light-emitting layer 140c, which include the host material 141a, the host material 141b, and the host material 141c, respectively, in the largest proportion by weight. The light-emitting material 142a, the light-emitting material 142b, and the light-emitting material 142c are dispersed into the host material 141a, the host material 141b, and the host material 141c, respectively. In the case where the light-emitting material 142a, the light-emitting material 142b, and the light-emitting material 142c are fluorescent compounds, the S1 level of the host material 141a (the electron-transport material 141a_1 and the hole-transport material 141a_2) of the light-emitting layer 140a, the S1 level of the host material 141b (the electron-transport material 141b_1 and the hole-transport material 141b_2) of the light-emitting layer 140b, and the S1 level of the host material 141c (the electron-transport material 141c_1 and the hole-transport material 141c_2) of the light-emitting layer 140c are preferably higher than the S1 level of the light-emitting material 142a, the S1 level of the light-emitting material 142b, and the S1 level of the light-emitting material 142c, respectively. In the case where the light-emitting material 142a, the light-emitting material 142b, and the light-emitting material 142c are phosphorescent compounds, the T1 level of the host material 141a (the electron-transport material 141a_1 and the hole-transport material 141a_2) of the light-emitting layer 140a, the T1 level of the host material 141b (the electron-transport material 141b_1 and the hole-transport material 141b_2) of the light-emitting layer 140b, and the T1 level of the host material 141c (the electron-transport material 141c_1 and the hole-transport material 141c_2) of the light-emitting layer 140c are preferably higher than the T1 level of the light-emitting material 142a, the T1 level of the light-emitting material 142b, and the T1 level of the light-emitting material 142c, respectively.

The electron-transport materials 141a_1, 141b_1, and 141c_1 are preferably compounds each having a nitrogen-containing six-membered heteroaromatic skeleton. Specific examples thereof include compounds having any of a pyridine skeleton, a diazine skeleton (a pyrazine skeleton, a pyrimidine skeleton, and a pyridazine skeleton), and a triazine skeleton. As examples of these basic compounds having a nitrogen-containing heteroaromatic skeleton, compounds such as a pyridine derivative, a bipyridine derivative, a pyrimidine derivative, a triazine derivative, a quinoxaline derivative, a dibenzoquinoxaline derivative, a phenanthroline derivative, and a purine derivative can be given. As the electron-transport materials 141a_1, 141b_1, and 141c_1, materials having a property of transporting more electrons than holes (an electron-transport material) can be used, and a material having an electron mobility of $1 \times 10^{-6}$ cm$^2$/Vs or higher is preferable.

Specific examples include heterocyclic compounds having a pyridine skeleton such as bathophenanthroline (abbreviation: BPhen) and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTP-DBq-II), 2-[3-(3,9'-bi-9H-carbazol-9-yl)phenyl]dibenzo[f,h]quinoxaline (abbreviation: 2mCzCzPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); and heterocyclic compounds having a pyridine skeleton such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the heterocyclic compounds, the heterocyclic compounds having a triazine skeleton, a diazine (pyrimidine, pyrazine, pyridazine) skeleton, or a pyridine skeleton are highly reliable and stable and are thus preferably used. In addition, the heterocyclic compounds having the skeletons have a high electron-transport property to contribute to a reduction in driving voltage. Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1 \times 10^{-6}$ cm$^2$/Vs or higher. Note that other substances may also be used as long as their electron-transport properties are higher than their hole-transport properties.

The hole-transport materials 141a_2, 141b_2, and 141c_2 are preferably compounds each having a nitrogen-containing five-membered heteroaromatic skeleton or a tertiary amine skeleton. Specific examples thereof include compounds having any of a pyrrole skeleton and an aromatic amine skeleton. As examples, an indole derivative, a carbazole derivative, a triarylamine derivative, and the like can be given. Examples of a nitrogen-containing five-membered heterocyclic skeleton include an imidazole skeleton, a triazole skeleton, and a tetrazole skeleton. As the hole-transport materials 141a_2, 141b_2, and 141c_2, materials having a property of transporting more holes than electrons (a hole-transport material) can be used, and a material having a hole mobility of $1 \times 10^{-6}$ cm$^2$/Vs or higher is preferable. Furthermore, the hole-transport material may be a high molecular compound.

Examples of the aromatic amine compounds that can be used as the material having a high hole-transport property are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Furthermore, it is possible to use N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), N,N,N',N',N'',N'',N''',N'''-octaphenyldibenzo[g,p]chrysene-2,7,10,15-tetraamine (abbreviation: DBC1), or the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl) methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N'-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino] spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl] fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl) phenyl]-N,N'-diphenyl-9,9-dimethylfluorene-2,7-diamine (abbreviation: YGA2F). Other examples are amine compounds, carbazole compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), and 2,8-di(9H-carbazol-9-yl)-dibenzothiophene (abbreviation: Cz2DBT). Among the above compounds, compounds having a pyrrole skeleton or an aromatic amine skeleton are preferred because of their high stability and reliability. In addition, the compounds having such skeletons have a high hole-transport property to contribute to a reduction in driving voltage.

As the hole-transport materials 141a_2, 141b_2, and 141c_2, compounds having a nitrogen-containing five-membered heteroaromatic skeleton, such as an imidazole skeleton, a triazole skeleton, and a tetrazole skeleton, can be used. Specifically, 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2''-(1,3,5-benzenetriyl)tris(1-phenyl-1H-benzimidazole) (abbreviation: 1PBI), 2-[3-(dibenzothiophen-4-yl)phenyl]-1-phenyl-1H-benzimidazole (abbreviation: mDBTBIm-II), and the like can be used, for example.

Although there is no particular limitation on the light-emitting materials 142a, 142b, and 142c in the light-emitting layer 140, as a fluorescent compound, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like is preferably used, and for example, any of the following substances can be used.

Specifically, the following examples can be given: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl] pyrene-1,6-diamine (abbreviation: 1,6FLPAPrn), N,N'-bis (3-methylphenyl)-N,N'-bis[3-(9-phenyl-9H-fluoren-9-yl) phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-diphenyl-N,N'-bis[4-(9-phenyl-9H-fluoren-9-yl)phenyl]-3,8-dicyclohexylpyrene-1,6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryfltriphenylamine (abbreviation: YGAPA), 4-(9H-carbazol-9-yl)-4'-(9,10-diphenyl-2-anthryfltriphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl) perylene (abbreviation: IBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1- phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis (1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis (1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis (4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[7]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJ1B), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl) ethenyl]-4H-pyran-4-ylidene}propanedinitrile (abbreviation: BisDCJTM), and 5,10,15,20-tetraphenylbisbenzo[5,6]indeno[1,2,3-cd:1,2,3'-lm]perylene.

As the light-emitting materials 142a, 142b, and 142c (phosphorescent compounds), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

Examples of the substance that has an emission peak in the blue or green wavelength range include organometallic iridium complexes having a 4H-triazole skeleton, such as tris {2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium (III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-j]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complexes including a nitrogen-containing five-membered heterocyclic skeleton, such as a 4H-triazole skeleton, a 1H-triazole skeleton, or an imidazole skeleton have high triplet excitation energy, reliability, and emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato) iridium(III) (abbreviation: Ir(tBuppm)$_3$), (acetylacetonato) bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$ (acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), and (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis (5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato) iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium (III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl] pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$ (acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and light emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium(III) (abbreviation: Ir(tppr)$_2$(dpm)), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-dmCP)$_2$(dpm)]), and (acetylacetonato)bis[2,3-bis(4-fluorophenyequinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and light emission efficiency and are thus particularly preferable. Further, because an organometallic iridium complex having a pyrazine skeleton can provide red light emission with favorable chromaticity, the use of the organometallic iridium complex in a light-emitting element of one embodiment of the present invention is preferable.

The light-emitting material included in the light-emitting layer 140 is preferably a material that can convert the triplet excitation energy into light emission. As an example of the material that can convert the triplet excitation energy into light emission, a thermally activated delayed fluorescence (TADF) material can be given in addition to a phosphorescent compound. Therefore, it is acceptable that the "phosphorescent compound" in the description is replaced with the "thermally activated delayed fluorescence material". Note that the thermally activated delayed fluorescence material is a material having a small difference between the triplet excitation energy level and the singlet excitation energy level and a function of converting triplet excitation energy into singlet excitation energy by reverse intersystem crossing. Thus, the TADF material can up-convert a triplet excited state into a singlet excited state (i.e., reverse intersystem crossing is possible) using a little thermal energy and efficiently exhibit light emission (fluorescence) from the singlet excited state. The TADF is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV. Note that the TADF material can be used as a host material of the light-emitting layer as well as a light-emitting material.

In the case where the thermally activated delayed fluorescence material is composed of one kind of material, any of the following materials can be used, for example.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$(OEP)).

As the thermally activated delayed fluorescence material composed of one kind of material, a heterocyclic compound including a π-electron rich heteroaromatic ring and a π-electron deficient heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), or the like can be used. The heterocyclic compound is preferable because of having the π-electron rich heteroaromatic ring and the π-electron deficient heteroaromatic ring, for which the electron-transport property and the hole-transport property are high. Among skeletons having the π-electron deficient heteroaromatic ring, a diazine skeleton (a pyrimidine skeleton, a pyrazine skeleton, or a pyridazine skeleton) and a triazine skeleton have high stability and reliability and are particularly preferable. Among skeletons having the π-electron rich heteroaromatic ring, an acridine skeleton, a phenoxazine skeleton, a thiophene skeleton, a furan skeleton, and a pyrrole skeleton have high stability and reliability; therefore, one or more of these skeletons are preferably included. As the pyrrole skeleton, an indole skeleton, a carbazole skeleton, or a 3-(9-phenyl-9H-carbazol-3-yl)-9H-carbazole skeleton is particularly preferred. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both increased and the difference between the energy level in the singlet excited state and the energy level in the triplet excited state becomes small.

The light-emitting layer 140 may contain a material other than the host materials 141a, 141b, and 141c and the light-emitting materials 142a, 142b, and 142c.

Examples of the material that can be used for the light-emitting layer 140 are, but not limited to, condensed polycyclic aromatic compounds such as anthracene derivatives, phenanthrene derivatives, pyrene derivatives, chrysene derivatives, and dibenzo[g,p]chrysene derivatives. Specific example of the condensed polycyclic aromatic compounds include 9,10-diphenylanthracene (abbreviation: DPAnth), 6,12-dimethoxy-5,11-diphenylchrysene, 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a singlet excitation energy level or a triplet excitation energy level higher than the excitation energy levels of the light-emitting materials 142a, 142b, and 142c are selected from these substances and known substances.

For example, a compound having a heteroaromatic skeleton, such as an oxadiazole derivative, can be used for the light-emitting layer 140. As specific examples thereof, heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), and 4,4'-bis(5-methylbenzoxazol-2-yl)stilbene (abbreviation: BzOs) can be given.

In addition, a metal complex (e.g., a zinc- or aluminum-based metal complex) with a heterocycle, for example, can be used for the light-emitting layer 140. As examples, metal complexes having a quinoline ligand, a benzoquinoline ligand, an oxazole ligand, and a thiazole ligand can be given. Specific examples thereof include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used.

The light-emitting layer 140 can have a structure in which two or more layers are stacked. For example, in the case where the light-emitting layer 140 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material. A light-emitting material included in the first light-emitting layer may be the same as or different from a light-emitting material included in the second light-emitting layer. In addition, the materials may have functions of emitting light of the same color or light of different colors. Light-emitting materials having functions of emitting light of different colors are used for the two light-emitting layers, so that light of a plurality of emission colors can be obtained at the same time. It is particularly preferable to select light-emitting materials of the light-emitting layers so that white light can be obtained by combining light emission from the two light-emitting layers.

Note that the light-emitting layer 140 can be formed by an evaporation method (including a vacuum evaporation method), an inkjet method, a coating method, gravure printing, or the like. Besides the above-mentioned materials, an inorganic compound such as a quantum dot or a high molecular compound (e.g., an oligomer, a dendrimer, and a polymer) may be used.

<<Hole-Injection Layer>>

The hole-injection layer 111 has a function of reducing a barrier for hole injection at an interface between the hole-injection layer 111 and one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, and the like can be given. As the phthalocyanine derivative, phthalocyanine, metal phthalocyanine, and the like can be given. As the aromatic amine, a benzidine derivative, a phenylenediamine derivative, and the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron-accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: F$_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, any of the aromatic amine, carbazole derivative, aromatic hydrocarbon, stilbene derivative, and the like described as examples of the hole-transport material that can be used in the light-emitting layer 140 can be used. Furthermore, the hole-transport material may be a high molecular compound.

As other examples of the hole-transport material, aromatic hydrocarbons such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9, 10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene can be given. Other examples are pentacene, coronene, and the like. The aromatic hydrocarbon having a hole mobility of $1 \times 10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are thiophene compounds, furan compounds, fluorene compounds, triphenylene compounds, phenanthrene compounds, and the like such as 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Among the above compounds, compounds including a pyrrole skeleton, a furan skeleton, a thiophene skeleton, or an aromatic amine skeleton are preferred because of their high stability and reliability. In addition, the compounds having such skeletons have a high hole-transport property to contribute to a reduction in driving voltage.

<<Hole-Transport Layer>>

The hole-transport layer 112 is a layer containing a hole-transport material and can be formed using any of the hole-transport materials given as examples of the material of the hole-injection layer 111. In order that the hole-transport layer 112 can have a function of transporting holes injected into the hole-injection layer 111 to the light-emitting layer 140, the highest occupied molecular orbital (HOMO) level of the hole-transport layer 112 is preferably equal or close to the HOMO level of the hole-injection layer 111.

As the hole-transport material, a substance having a hole mobility of $1 \times 10^{-6}$ cm$^2$/Vs or higher is preferably used. Note that any substance other than the above substances may be used as long as the hole-transport property is higher than the electron-transport property. The layer including a substance having a high hole-transport property is not limited to a single layer, and two or more layers containing the aforementioned substances may be stacked.

<<Electron-Transport Layer>>

The electron-transport layer 118 has a function of transporting, to the light-emitting layer 140, electrons injected from the other of the pair of electrodes (the electrode 101 or the electrode 102) through the electron-injection layer 119. A material having a property of transporting more electrons than holes can be used as the electron-transport material, and a material having an electron mobility of $1 \times 10^{-6}$ cm$^2$/Vs or higher is preferable. As the compound which easily accepts electrons (the material having an electron-transport property), a π-electron deficient heteroaromatic compound such as a nitrogen-containing heteroaromatic compound, a metal complex, or the like can be used, for example. Specifically, the pyridine derivative, the bipyridine derivative, the pyrimidine derivative, the triazine derivative, the quinoxaline derivative, the dibenzoquinoxaline derivative, the phenanthroline derivative, the triazole derivative, the benzimidazole derivative, the oxadiazole derivative, and the like given as the electron-transport materials that can be used in the light-emitting layer 140 can be given. A substance having an electron mobility of $1 \times 10^{-6}$ cm$^2$/Vs or higher is preferable. Note that other than these substances, any substance that has a property of transporting more electrons than holes may be used for the electron-transport layer. The electron-transport layer 118 is not limited to a single layer, and may include stacked two or more layers containing the aforementioned substances.

In addition, metal complexes with a heterocycle, such as metal complexes having a quinoline ligand, a benzoquinoline ligand, an oxazole ligand, and a thiazole ligand, can be given. Specific examples thereof include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used.

Between the electron-transport layer 118 and the light-emitting layer 140, a layer that controls transfer of electron carriers may be provided. This is a layer formed by addition of a small amount of a substance having a high electron-trapping property to a material having a high electron-transport property described above, and the layer is capable of adjusting carrier balance by suppressing transfer of electron carriers. Such a structure is very effective in preventing a problem (such as a reduction in element lifetime) caused when the electron-transport property of the electron-transport material is significantly higher than the hole-transport property of the hole-transport material.

<<Electron-Injection Layer>>

The electron-injection layer 119 has a function of reducing a barrier for electron injection at an interface between the electron-injection layer 119 and the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, and the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layer 119. Examples of the electride include a substance in which electrons are added at high concentration to calcium oxide-aluminum oxide. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, sodium, cesium, magnesium, calcium, erbium, ytterbium, and the like are given. In addition, an alkali metal oxide or an alkaline earth metal oxide is preferable, and lithium oxide, calcium oxide, barium oxide, and the like are given. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a gravure printing method, or the like. Besides the above-mentioned materials, an inorganic compound such as a quantum dot or a high molecular compound (e.g., an oligomer, a dendrimer, and a polymer) may be used in the light-emitting layer, the hole-injection layer, the hole-transport layer, the electron-transport layer, and the electron-injection layer.

<<Quantum Dot>>

As a light-emitting material, a quantum dot can be used. A quantum dot is a semiconductor nanocrystal with a size of several nanometers to several tens of nanometers and contains approximately $1\times10^3$ to $1\times10^6$ atoms. Since energy shift of quantum dots depend on their size, quantum dots made of the same substance emit light with different wavelengths depending on their size; thus, emission wavelengths can be easily adjusted by changing the size of quantum dots.

Since a quantum dot has an emission spectrum with a narrow peak, emission with high color purity can be obtained. In addition, a quantum dot is said to have a theoretical internal quantum efficiency of approximately 100%, which far exceeds that of a fluorescent organic compound, i.e., 25%, and is comparable to that of a phosphorescent organic compound. Therefore, a quantum dot can be used as a light-emitting material to obtain a light-emitting element having high emission efficiency. Furthermore, since a quantum dot which is an inorganic material has high inherent stability, a light-emitting element which is favorable also in terms of lifetime can be obtained.

Examples of a material of a quantum dot include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength range of a spectrum of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be spherical shape, a rod shape, a circular shape, or the like. Quantum rods which are rod-like shape quantum dots have a function of emitting directional light; thus, quantum rods can be used as a light-emitting material to obtain a light-emitting element with higher external quantum efficiency.

In most organic EL elements, to improve emission efficiency, concentration quenching of the light-emitting materials is suppressed by dispersing light-emitting materials in host materials. The host materials need to be materials having singlet excitation energy levels or triplet excitation energy levels higher than or equal to those of the light-emitting materials. In the case of using blue phosphorescent materials as light-emitting materials, it is particularly difficult to develop host materials which have triplet excitation energy levels higher than or equal to those of the blue phosphorescent materials and which are excellent in terms of a lifetime. Even when a light-emitting layer is composed of quantum dots and made without a host material, the quantum dots enable emission efficiency to be ensured; thus, a light-emitting element which is favorable in terms of a lifetime can be obtained. In the case where the light-emitting layer is composed of quantum dots, the quantum dots preferably have core-shell structures (including core-multi-shell structures).

In the case of using quantum dots as the light-emitting material in the light-emitting layer, the thickness of the light-emitting layer is set to 3 nm to 100 nm, preferably 10 nm to 100 nm, and the light-emitting layer is made to contain 1 volume % to 100 volume % of the quantum dots. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, blade coating method, a roll coating method, an ink jet method, a printing method, a spray coating method, a curtain coating method, or a Langmuir-Blodgett method) may be employed. For a light-emitting layer containing a phosphorescent material, a vacuum evaporation method, as well as the wet process, can be suitably employed.

An example of the liquid medium used for the wet process is an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like.

<<Pair of Electrodes>>

The electrodes 101 and 102 function as an anode and a cathode of each light-emitting element. The electrodes 101 and 102 can be formed using a metal, an alloy, or a conductive compound, a mixture or a stack thereof, or the like.

One of the electrode 101 and the electrode 102 is preferably formed using a conductive material having a function of reflecting light. Examples of the conductive material include aluminum (Al), an alloy containing Al, and the like. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting element with aluminum. Alternatively, Ag, an alloy of silver (Ag) and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), or gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through the electrode 101 and/or the electrode 102. Thus, at least one of the electrode 101 and the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1 \times 10^{-2}$ Ω·cm can be used.

The electrodes 101 and 102 may each be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

In this specification and the like, as the material transmitting light, a material that transmits visible light and has conductivity is used. Examples of the material include, in addition to the above-described oxide conductor typified by an ITO, an oxide semiconductor and an organic conductor containing an organic substance. Examples of the organic conductor containing an organic substance include a composite material in which an organic compound and an electron donor (donor) are mixed and a composite material in which an organic compound and an electron acceptor (acceptor) are mixed. Alternatively, an inorganic carbon-based material such as graphene may be used. The resistivity of the material is preferably lower than or equal to $1\times10^5$ $\Omega\cdot cm$, further preferably lower than or equal to $1\times10^4$ $\Omega\cdot cm$.

Alternatively, the electrode 101 and/or the electrode 102 may be formed by stacking two or more of these materials.

In order to improve the light extraction efficiency, a material whose refractive index is higher than that of an electrode having a function of transmitting light may be formed in contact with the electrode. The material may be electrically conductive or non-conductive as long as it has a function of transmitting visible light. In addition to the oxide conductors described above, an oxide semiconductor and an organic substance are given as the examples of the material. Examples of the organic substance include the materials for the light-emitting layer, the hole-injection layer, the hole-transport layer, the electron-transport layer, and the electron-injection layer. Alternatively, an inorganic carbon-based material or a metal film thin enough to transmit light can be used. Further alternatively, stacked layers with a thickness of several nanometers to several tens of nanometers may be used.

In the case where the electrode 101 or the electrode 102 functions as the cathode, the electrode preferably contains a material having a low work function (lower than or equal to 3.8 eV). For example, it is possible to use an element belonging to Group 1 or 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum and silver, or the like.

When the electrode 101 or the electrode 102 is used as an anode, a material with a high work function (4.0 eV or higher) is preferably used.

The electrode 101 and the electrode 102 may be a stacked layer of a conductive material having a function of reflecting light and a conductive material having a function of transmitting light. In that case, the electrode 101 and the electrode 102 can have a function of adjusting the optical path length so that light of a desired wavelength emitted from each light-emitting layer resonates and is intensified, which is preferable.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Substrate>>

A light-emitting element of one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting element or an optical element or as long as it has a function of protecting the light-emitting element or an optical element.

In this specification and the like, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper which includes a fibrous material, a base material film, and the like. As an example of a glass substrate, a barium borosilicate glass substrate, an alumino-borosilicate glass substrate, a soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like.

Alternatively, a flexible substrate may be used as the substrate such that the light-emitting element is provided directly on the flexible substrate. Further alternatively, a separation layer may be provided between the substrate and the light-emitting element. The separation layer can be used when part or the whole of a light-emitting element formed over the separation layer is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element is formed using a substrate, the light-emitting element may be transferred to another substrate. Example of the substrate to which the light-emitting element is transferred are, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like. When such a substrate is used, a light-emitting element with high durability, high heat resistance, reduced weight, or reduced thickness can be formed.

The light-emitting element 150 may be formed over an electrode electrically connected to, for example, a field-effect transistor (FET) that is formed over any of the above-described substrates. Accordingly, an active matrix light-emitting device in which the FET controls the driving of the light-emitting element 150 can be manufactured.

The structure described in this embodiment can be used in appropriate combination with any of the other embodiments.

Embodiment 2

Figure 2A:
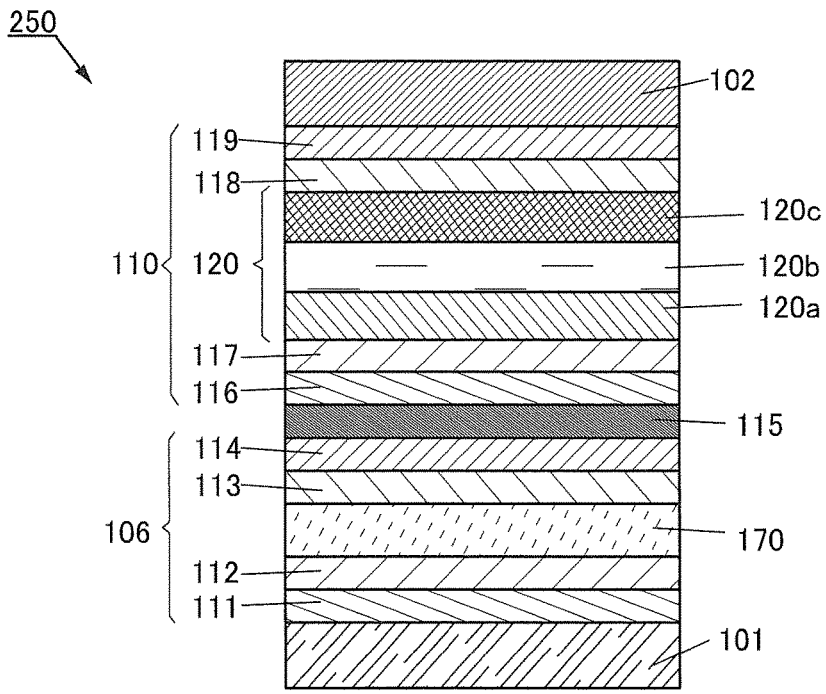
FIGS. 2A and 2B are schematic cross-sectional views of a light-emitting element of one embodiment of the present invention and FIG. 2C illustrates the correlation of energy levels in a light-emitting layer.
Figure 2B:
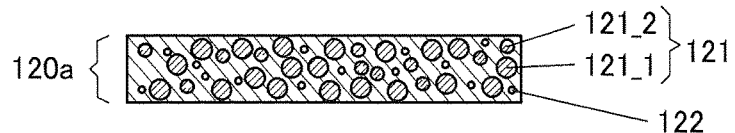

In this embodiment, a light-emitting element having a structure different from that described in Embodiment 1 and light emission mechanisms of the light-emitting elements will be described below with reference to FIGS. 2A to 2C. In FIGS. 2A and 2B, a portion having a function similar to that in FIGS. 1A to 1C is represented by the same hatch pattern as in FIGS. 1A to 1C and not especially denoted by a reference numeral in some cases. In addition, common reference numerals are used for portions having similar functions, and a detailed description of the portions is omitted in some cases.

<Structure Example of Light-Emitting Element>

FIG. 2A is a schematic cross-sectional view of a light-emitting element 250.

The light-emitting element 250 illustrated in FIG. 2A includes a plurality of light-emitting units (a light-emitting unit 106 and a light-emitting unit 110) between a pair of electrodes (the electrode 101 and the electrode 102). One of the light-emitting units preferably has the same structure as the EL layer 100 illustrated in FIG. 1A. That is, it is preferable that the light-emitting element 150 illustrated in FIG. 1A include one light-emitting unit while the light-emitting element 250 include a plurality of light-emitting units. Note that the electrode 101 functions as an anode and the electrode 102 functions as a cathode in the following description of the light-emitting element 250; however, the functions may be interchanged in the light-emitting element 250.

In the light-emitting element 250 illustrated in FIG. 2A, the light-emitting unit 106 and the light-emitting unit 110 are stacked, and a charge-generation layer 115 is provided between the light-emitting unit 106 and the light-emitting unit 110. Note that the light-emitting unit 106 and the light-emitting unit 110 may have the same structure or different structures. For example, it is preferable that a structure similar to that of the EL layer 100 be used in the light-emitting unit 110.

The light-emitting element 250 includes the light-emitting layer 120 and a light-emitting layer 170. The light-emitting unit 106 includes the hole-injection layer 111, the hole-transport layer 112, the electron-transport layer 113, and the electron-injection layer 114 in addition to the light-emitting layer 170. The light-emitting unit 110 includes a hole-injection layer 116, a hole-transport layer 117, an electron-transport layer 118, and an electron-injection layer 119 in addition to the light-emitting layer 120.

Furthermore, as illustrated in FIG. 2A, like the light-emitting layer 140 described in Embodiment 1, it is preferable that the light-emitting layer 120 include three layers of light-emitting layers 120a, 120b, and 120c, and light emitted from the light-emitting layer 120a and light emitted from the light-emitting layer 120c have the same color and each have a longer wavelength than light emitted from the light-emitting layer 120b. With such a structure, the light-emitting element 250 can be a highly reliable light-emitting element like the light-emitting element 150.

The light-emitting unit 106 and the light-emitting unit 110 preferably emit light with different colors. With such a structure, one light-emitting element can emit light of a plurality of colors. With the use of this example, a white light-emitting element can be fabricated.

The charge-generation layer 115 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 115 contains a composite material of an organic compound and an acceptor substance, the composite material that can be used for the hole-injection layer 111 described in Embodiment 1 may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. A material having a hole mobility of $1\times10^{-6}$ cm$^2$/Vs or higher is preferably used as the organic compound. Note that any other material may be used as long as it has a property of transporting more holes than electrons. Since the composite material of an organic compound and an acceptor substance has excellent carrier-injection and carrier-transport properties, low-voltage driving or low-current driving can be realized. Note that when a surface of a light-emitting unit on the anode side is in contact with the charge-generation layer 115, the charge-generation layer 115 can also serve as a hole-injection layer or a hole-transport layer of the light-emitting unit; thus, a hole-injection layer or a hole-transport layer is not necessarily included in the light-emitting unit. Alternatively, when a surface of the light-emitting unit on the cathode side is in contact with the charge-generation layer 115, the charge-generation layer 115 can also serve as an electron-injection layer or an electron-transport layer of the light-emitting unit; thus, an electron-injection layer or an electron-transport layer is not necessarily included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating materials and a compound having a high electron-transport property. Furthermore, the charge-generation layer 115 may be formed using a combination of a layer containing the composite material of an organic compound and an acceptor substance with a layer containing a transparent conductive film.

The charge-generation layer 115 provided between the light-emitting unit 106 and the light-emitting unit 110 is configured so that electrons are injected into one of the light-emitting units and holes are injected into the other light-emitting unit when a voltage is applied between the electrode 101 and the electrode 102. For example, in FIG. 2A, the charge-generation layer 115 injects electrons into the light-emitting unit 106 and holes into the light-emitting unit 110 when a voltage is applied such that the potential of the electrode 101 is higher than that of the electrode 102.

Note that in terms of light extraction efficiency, the charge-generation layer 115 preferably has a visible light transmittance (specifically, a visible light transmittance of higher than or equal to 40%). The charge-generation layer 115 functions even when having lower conductivity than the pair of electrodes (the electrodes 101 and 102).

The charge-generation layer 115 formed by using any of the above materials can suppress an increase in driving voltage caused by the stack of the light-emitting layers.

Although FIG. 2A illustrates the light-emitting element including the two light-emitting units, the light-emitting element can include three or more light-emitting units stacked. With a plurality of light-emitting units between a pair of electrodes, which are partitioned by the charge-generation layer as in the light-emitting element 250, it is possible to provide a light-emitting element which can emit high-luminance light with the current density kept low, has a long lifetime, and consumes low power.

In addition, the light-emitting layer of the light-emitting unit 110 preferably contains a phosphorescent compound. When the structure described in Embodiment 1 is used for at least one of the plurality of units, a light-emitting element with high color purity and high emission efficiency, and a light-emitting element having less change in color even after the device is driven can be provided.

The light-emitting layer 120a included in the light-emitting unit 110 contains a host material 121 and a light-emitting material 122 as illustrated in FIG. 2B. The host material 121 includes an organic compound 121_1 and an organic compound 121_2. In the following description, the light-emitting material 122 included in the light-emitting layer 120a is a phosphorescent compound. Note that the light-emitting layer 120b and the light-emitting layer 120c preferably have the same structure as the light-emitting layer 120a. That is, it is preferable that the light-emitting layer 120b and the light-emitting layer 120c also include one kind of phosphorescent material and two kinds of organic compounds and have a light emission mechanism similar to that of the light-emitting layer 120a, which is described below.

<<Light Emission Mechanism of Light-Emitting Layer 120a>>

Next, the light emission mechanism and material composition of the light-emitting layer 120a is described below.

The organic compound 121_1 and the organic compound 121_2 which are included in the light-emitting layer 120a preferably form an exciplex.

Although it is acceptable as long as the combination of the organic compound 121_1 and the organic compound 121_2 can form an exciplex, it is preferable that one of them be a compound having a hole-transport property and the other be a compound having an electron-transport property.

Figure 2C:
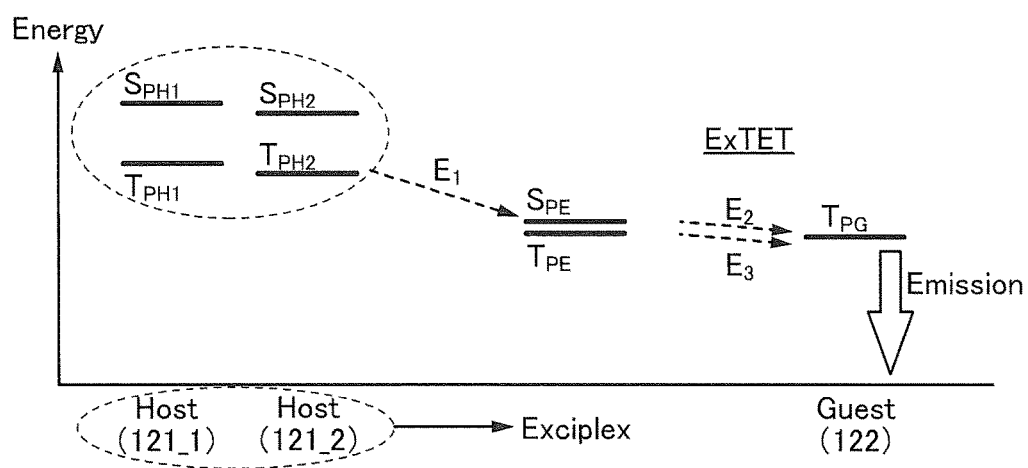

FIG. 2C shows a correlation between the energy levels of the organic compound 121_1, the organic compound 121_2, and the light-emitting material 122 in the light-emitting layer 120a. The following explains what terms and numerals in FIG. 2C represent:

Host (121_1): the organic compound 121_1 (host material);

Host (121_2): the organic compound 121_2 (host material);

Guest (122): the light-emitting material 122 (the phosphorescent compound);

$S_{PH1}$: the S1 level of the organic compound 121_1 (host material);

$T_{PH1}$: the T1 level of the organic compound 121_1 (host material);

$S_{PH2}$: the S1 level of the organic compound 121_2 (host material);

$T_{PH2}$: the T1 level of the organic compound 121_2 (host material);

$T_{PG}$: the T1 level of the light-emitting material 122 (the phosphorescent compound);

$S_{PE}$: the S1 level of the exciplex; and $T_{PE}$: the T1 level of the exciplex.

One of the organic compound 121_1 and the organic compound 121_2 receives a hole and the other receives an electron to readily form an exciplex (see Route $E_1$ in FIG. 2C). Alternatively, when one of the organic compounds is brought into an excited state, the other immediately interacts with the one to form an exciplex. Because the excitation energy levels ($S_{PE}$ and $T_{PE}$) of the exciplex are lower than the S1 levels ($S_{PH1}$ and $S_{PH2}$) of the host materials (the organic compounds 121_1 and 121_2) that form the exciplex, the excited state of the host material 121 can be formed with lower excitation energy. This can reduce the driving voltage of the light emitting element.

Both energies of $S_{PE}$ and $T_{PE}$ of the exciplex are then transferred to the T1 level of the light-emitting material 122 (the phosphorescent compound); thus, light emission is obtained (see Routes $E_2$ and $E_3$ in FIG. 2C).

Note that the T1 level ($T_{PE}$) of the exciplex is preferably higher than the T1 level ($T_{PG}$) of the light-emitting material 122 and lower than or equal to the T1 levels ($T_{PH1}$ and $T_{PH2}$) of the organic compounds (the organic compound 121_1 and the organic compound 121_2) which form the exciplex. Thus, the singlet excitation energy and the triplet excitation energy of the formed exciplex can be efficiently transferred from the S1 level ($S_{PE}$) and the T1 level ($T_{PE}$) of the exciplex to the T1 level ($T_{PG}$) of the light-emitting material 122.

In order to efficiently form an exciplex by the organic compound 121_1 and the organic compound 121_2, it is preferable to satisfy the following: the HOMO level of one of the organic compound 121_1 and the organic compound 121_2 is higher than that of the other and the LUMO level of the one of the organic compound 121_1 and the organic compound 121_2 is higher than that of the other.

In the case where the combination of the organic compounds 121_1 and 121_2 is a combination of a compound having a hole-transport property and a compound having an electron-transport property, the carrier balance can be easily controlled by adjusting the mixture ratio. Specifically, the weight ratio of the compound having a hole-transport property to the compound having an electron-transport property is preferably within a range of 1:9 to 9:1. Since the carrier balance can be easily controlled with the structure, a carrier recombination region can also be controlled easily.

Note that the above-described processes through Routes $E_1$ to $E_3$ may be referred to as exciplex-triplet energy transfer (ExTET) in this specification and the like. In other words, in the light-emitting layer 120a, excitation energy is transferred from the exciplex to the light-emitting material 122. In this case, the efficiency of reverse intersystem crossing from $T_{PE}$ to $S_{PE}$ does not need to be high and the emission quantum yield from $S_{PE}$ do not need to be high either; thus, materials can be selected from a wide range of options.

When ExTET is utilized, a highly reliable light-emitting element having high emission efficiency can be obtained.

Although the light-emitting layer 120 includes three layers for description in this embodiment, the light-emitting layer 120 may have a stacked structure of four or more layers. In this case, ExTET is preferably used for all of the phosphorescent light-emitting layers. With such a structure, a highly reliable light-emitting element having high emission efficiency can be obtained.

The structure described in this embodiment can be used in appropriate combination with any of the other embodiments.

Embodiment 3

In this embodiment, examples of a light-emitting device of one embodiment of the present invention are described with reference to FIGS. 3A and 3B and FIGS. 4A and 4B.

<Structure Example 1 of Light-Emitting Device>

Figure 3A:
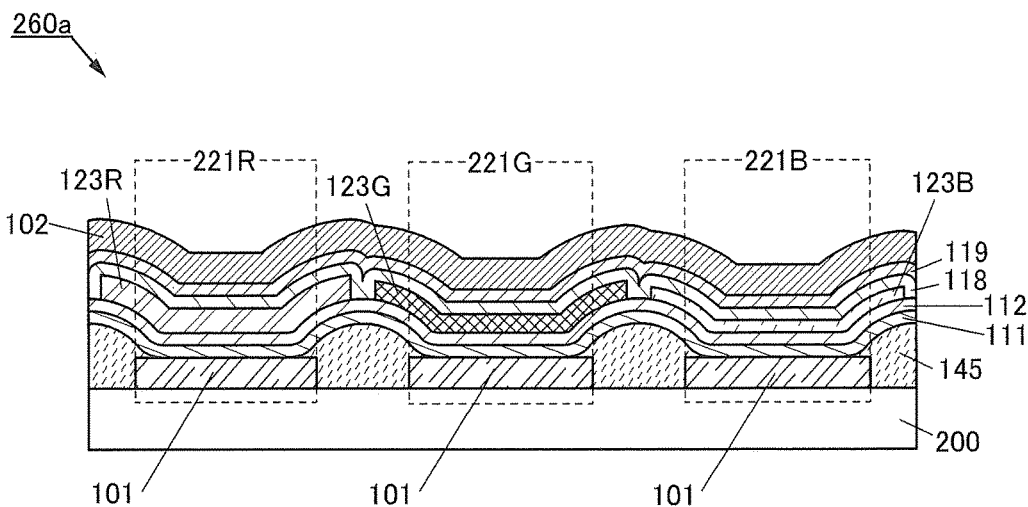
FIGS. 3A and 3B are each a schematic cross-sectional view of a light-emitting element of one embodiment of the present invention.
Figure 3B:
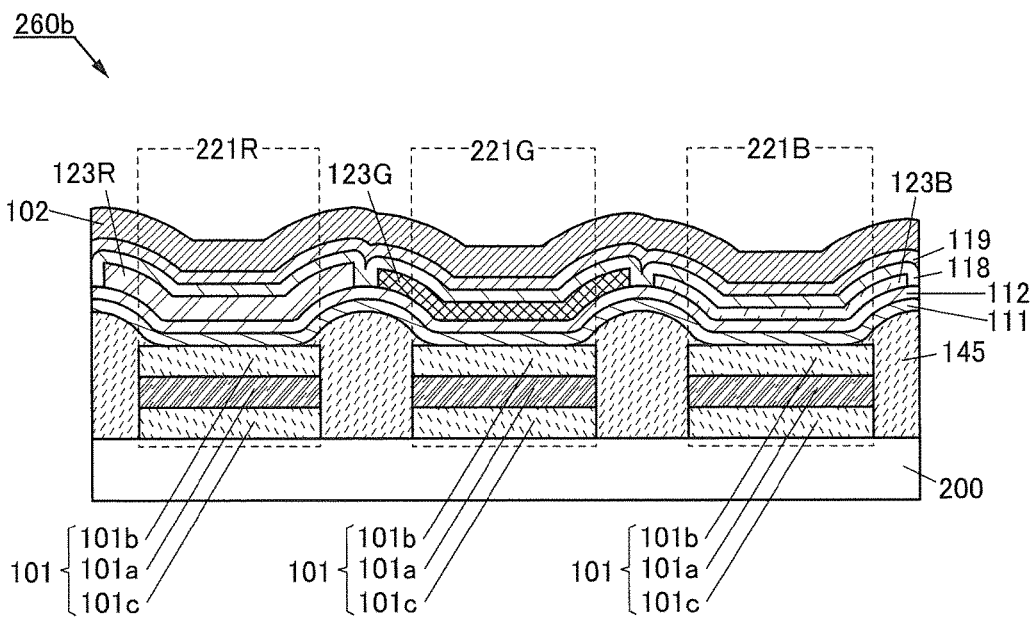

FIGS. 3A and 3B are cross-sectional views each illustrating a light-emitting element of one embodiment of the present invention. In FIGS. 3A and 3B, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

Light-emitting elements 260a and 260b in FIGS. 3A and 3B may have a bottom-emission structure in which light is extracted through the substrate 200 or may have a top-emission structure in which light is extracted in the direction opposite to the substrate 200. However, one embodiment of the present invention is not limited to this structure, and a light-emitting element having a dual-emission structure in which light emitted from the light-emitting element is extracted in both top and bottom directions of the substrate 200 may be used.

In the case where the light-emitting elements 260a and 260b each have a bottom emission structure, the electrode 101 preferably has a function of transmitting light and the electrode 102 preferably has a function of reflecting light. Alternatively, in the case where the light-emitting elements 260a and 260b each have a top emission structure, the electrode 101 preferably has a function of reflecting light and the electrode 102 preferably has a function of transmitting light.

The light-emitting elements 260a and 260b each include the electrode 101 and the electrode 102 over the substrate 200. Between the electrodes 101 and 102, a light-emitting layer 123B, a light-emitting layer 123G, and a light-emitting layer 123R are provided. The hole-injection layer 111, the hole-transport layer 112, the electron-transport layer 113, and the electron-injection layer 114 are also provided.

The light-emitting element 260b includes, as part of the electrode 101, a conductive layer 101a, a conductive layer 101b over the conductive layer 101a, and a conductive layer 101c under the conductive layer 101a. In other words, the light-emitting element 260b includes the electrode 101 having a structure in which the conductive layer 101a is sandwiched between the conductive layer 101b and the conductive layer 101c.

In the light-emitting element 260b, the conductive layer 101b and the conductive layer 101c may be formed of different materials or the same material. The conductive layers 101b and 101c are preferably formed of the same conductive material, in which case patterning by etching in the process for forming the electrode 101 can be performed easily.

In the light-emitting element 260b, the electrode 101 may include one of the conductive layer 101b and the conductive layer 101c.

For each of the conductive layers 101a, 101b, and 101c, which are included in the electrode 101, the structure and materials of the electrode 101 or 102 described in Embodiment 1 can be used.

In FIGS. 3A and 3B, a partition wall 145 is provided between a region 221B, a region 221G, and a region 221R, which are sandwiched between the electrode 101 and the electrode 102. The partition wall 145 has an insulating property. The partition wall 145 covers end portions of the electrode 101 and has openings overlapping with the electrode. With the partition wall 145, the electrode 101 provided over the substrate 200 in the regions can be divided into island shapes.

Note that the light-emitting layer 123B and the light-emitting layer 123G may overlap with each other in a region where they overlap with the partition wall 145. The light-emitting layer 123G and the light-emitting layer 123R may overlap with each other in a region where they overlap with the partition wall 145. The light-emitting layer 123R and the light-emitting layer 123B may overlap with each other in a region where they overlap with the partition wall 145.

The partition wall 145 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

Note that a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

The light-emitting layers 123R, 123G, and 123B preferably contain light-emitting materials having functions of emitting light of different colors. For example, when the light-emitting layer 123R contains a light-emitting material having a function of emitting red, the region 221R emits red light. When the light-emitting layer 123G contains a light-emitting material having a function of emitting green, the region 221G emits green light. When the light-emitting layer 123B contains a light-emitting material having a function of emitting blue, the region 221B emits blue light. The light-emitting element 260a or 260b having such a structure is used in a pixel of a light-emitting device, whereby a full-color light-emitting device can be fabricated. The thicknesses of the light-emitting layers may be the same or different.

One or more of the light-emitting layer 123B, the light-emitting layer 123G, and the light-emitting layer 123R preferably have the structure of the light-emitting layer 140 described in Embodiment 1. Thus, the light-emitting device of one embodiment of the present invention can have high color purity, high emission efficiency, and less change in chromaticity even after the device is driven.

One or more of the light-emitting layers 123B, 123G, and 123R may include two or more stacked layers.

When at least one light-emitting layer includes the light-emitting layer described in Embodiment 1 and the light-emitting element 260a or 260b including the light-emitting layer is used in pixels in a light-emitting device, a light-emitting device with high color purity and high emission efficiency and a light-emitting device with high reliability can be fabricated. The light-emitting device including the light-emitting element 260a or 260b can thus have reduced power consumption.

By providing an optical element (e.g., a color filter, a polarizing plate, and an anti-reflection film) on a region overlapping with of the electrode through which light is extracted, the color purity of each of the light-emitting elements 260a and 260b can be improved. Therefore, the color purity of a light-emitting device including the light-emitting element 260a or 260b can be improved. Alternatively, the reflection of external light by each of the light-emitting elements 260a and 260b can be reduced. Therefore, the contrast ratio of a light-emitting device including the light-emitting element 260a or 260b can be improved.

In particular, color filters are preferably provided on the light extraction side. The light-emitting element of one embodiment of the present invention can efficiently extract light with high color purity as described above; thus, when color filters are provided on the light extraction side, light with higher color purity can be extracted. Specifically, red and green color filters are used, whereby light with an extremely high color purity in a region where a chromaticity x of red light emission in the CIE 1931 chromaticity coordinates is greater than 0.680 and less than or equal to 0.720 and a chromaticity y thereof is greater than or equal to 0.260 and less than or equal to 0.320, and a chromaticity x of green light emission in the CIE 1931 chromaticity coordinates is greater than or equal to 0.130 and less than or equal to 0.250 and a chromaticity y thereof is greater than 0.710 and less than or equal to 0.810, which corresponds to the ultra-high color gamut of the BT.2020 standard, can be efficiently extracted. Thus, the light-emitting device of one embodiment of the present invention is suitably used as a light-emitting device for which high color purity is required. Here, the chromaticity of red, the chromaticity of green, and the chromaticity of blue are plotted in the CIE 1931 chromaticity coordinates. Here, the area of a triangle formed by connecting the CIE 1931 chromaticity coordinates of RGB obtained from the light-emitting device of one embodiment of the present invention is preferably 80% or more of the area of a triangle formed by connecting the CIE 1931 chromaticity coordinates of RGB of the BT.2020 standard. With such a structure, a light-emitting device with high color reproducibility can be obtained.

For the other components of the light-emitting elements 260a and 260b, the components of the light-emitting element in Embodiments 1 and 2 may be referred to.

<Structure Example 2 of Light-Emitting Device>

Next, structure examples different from the light-emitting devices illustrated in FIGS. 3A and 3B will be described below with reference to FIGS. 4A and 4B.

Figure 4A:
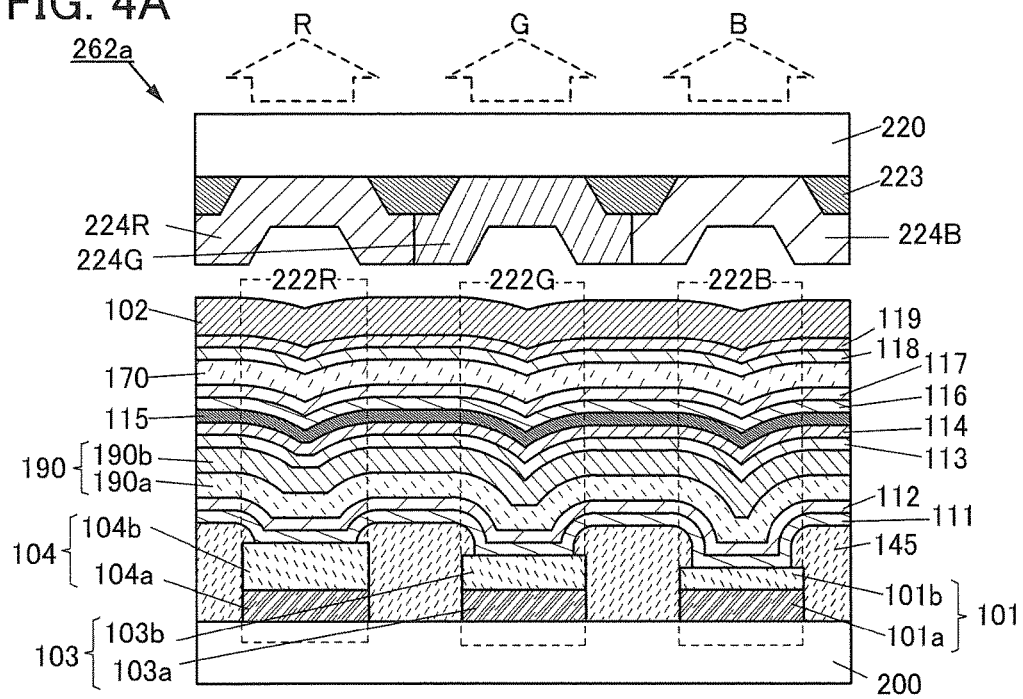
FIGS. 4A and 4B are each a schematic cross-sectional view of a light-emitting element of one embodiment of the present invention.
Figure 4B:
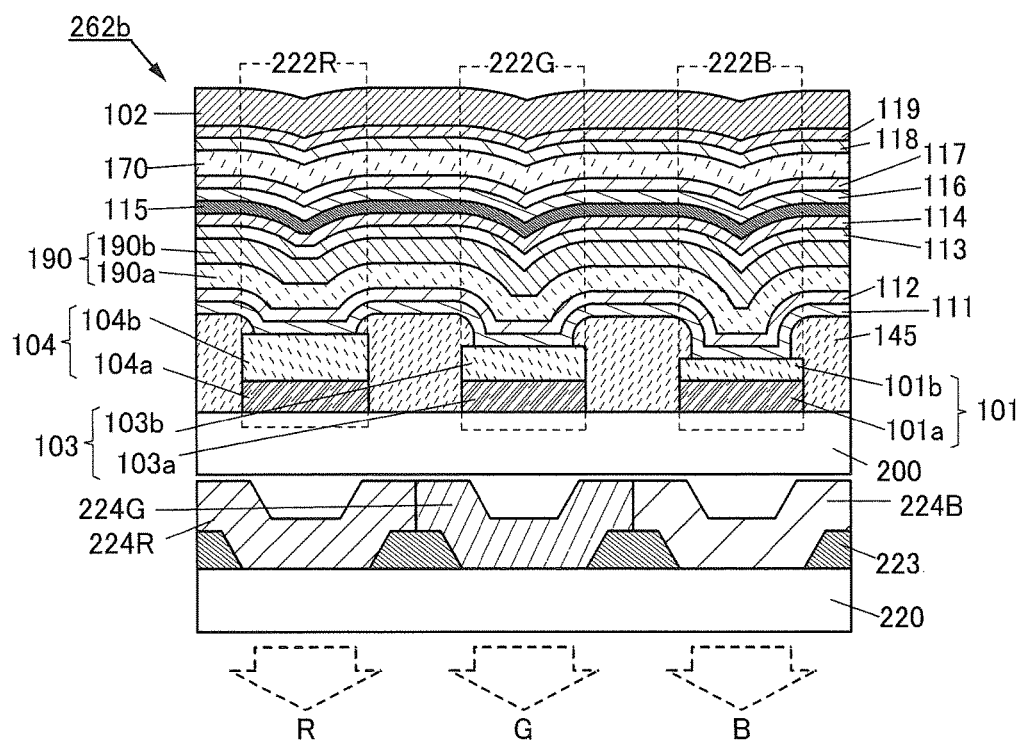

FIGS. 4A and 4B are cross-sectional views of light-emitting elements of embodiments of the present invention. In FIGS. 4A and 4B, a portion having a function similar to that in FIGS. 3A and 3B is represented by the same hatch pattern as in FIGS. 3A and 3B and not especially denoted by a reference numeral in some cases. In addition, common reference numerals are used for portions having similar functions, and a detailed description of such portions is not repeated in some cases.

FIGS. 4A and 4B illustrate structure examples of a light-emitting element including the light-emitting layer between a pair of electrodes. A light-emitting element 262a illustrated in FIG. 4A has a top-emission structure in which light is extracted in a direction opposite to the substrate 200, and a light-emitting element 262b illustrated in FIG. 4B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 262a and 262b each include the electrode 101, the electrode 102, an electrode 103, and an electrode 104 over the substrate 200. At least a light-emitting layer 170, a light-emitting layer 190, and the charge-generation layer 115 are provided between the electrode 101 and the electrode 102, between the electrode 102 and the electrode 103, and between the electrode 102 and the electrode 104. The hole-injection layer 111, the hole-transport layer 112, the electron-transport layer 113, the electron-injection layer 114, the hole-injection layer 116, the hole-transport layer 117, the electron-transport layer 118, and the electron-injection layer 119 are further provided.

The electrode 101 includes a conductive layer 101a and a conductive layer 101b over and in contact with the conductive layer 101a. The electrode 103 includes a conductive layer 103a and a conductive layer 103b over and in contact with the conductive layer 103a. The electrode 104 includes a conductive layer 104a and a conductive layer 104b over and in contact with the conductive layer 104a.

The light-emitting element 262a illustrated in FIG. 4A and the light-emitting element 262b illustrated in FIG. 4B each include a partition wall 145 between a region 222B sandwiched between the electrode 101 and the electrode 102, a region 222G sandwiched between the electrode 102 and the electrode 103, and a region 222R sandwiched between the electrode 102 and the electrode 104. The partition wall 145 has an insulating property. The partition wall 145 covers end portions of the electrodes 101, 103, and 104 and has openings overlapping with the electrodes. With the partition wall 145, the electrodes provided over the substrate 200 in the regions can be separated into island shapes.

The charge-generation layer 115 can be formed with a material obtained by adding an electron acceptor (acceptor) to a hole-transport material or a material obtained by adding an electron donor (donor) to an electron-transport material. Note that when the conductivity of the charge-generation layer 115 is as high as that of the pair of electrodes, carriers generated in the charge-generation layer 115 might transfer to an adjacent pixel and light emission might occur in the pixel. In order to prevent such false light emission from an adjacent pixel, the charge-generation layer 115 is preferably formed with a material whose conductivity is lower than that of the pair of electrodes.

The light-emitting elements 262a and 262b each include a substrate 220 provided with an optical element 224B, an optical element 224G, and an optical element 224R in the direction in which light emitted from the region 222B, light emitted from the region 222G, and light emitted from the region 222R are extracted. The light emitted from each region is emitted outside the light-emitting element through each optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

For example, a coloring layer (also referred to as color filter), a band pass filter, a multilayer filter, or the like can be used for the optical elements 224R, 224G, and 224B. Alternatively, color conversion elements can be used as the optical elements. A color conversion element is an optical element that converts incident light into light having a longer wavelength than the incident light. As the color conversion elements, quantum-dot elements can be favorably used. The usage of the quantum dot can increase color reproducibility of the light-emitting device.

One or more optical elements may be stacked over each of the optical elements 224R, 224G, and 224B. As another optical element, a circularly polarizing plate, an anti-reflective film, or the like can be provided, for example. A circularly polarizing plate provided on the side where light emitted from the light-emitting element of the light-emitting device is extracted can prevent a phenomenon in which light entering from the outside of the light-emitting device is reflected inside the light-emitting device and returned to the outside. An anti-reflective film can weaken external light reflected by a surface of the light-emitting device. This leads to clear observation of light emitted from the light-emitting device.

Note that in FIGS. 4A and 4B, blue light (B), green light (G), and red light (R) emitted from the regions through the optical elements are schematically illustrated by arrows of dashed lines.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting element. As the light-blocking layer 223, a metal, a resin containing black pigment, carbon black, a metal oxide, a composite oxide containing a solid solution of a plurality of metal oxides, or the like can be used.

Note that the optical element 224B and the optical element 224G may overlap with each other in a region where they overlap with the light-blocking layer 223. In addition, the optical element 224G and the optical element 224R may overlap with each other in a region where they overlap with the light-blocking layer 223. In addition, the optical element 224R and the optical element 224B may overlap with each other in a region where they overlap with the light-blocking layer 223.

As for the structures of the substrate 200 and the substrate 220 provided with the optical elements, Embodiment 1 can be referred to.

Furthermore, the light-emitting elements 262*a* and 262*b* have a microcavity structure.

In the above manner, with the microcavity structure, in which the optical length between the pair of electrodes in the respective regions is adjusted, scattering and absorption of light in the vicinity of the electrodes can be suppressed, resulting in high light extraction efficiency.

Since the light-emitting element 262*a* illustrated in FIG. 4A has a top-emission structure, it is preferable that the conductive layer 101*a*, the conductive layer 103*a*, and the conductive layer 104*a* have a function of reflecting light. In addition, it is preferable that the electrode 102 have functions of transmitting light and reflecting light.

Since the light-emitting element 262*b* illustrated in FIG. 4B has a bottom-emission structure, it is preferable that the conductive layer 101*a*, the conductive layer 103*a*, and the conductive layer 104*a* have functions of transmitting light and reflecting light. In addition, it is preferable that the electrode 102 have a function of reflecting light.

The structure of the light-emitting element described in Embodiment 1 is preferably used for at least one of the light-emitting layers 170 and 190 included in the light-emitting elements 262*a* and 262*b*. Accordingly, the light-emitting device having high color purity, high emission efficiency, and less change in color even after the device is driven can be fabricated.

The light-emitting element of one embodiment of the present invention, which is described in Embodiment 1, can efficiently utilize the effect of the microcavity structure; thus, light with high color purity can be efficiently extracted as described above. Thus, when color filters are provided on the light extraction side, light with higher color purity can be extracted. Specifically, red and green color filters are used for the optical element 224R and the optical element 224G, respectively, whereby light with an extremely high color purity in a region where a chromaticity x of red light emission in the CIE 1931 chromaticity coordinates is greater than 0.680 and less than or equal to 0.720 and a chromaticity y thereof is greater than or equal to 0.260 and less than or equal to 0.320, and a chromaticity x of green light emission in the CIE 1931 chromaticity coordinates is greater than or equal to 0.130 and less than or equal to 0.250 and a chromaticity y thereof is greater than 0.710 and less than or equal to 0.810, which corresponds to the ultra-high color gamut of the BT.2020 standard, can be efficiently extracted. Thus, the light-emitting device of one embodiment of the present invention is suitably used as a light-emitting device for which high color purity is required. Here, the area of a triangle formed by connecting the CIE 1931 chromaticity coordinates of RGB obtained from the light-emitting device of one embodiment of the present invention is preferably 80% or more of the area of a triangle formed by connecting the CIE 1931 chromaticity coordinates of RGB of the BT.2020 standard. With such a structure, a light-emitting device with high color reproducibility can be obtained.

It is particularly preferable to select the light-emitting materials of the light-emitting layers so that white light can be obtained by combining light emissions from the light-emitting layers 170 and 190.

Either or both of the light-emitting layers 170 and 190 may have a stacked structure of three or more layers, in which a layer not including a light-emitting material may be included.

As described above, the light-emitting element 262*a* or the light-emitting element 262*b* which has at least one of the structures of the light-emitting layers described in Embodiment 1 and Embodiment 2 is used in the pixel of the light-emitting device, whereby a light-emitting device having high color purity, high emission efficiency, and less change in chromaticity even after the device is driven can be fabricated.

For the other components of the light-emitting elements 262*a* and 262*b*, the components of the light-emitting element 260*a* or 260*b* or the light-emitting element in Embodiment 1 may be referred to.

The structure described in this embodiment can be used in appropriate combination with any of the other embodiments.

Embodiment 4

In this embodiment, a light-emitting device including the light-emitting element described in Embodiment 1 is described with reference to FIGS. 5A and 5B.

FIG. 5A is a top view of the light-emitting device and FIG. 5B is a cross-sectional view taken along the lines A-B and C-D in FIG. 5A. The light-emitting device includes a driver circuit portion (source side driver circuit) 601, a pixel portion 602, and a driver circuit portion (gate side driver circuit) 603, which control light emission of a light-emitting element and are illustrated with dotted lines. Moreover, a reference numeral 604 denotes a sealing substrate, a reference numeral 625 denotes a desiccant, and a reference numeral 605 denotes a sealant. A portion surrounded by the sealant 605 is a space 607.

Note that a lead wiring 608 is a wiring for transmitting signals to be input to the source side driver circuit 601 and the gate side driver circuit 603 and for receiving a video signal, a clock signal, a start signal, a reset signal, and the like from a flexible printed circuit (FPC) 609 functioning as an external input terminal. Although only the FPC is illustrated here, a printed wiring board (PWB) may be attached to the FPC. The light-emitting device in this specification includes, in its category, not only the light-emitting device itself but also the light-emitting device provided with the FPC or the PWB.

Next, a cross-sectional structure of the light-emitting device is described with reference to FIG. 5B. The driver circuit portion and the pixel portion are formed over an element substrate 610. Here, the source side driver circuit 601, which is the driver circuit portion, and one pixel of the pixel portion 602 are illustrated.

In the source side driver circuit 601, a CMOS circuit is formed in which an n-channel TFT 623 and a p-channel TFT 624 are combined. The driver circuit may be formed using various circuits such as a CMOS circuit, a PMOS circuit, or an NMOS circuit. Although a driver-integrated type in which the driver circuit is formed over the substrate is described in this embodiment, the driver circuit is not necessarily formed over the substrate, and may be formed outside the substrate.

The pixel portion 602 includes a plurality of pixels including a switching TFT 611, a current controlling TFT 612, and a first electrode 613 electrically connected to a drain of the current controlling TFT 612. Note that an insulator 614 is formed to cover an end portion of the first electrode 613. The insulator 614 can be formed using a positive photosensitive resin film.

In order to improve coverage with a film that is formed over the insulator 614, the insulator 614 is formed to have a curved surface with curvature at its upper or lower end portion. For example, in the case where photosensitive acrylic is used as a material of the insulator 614, only the upper end portion of the insulator 614 preferably has a curved surface. The radius of curvature of the curved surface is preferably greater than or equal to 0.2 µm and less than or equal to 0.3 µm. As the insulator 614, either a negative photosensitive material or a positive photosensitive material can be used.

An EL layer 616 and a second electrode 617 are formed over the first electrode 613. As a material used for the first electrode 613 which functions as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack including a titanium nitride film and a film containing aluminum as its main component, a stack including three layers of a titanium nitride film, a film containing aluminum as its main component, and a titanium nitride film, or the like can be used. The stacked structure achieves low wiring resistance, a favorable ohmic contact, and a function as an anode.

The EL layer 616 is formed by any of a variety of methods such as an evaporation method using an evaporation mask, an inkjet method, and a spin coating method. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 passes through the second electrode 617, a stack including a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that a light-emitting element 618 is formed with the first electrode 613, the EL layer 616, and the second electrode 617. The light-emitting element 618 preferably has the structure described in Embodiment 1 and Embodiment 2. In the light-emitting device of this embodiment, the pixel portion, which includes a plurality of light-emitting elements, may include both the light-emitting element with the structure described in Embodiment 1 and Embodiment 2 and a light-emitting element with a different structure.

The sealing substrate 604 is attached to the element substrate 610 with the sealant 605, so that the light-emitting element 618 is provided in the space 607 surrounded by the element substrate 610, the sealing substrate 604, and the sealant 605. The space 607 is filled with a filler. The filler may be an inert gas (such as nitrogen or argon), or a resin and/or a desiccant.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), polyvinyl fluoride (PVF), polyester, acrylic, or the like can be used.

As described above, the light-emitting device including the light-emitting element described in Embodiment 1 and Embodiment 2 can be obtained.

<Structure Example 3 of Light-Emitting Device>

As an example of a light-emitting device, FIGS. 6A and 6B each illustrate a light-emitting device including a light-emitting element exhibiting white light emission and a coloring layer (a color filter).

FIG. 6A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition 1026, an EL layer 1028, a second electrode 1029 of the light-emitting elements, a sealing substrate 1031, a sealant 1032, and the like.

In FIGS. 6A and 6B, coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 6A, light emitted from some of the light-emitting layers does not pass through the coloring layers, while light emitted from the others of the light-emitting layers passes through the coloring layers. Since light that does not pass through the coloring layers is white and light that passes through any one of the coloring layers is red, blue, or green, an image can be displayed using pixels of the four colors.

FIG. 6B illustrates an example in which the red coloring layer 1034R, the green coloring layer 1034G, and the blue coloring layer 1034B are formed between the gate insulating film 1003 and the first interlayer insulating film 1020. As illustrated in FIG. 6B, the coloring layers may be provided between the substrate 1001 and the sealing substrate 1031.

The above-described light-emitting device has a structure in which light is extracted from the substrate 1001 side where the TFTs are formed (a bottom emission structure), but may have a structure in which light is extracted from the sealing substrate 1031 side (a top emission structure).

<Structure Example 4 of Light-Emitting Device>

Figure 7:
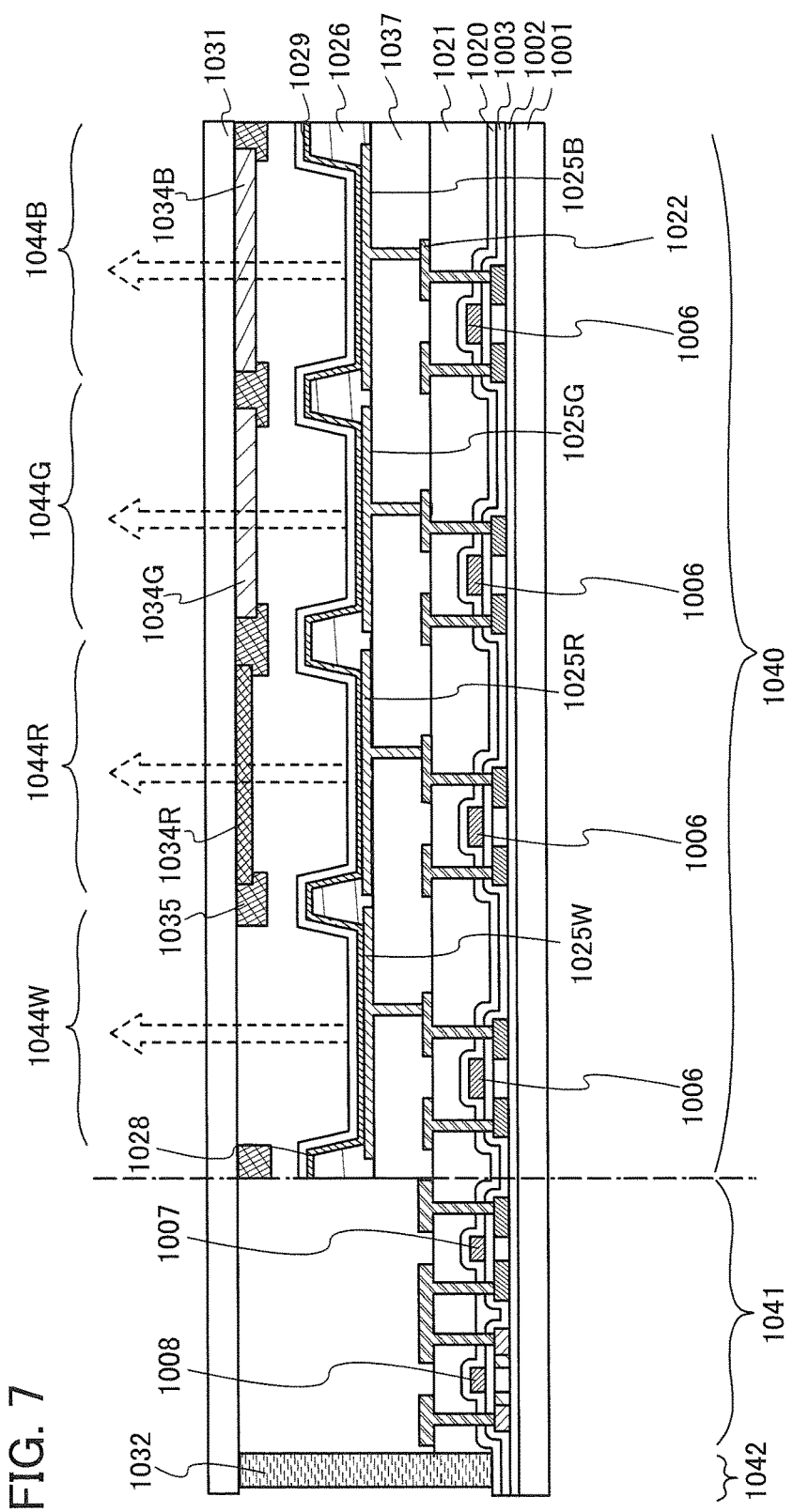
FIG. 7 is a conceptual diagram of an active matrix light-emitting device of one embodiment of the present invention.

FIG. 7 is a cross-sectional view of a light-emitting device having a top emission structure. In this case, a substrate that does not transmit light can be used as the substrate 1001. The process up to the step of forming of a connection electrode which connects the and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film 1021, or can be formed using any other various materials.

Lower electrodes 1025W, 1025R, 1025G, and 1025B of the light-emitting elements each function as an anode here, but may function as a cathode. Furthermore, in the case of the light-emitting device having a top emission structure as illustrated in FIG. 7, the lower electrodes 1025W, 1025R, 1025G, and 1025B are preferably reflective electrodes. Note that the second electrode 1029 preferably has a function of reflecting light and a function of transmitting light. It is preferable that a microcavity structure be used between the second electrode 1029 and the lower electrodes 1025W, 1025R, 1025G, and 1025B, in which case light having a specific wavelength is amplified. The EL layer 1028 is formed to have a structure similar to the structure described in Embodiment 2, with which white light emission can be obtained.

In FIGS. 6A and 6B and FIG. 7, the structure of the EL layer for providing white light emission can be achieved by, for example, using a plurality of light-emitting layers or using a plurality of light-emitting units. Note that the structure to provide white light emission is not limited to the above.

In the case of a top emission structure as illustrated in FIG. 7, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) may be covered with the overcoat layer. Note that a light-transmitting substrate is used as the sealing substrate 1031.

Although an example in which full color display is performed using four colors of red, green, blue, and white is shown here, there is no particular limitation and full color display using three colors of red, green, and blue or four colors of red, green, blue, and yellow may be performed.

As described above, the light-emitting device including the light-emitting element described in Embodiment 1 can be obtained.

Note that this embodiment can be combined with any of other embodiments as appropriate.

Embodiment 5

In this embodiment, a more specific example of a light-emitting device including the light-emitting element described in Embodiment 1 is described. A light-emitting device described below includes both a reflective liquid crystal element and a light-emitting element. The light-emitting device can perform display in a transmissive mode and in a reflective mode. The light-emitting element described in Embodiment 1 is preferably used.

<Structure Example 5 of Light-Emitting Device>

FIG. 8A is a block diagram illustrating an example of the structure of a light-emitting device 400. The light-emitting device 400 includes a plurality of pixels 410 that are arranged in a matrix in a display portion 362. The light-emitting device 400 also includes a circuit GD and a circuit SD. In addition, the light-emitting device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the light-emitting device 400 includes a plurality of wirings S1 and a plurality of wirings S2 which are electrically connected to the circuit SD and the plurality of pixels 410 arranged in a direction C.

The pixel 410 includes a reflective liquid crystal element and a light-emitting element. In the pixel 410, the liquid crystal element and the light-emitting element partly overlap with each other.

FIG. 8B1 illustrates a structure example of an electrode 311b included in the pixel 410. The electrode 311b serves as a reflective electrode of the liquid crystal element in the pixel 410. The electrode 311b has an opening 451.

In FIG. 8B1, a light-emitting element 360 in a region overlapping with the electrode 311b is denoted by a dashed line. The light-emitting element 360 overlaps with the opening 451 included in the electrode 311b. Thus, light from the light-emitting element 360 is emitted to the display surface side through the opening 451.

In FIG. 8B1, the pixels 410 adjacent in the direction R correspond to different emission colors. As illustrated in FIG. 8B1, the openings 451 are preferably provided in different positions in the electrodes 311b so as not to be aligned in the two pixels adjacent to each other in the direction R. This allows the two light-emitting elements 360 to be apart from each other, thereby preventing light emitted from the light-emitting element 360 from entering a coloring layer in the adjacent pixel 410 (such a phenomenon is also referred to as crosstalk). Furthermore, since the two adjacent light-emitting elements 360 can be arranged apart from each other, a high-resolution light-emitting device is achieved even when EL layers of the light-emitting elements 360 are separately formed with a shadow mask or the like.

Alternatively, arrangement illustrated in FIG. 8B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the electrode 311b serving as a reflective electrode is too small, light emitted from the light-emitting element 360 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be close to the adjacent pixel. Preferably, the opening 451 is provided close to another pixel emitting light of the same color, in which case crosstalk can be suppressed.

[Circuit Configuration Example]

Figure 9:
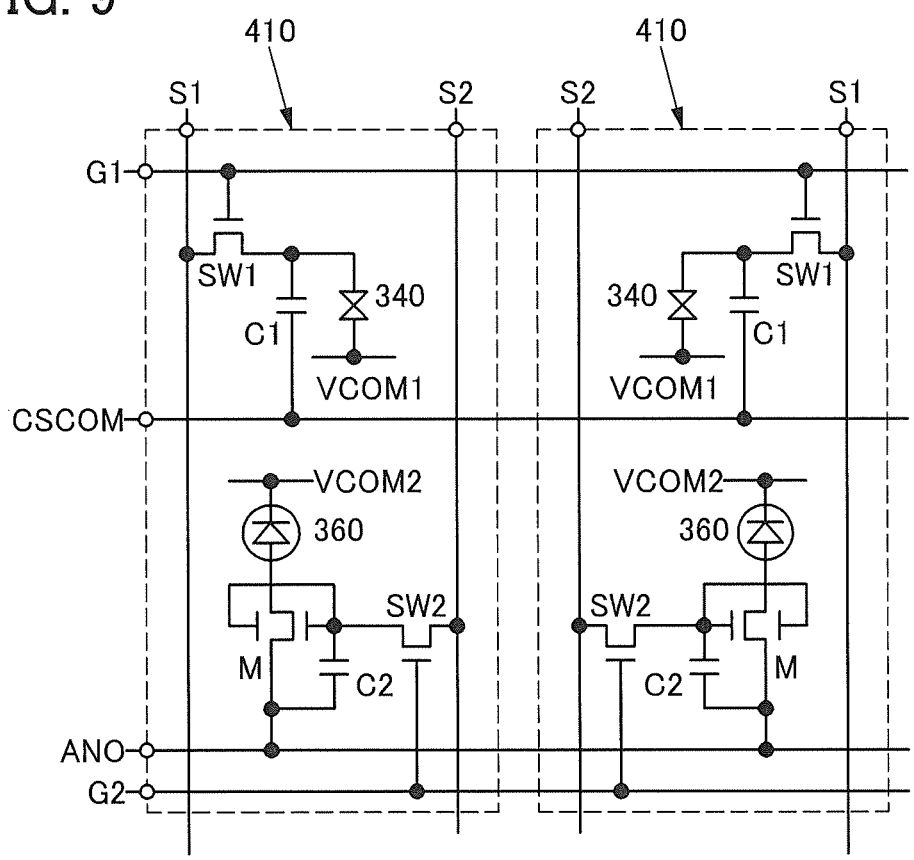
FIG. 9 is a circuit diagram of a display device of one embodiment of the present invention.

FIG. 9 is a circuit diagram illustrating a configuration example of the pixel 410. FIG. 9 illustrates two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 9 also illustrates a wiring VCOM1 electrically connected to the liquid crystal element 340 and a wiring VCOM2 electrically connected to the light-emitting element 360.

FIG. 9 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 9 illustrates an example in which the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 9, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 10A:
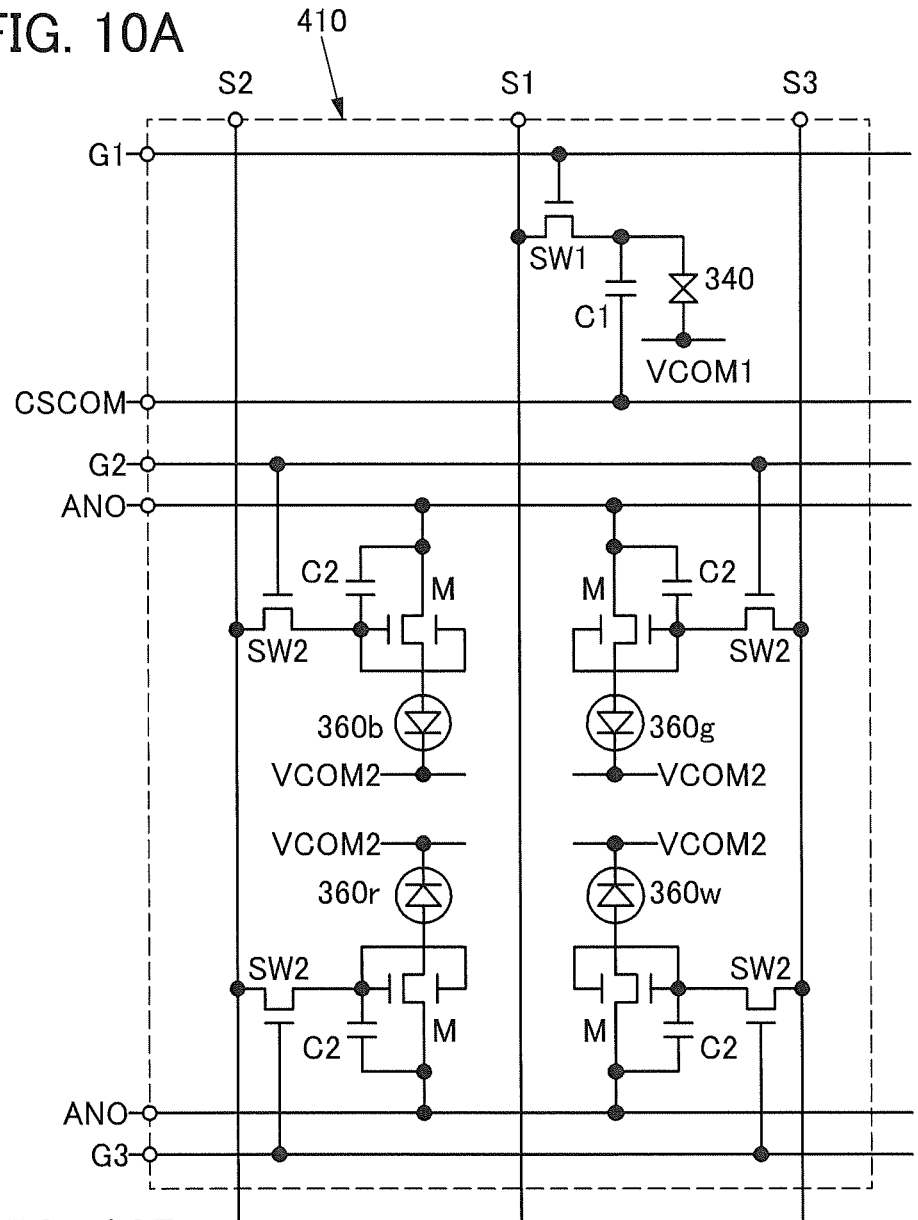
FIGS. 10A and 10B are a circuit diagram and a schematic view of a pixel of a display device of one embodiment of the present invention.

Although FIG. 9 illustrates an example in which one liquid crystal element 340 and one light-emitting element 360 are provided in one pixel 410, one embodiment of the present invention is not limited to this example. FIG. 10A illustrates an example in which one liquid crystal element 340 and four light-emitting elements 360 (light-emitting elements 360r, 360g, 360b, and 360w) are provided in one pixel 410. The pixel 410 illustrated in FIG. 10A differs from that in FIG. 9 in being capable of performing full-color display by one pixel.

In addition to the example in FIG. 9, the pixel 410 in FIG. 10A is connected to a wiring G3 and a wiring S3.

In the example illustrated in FIG. 10A, for example, light-emitting elements which exhibit red (R), green (G), blue (B), and white (W) can be used as the four light-emitting elements 360. Furthermore, as the liquid crystal element 340, a reflective liquid crystal element emitting white light can be used. Thus, in the case of performing display in the reflective mode, white display with high reflectivity can be performed. In the case of performing display in the transmissive mode, an image can be displayed with a higher color rendering property at low power consumption.

Figure 10B:
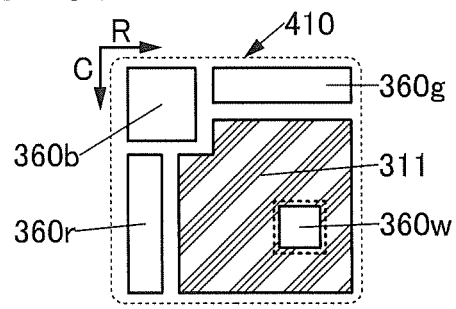

FIG. 10B illustrates a configuration example of the pixel 410. The pixel 410 includes the light-emitting element 360w which overlaps with the opening in the electrode 311 and the light-emitting elements 360r, 360g, and 360b which are located near the electrode 311. It is preferable that the light-emitting elements 360r, 360g, and 360b have substantially the same light-emitting area.

<Structure Example 6 of Light-Emitting Device>

Figure 11:
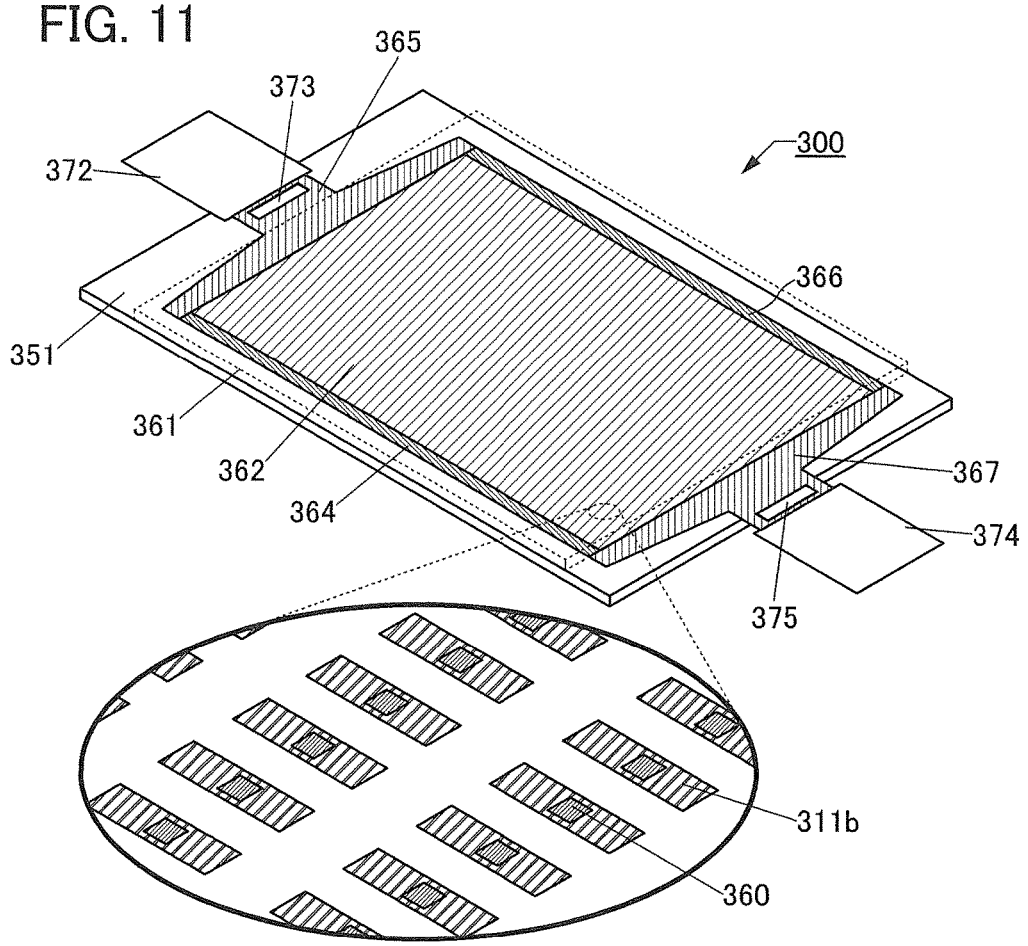
FIG. 11 is a schematic view of a display device of one embodiment of the present invention.

FIG. 11 is a schematic perspective view of a light-emitting device 300 of one embodiment of the present invention. In the light-emitting device 300, a substrate 351 and a substrate 361 are bonded to each other. In FIG. 11, the substrate 361 is denoted by a dashed line.

The light-emitting device 300 includes the display portion 362, a circuit portion 364, a wiring 365, a circuit portion 366, a wiring 367, and the like. The substrate 351 is provided with the circuit portion 364, the wiring 365, the circuit portion 366, the wiring 367, the electrode 311b functioning as a pixel electrode, and the like. In FIG. 11, an IC 373, an FPC 372, an IC 375, and an FPC 374 are mounted on the substrate 351. Thus, the structure illustrated in FIG. 11 can be referred to as a display module including the light-emitting device 300, the IC 373, the FPC 372, the IC 375, and the FPC 374.

For the circuit portion 364, a circuit functioning as a scan line driver circuit can be used, for example.

The wiring 365 has a function of supplying a signal and electric power to the display portion and the circuit portion 364. The signal and electric power are input to the wiring 365 from the outside through the FPC 372 or from the IC 373.

FIG. 11 illustrates an example in which the IC 373 is provided on the substrate 351 by a chip on glass (COG)

method or the like. As the IC 373, an IC functioning as a scan line driver circuit, a signal line driver circuit, or the like can be used. Note that it is possible that the IC 373 is not provided, for example, when the light-emitting device 300 includes circuits functioning as a scan line driver circuit and a signal line driver circuit and when the circuits functioning as a scan line driver circuit and a signal line driver circuit are provided outside and signals for driving the light-emitting device 300 are input through the FPC 372. Alternatively, the IC 373 may be mounted on the FPC 372 by a chip on film (COF) method or the like.

FIG. 11 illustrates an enlarged view of a part of the display portion 362. Electrodes 311b included in a plurality of light-emitting elements are arranged in a matrix in the display portion 362. The electrode 311b has a function of reflecting visible light and serves as a reflective electrode of the liquid crystal element 340 described later.

As illustrated in FIG. 11, the electrode 311b has an opening. The light-emitting element 360 is positioned closer to the substrate 351 than the electrode 311b is. Light is emitted from the light-emitting element 360 to the substrate 361 side through the opening in the electrode 311b.

Figure 12:
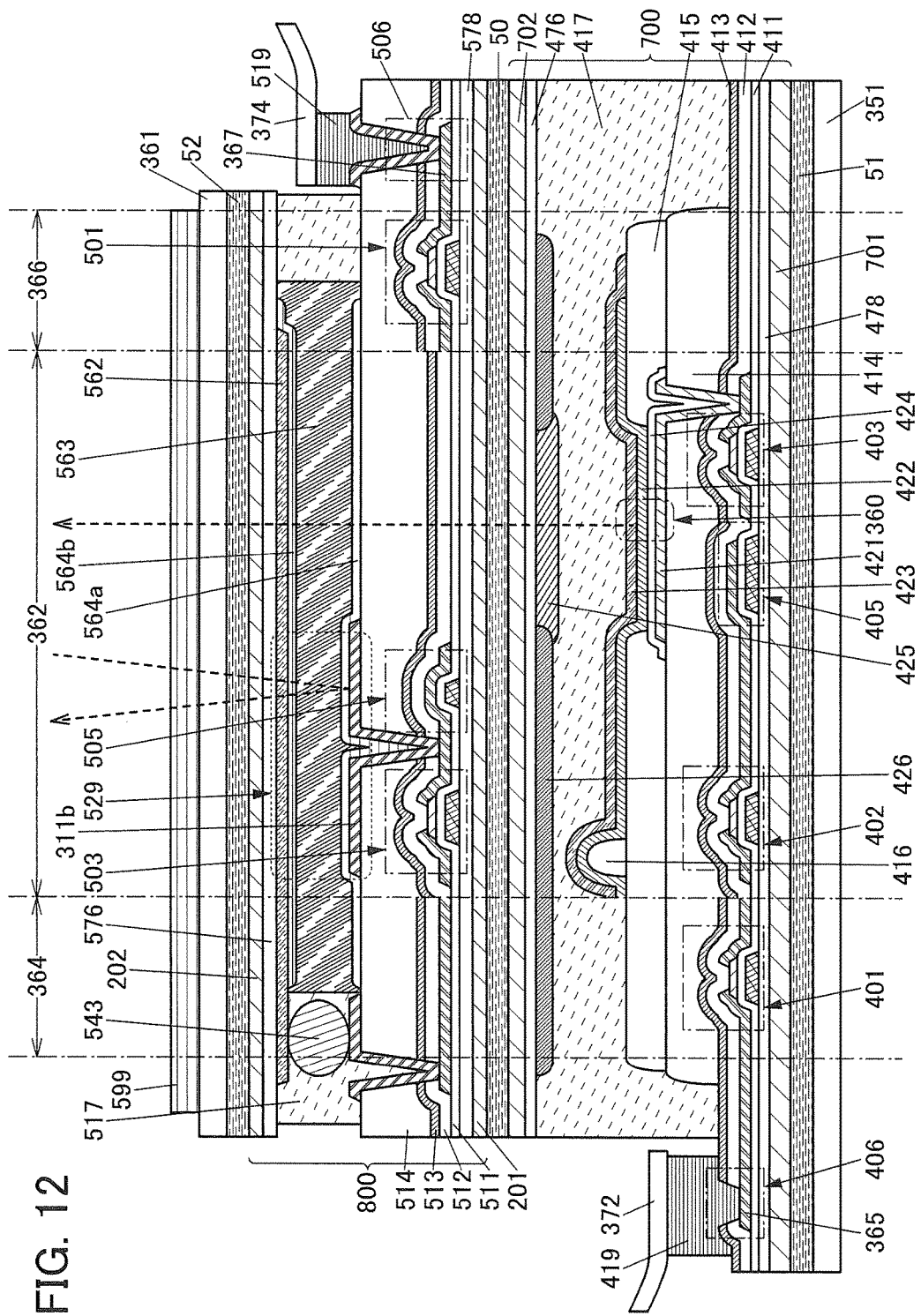
FIG. 12 is a schematic view of a display device of one embodiment of the present invention.

FIG. 12 illustrates an example of cross sections of part of a region including the FPC 372, part of a region including the circuit portion 364, part of a region including the display portion 362, part of a region including the circuit portion 366, and part of a region including the FPC 374 of the light-emitting device illustrated in FIG. 11.

The light-emitting device illustrated in FIG. 12 has a structure in which a display panel 700 and a display panel 800 are stacked. The display panel 700 includes a resin layer 701 and a resin layer 702. The display panel 800 includes a resin layer 201 and a resin layer 202. The resin layers 702 and 201 are bonded to each other with an adhesive layer 50. The resin layer 701 is bonded to the substrate 351 with an adhesive layer 51. The resin layer 202 is bonded to the substrate 361 with an adhesive layer 52.

[Display Panel 700]

The display panel 700 includes the resin layer 701, an insulating layer 478, a plurality of transistors, a capacitor 405, an insulating layer 411, an insulating layer 412, an insulating layer 413, an insulating layer 414, an insulating layer 415, the light-emitting element 360, a spacer 416, an adhesive layer 417, a coloring layer 425, a light-blocking layer 426, an insulating layer 476, and the resin layer 702.

The circuit portion 364 includes a transistor 401. The display portion 362 includes a transistor 402 and a transistor 403.

Each of the transistors includes a gate, the insulating layer 411, a semiconductor layer, a source, and a drain. The gate and the semiconductor layer overlap with each other with the insulating layer 411 provided therebetween. Part of the insulating layer 411 functions as a gate insulating layer, and another part of the insulating layer 411 functions as a dielectric of the capacitor 405. A conductive layer that functions as the source or the drain of the transistor 402 also functions as one electrode of the capacitor 405.

The transistors illustrated in FIG. 12 have bottom-gate structures. The transistor structures may be different between the circuit portion 364 and the display portion 362. The circuit portion 364 and the display portion 362 may each include a plurality of kinds of transistors.

Figure 13:
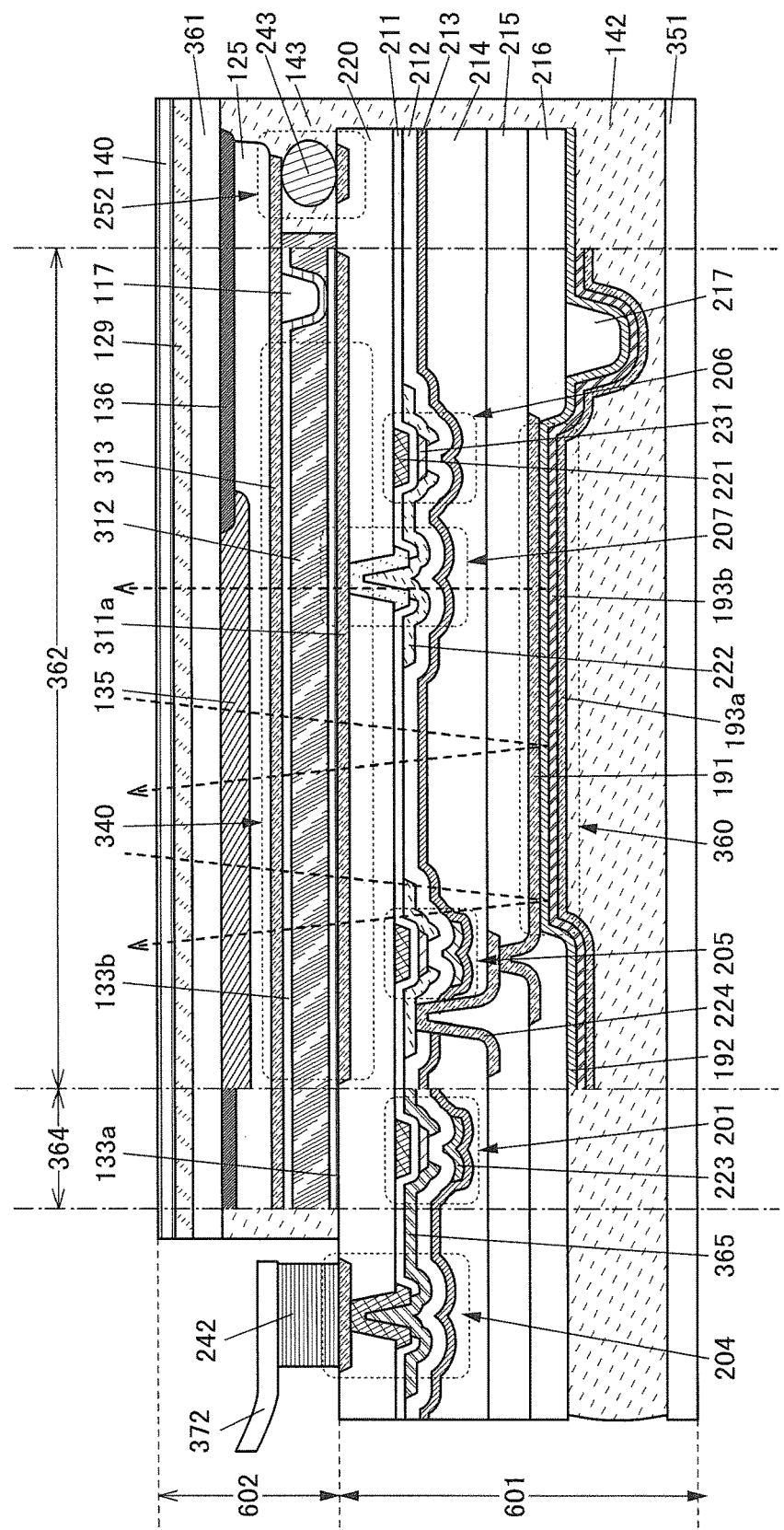
FIG. 13 is a schematic view of a display device of one embodiment of the present invention.

For example, as illustrated in FIG. 13, where the structure of the light-emitting device in FIG. 12 is modified, components included in transistors 205 and 206 and a connection portion 207 can be formed using light-transmitting conductors. Light emitted from the light-emitting element 360 can pass through part or the whole of the transistors 205 and 206 and the connection portion 207. Furthermore, light entering from the substrate 361 side and passing through liquid crystal 312 can be reflected by a conductive layer 193b. To improve the reliability of the transistors 205 and 206, one of or both the conductive layer serving as a gate electrode and the conductive layer serving as a backgate electrode may be formed using a layer which does not have a light-transmitting property, such as metal.

In FIG. 12, the capacitor 405 includes a pair of electrodes and the dielectric therebetween. The capacitor 405 includes a conductive layer that is formed using the same material and the same process as the gates of the transistors, and a conductive layer that is formed using the same material and the same process as the sources and the drains of the transistors.

The insulating layer 412, the insulating layer 413, and the insulating layer 414 are each provided to cover the transistors and the like. The number of the insulating layers covering the transistors and the like is not particularly limited. The insulating layer 414 functions as a planarization layer. It is preferable that at least one of the insulating layer 412, the insulating layer 413, and the insulating layer 414 be formed using a material inhibiting diffusion of impurities such as water and hydrogen. Diffusion of impurities from the outside into the transistors can be effectively inhibited, leading to improved reliability of the light-emitting device.

In the case of using an organic material for the insulating layer 414, impurities such as moisture might enter the light-emitting element 360 or the like from the outside of the light-emitting device through the insulating layer 414 exposed at an end portion of the light-emitting device. Deterioration of the light-emitting element 360 due to the entry of impurities can lead to deterioration of the light-emitting device. For this reason, the insulating layer 414 is preferably not positioned at the end portion of the light-emitting device, as illustrated in FIG. 12. Since an insulating layer formed using an organic material is not positioned at the end portion of the light-emitting device in the structure of FIG. 12, entry of impurities into the light-emitting element 360 can be inhibited.

The light-emitting element 360 includes an electrode 421, an EL layer 422, and an electrode 423. The light-emitting element 360 may include an optical adjustment layer 424. The light-emitting element 360 has a top emission structure with which light is emitted to the coloring layer 425 side.

The transistors, the capacitor, the wiring, and the like are positioned so as to overlap with a light-emitting region of the light-emitting element 360; accordingly, the aperture ratio of the display portion 362 can be increased.

One of the electrode 421 and the electrode 423 functions as an anode and the other functions as a cathode. When a voltage higher than the threshold voltage of the light-emitting element 360 is applied between the electrode 421 and the electrode 423, holes are injected to the EL layer 422 from the anode side and electrons are injected to the EL layer 422 from the cathode side. The injected electrons and holes are recombined in the EL layer 422 and a light-emitting substance contained in the EL layer 422 emits light.

The electrode 421 is electrically connected to the source or the drain of the transistor 403 directly or through a conductive layer. The electrode 421 functioning as a pixel electrode is provided for each light-emitting element 360. Two adjacent electrodes 421 are electrically insulated from each other by the insulating layer 415.

The electrode 423 functioning as a common electrode is shared by a plurality of light-emitting elements 360. A fixed potential is supplied to the electrode 423.

The light-emitting element 360 overlaps with the coloring layer 425 with the adhesive layer 417 provided therebetween. The spacer 416 overlaps with the light-blocking layer 426 with the adhesive layer 417 provided therebetween. Although FIG. 12 illustrates the case where a space is provided between the electrode 423 and the light-blocking layer 426, the electrode 423 and the light-blocking layer 426 may be in contact with each other. Although the spacer 416 is provided on the substrate 351 side in the structure illustrated in FIG. 12, the spacer 416 may be provided on the substrate 361 side (e.g., in a position closer to the substrate 361 than that of the light-blocking layer 426).

Owing to the combination of a color filter (the coloring layer 425) and a microcavity structure (the optical adjustment layer 424), light with high color purity can be extracted from the light-emitting device. The thickness of the optical adjustment layer 424 is varied depending on the color of the pixel.

The coloring layer 425 is a coloring layer that transmits light in a specific wavelength range. For example, a color filter for transmitting light in a red, green, blue, or yellow wavelength range can be used.

The light-blocking layer 426 is provided between the adjacent coloring layers 425. The light-blocking layer 426 blocks light emitted from the adjacent light-emitting element 360 to inhibit color mixture between the adjacent light-emitting elements 360. Here, the coloring layer 425 is provided such that its end portion overlaps with the light-blocking layer 426, whereby light leakage can be reduced. For the light-blocking layer 426, a material that blocks light emitted from the light-emitting element 360 can be used. Note that it is preferable to provide the light-blocking layer 426 in a region other than the display portion 362, such as the circuit portion 364, in which case undesired leakage of guided light or the like can be inhibited.

The insulating layer 478 is formed on a surface of the resin layer 701. The insulating layer 476 is formed on a surface of the resin layer 702. The insulating layer 476 and the insulating layer 478 are preferably highly resistant to moisture. The light-emitting element 360, the transistors, and the like are preferably provided between a pair of insulating layers with high resistance to moisture, in which case impurities such as water can be prevented from entering these elements, leading to an increase in the reliability of the light-emitting device.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmittance of the insulating film with high resistance to moisture is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], and still further preferably lower than or equal to $1 \times 10^{-8}$ [g/(m$^2$·day)].

A connection portion 406 includes the wiring 365. The wiring 365 can be formed using the same material and the same process as those of the sources and the drains of the transistors. The connection portion 406 is electrically connected to an external input terminal through which a signal and a potential from the outside are transmitted to the circuit portion 364. Here, an example in which the FPC 372 is provided as the external input terminal is described. The FPC 372 is electrically connected to the connection portion 406 through a connection layer 419.

The connection layer 419 can be formed using any of various kinds of anisotropic conductive films (ACF), anisotropic conductive pastes (ACP), and the like.

The above is the description of the display panel 700.

[Display Panel 800]

The display panel 800 is a reflective display device employing a vertical electric field mode.

The display panel 800 includes the resin layer 201, an insulating layer 578, a plurality of transistors, a capacitor 505, the wiring 367, an insulating layer 511, an insulating layer 512, an insulating layer 513, an insulating layer 514, a liquid crystal element 529, an alignment film 564a, an alignment film 564b, an adhesive layer 517, an insulating layer 576, and the resin layer 202.

The resin layers 201 and 202 are bonded to each other with the adhesive layer 517. Liquid crystal 563 is sealed in a region surrounded by the resin layer 201, the resin layer 202, and the adhesive layer 517. A polarizing plate 599 is positioned on an outer surface of the substrate 361.

The liquid crystal element 529 includes the electrode 311b, an electrode 562, and the liquid crystal 563. The electrode 311b functions as a pixel electrode. The electrode 562 functions as a common electrode. Alignment of the liquid crystal 563 can be controlled with an electric field generated between the electrode 311b and the electrode 562. The alignment film 564a is provided between the liquid crystal 563 and the electrode 311b. The alignment film 564b is provided between the liquid crystal 563 and the electrode 562.

The resin layer 202 is provided with the insulating layer 576, the electrode 562, the alignment film 564b, and the like.

The resin layer 201 is provided with the electrode 311b, the alignment film 564a, a transistor 501, a transistor 503, the capacitor 505, a connection portion 506, the wiring 367, and the like.

Insulating layers such as the insulating layer 511, the insulating layer 512, the insulating layer 513, and the insulating layer 514 are provided over the resin layer 201.

Note that a portion of the conductive layer functioning as the source or the drain of the transistor 503 which is not electrically connected to the electrode 311b may function as part of a signal line. The conductive layer functioning as a gate of the transistor 503 may function as part of a scan line.

FIG. 12 illustrates an example of the circuit portion 366 in which the transistor 501 is provided.

A material inhibiting diffusion of impurities such as water and hydrogen is preferably used for at least one of the insulating layers 512 and 513 which cover the transistors.

The electrode 311b is provided over the insulating layer 514. The electrode 311b is electrically connected to one of the source and the drain of the transistor 503 through an opening formed in the insulating layer 514, the insulating layer 513, the insulating layer 512, and the like. The electrode 311b is electrically connected to one electrode of the capacitor 505.

Since the display panel 800 is a reflective display device, a conductive material that reflects visible light is used for the electrode 311b and a conductive material that transmits visible light is used for the electrode 562.

For example, a material containing one of indium (In), zinc (Zn), and tin (Sn) is preferably used for the conductive material that transmits visible light. Specific examples include indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium. Note that a film containing graphene can be used as well. The film containing graphene can be formed, for example, by reducing a film containing graphene oxide.

Examples of the conductive material that reflects visible light include aluminum, silver, and an alloy containing any of these metal materials. A metal material such as gold, platinum, nickel, tungsten, chromium, molybdenum, iron, cobalt, copper, or palladium, or an alloy containing any of these metal materials can also be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used.

As the polarizing plate 599, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, driving voltage, and the like of the liquid crystal element used as the liquid crystal element 529 are controlled depending on the kind of the polarizing plate 599 so that desirable contrast is obtained.

The electrode 562 is electrically connected to a conductive layer on the resin layer 201 side through a connector 543 in a portion close to an end portion of the resin layer 202. Thus, a potential or a signal can be supplied from the FPC 374, an IC, or the like placed on the resin layer 201 side to the electrode 562.

As the connector 543, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 543, a material capable of elastic deformation or plastic deformation is preferably used. As illustrated in FIG. 12, the connector 543, which is the conductive particle, has a shape that is vertically crushed in some cases. With the crushed shape, the contact area between the connector 543 and a conductive layer electrically connected to the connector 543 can be increased, thereby reducing contact resistance and suppressing the generation of problems such as disconnection.

The connector 543 is preferably provided so as to be covered with the adhesive layer 517. For example, the connectors 543 are dispersed in the adhesive layer 517 before curing of the adhesive layer 517.

The connection portion 506 is provided in a region near an end portion of the resin layer 201. The connection portion 506 is electrically connected to the FPC 374 through a connection layer 519.

The above is the description of the display panel 800.

[Display Element]

As a display element included in a first pixel located on the display surface side, an element which performs display by reflecting external light can be used. Such an element does not include a light source and thus power consumption in display can be significantly reduced. As the display element included in the first pixel, a reflective liquid crystal element can be typically used. Alternatively, as the light-emitting element included in the first pixel, an element using a microcapsule method, an electrophoretic method, an electrowetting method, an Electronic Liquid Powder (registered trademark) method, or the like can be used, other than a micro electro mechanical systems (MEMS) shutter element or an optical interference type MEMS element.

As a display element included in a second pixel located on the side opposite to the display surface side, an element which includes a light source and performs display using light from the light source can be used. Since the luminance and the chromaticity of light emitted from such a pixel are not affected by external light, an image with high color reproducibility (a wide color gamut) and a high contrast, i.e., a clear image can be displayed. As the light-emitting element included in the second pixel, a self-luminous light-emitting element such as an organic light-emitting diode (OLED), a light-emitting diode (LED), or a quantum-dot light-emitting diode (QLED) can be used. Alternatively, a combination of a backlight that is a light source and a transmissive liquid crystal element that controls the amount of transmitted light emitted from a backlight may be used as the display element included in the second pixel.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element controls transmission or non-transmission of light utilizing an optical modulation action of a liquid crystal. The optical modulation action of the liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, guest-host liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the display device in the manufacturing process can be reduced.

In the case where a reflective liquid crystal element is used, a polarizing plate is provided on the display surface side. In addition, a light diffusion plate is preferably provided on the display surface side to improve visibility.

[Light-Emitting Element]

As the light-emitting element, a self-luminous element can be used, and an element whose luminance is controlled by current or voltage is included in the category of the light-emitting element. For example, an LED, a QLED, an organic EL element, or an inorganic EL element can be used; however, any of the light-emitting elements described in Embodiment 1 and Embodiment 2 is preferably used.

In this embodiment, in particular, the light-emitting element preferably has a top emission structure. A conductive film that transmits visible light is used as the electrode through which light is extracted. A conductive film that reflects visible light is preferably used as the electrode through which light is not extracted. The light-emitting element may be a single element including one EL layer or a tandem element in which a plurality of EL layers are stacked with a charge-generation layer positioned therebetween.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, the low-molecular compound, the high-molecular compound, or the inorganic compound described in Embodiment 1 can be used. Each of the layers included in the EL layer can be formed by any of the following methods: an evaporation method (including a vacuum evaporation method), a transfer method, a printing method, an inkjet method, a coating method, and the like.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component type resin may be used. Further alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, or zirconium can be used.

[Connection Layer]

As the connection layer, an anisotropic conductive film (ACF), an anisotropic conductive paste (ACP), or the like can be used.

[Coloring Layer]

Examples of a material that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material for a coloring layer that transmits light of a certain color and a film containing a material for a coloring layer that transmits light of another color can be employed. It is preferable that the coloring layer and the light-blocking layer be formed using the same material because the same manufacturing apparatus can be used and the process can be simplified.

The structure described in this embodiment can be combined as appropriate with any of the structures described in the other embodiments.

Embodiment 6

In this embodiment, electronic devices of one embodiment of the present invention will be described.

In one embodiment of the present invention, a light-emitting element whose emission color is hardly changed over time and is stable can be fabricated. Thus, when the light-emitting element is used in an electronic device, a highly reliable electronic device can be fabricated. Furthermore, one embodiment of the present invention is an OLED element; thus, a highly reliable electronic device having a curved surface can be fabricated. In addition, flexible and highly reliable electronic device can be fabricated by one embodiment of the present invention.

Examples of the electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The light-emitting device of one embodiment of the present invention can achieve high visibility regardless of the intensity of external light. Thus, the light-emitting device of one embodiment of the present invention can be suitably used for a portable electronic device, a wearable electronic device (wearable device), an e-book reader, or the like.

Figure 14A:
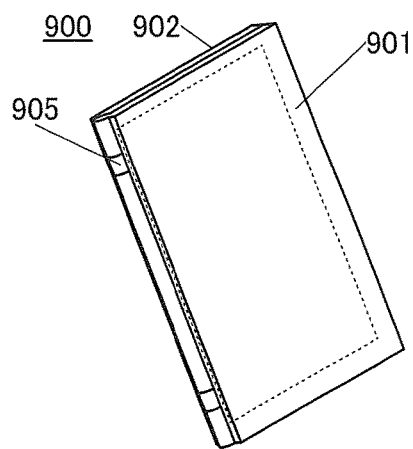
FIGS. 14A to 14D are schematic views of electronic devices of one embodiment of the present invention.
Figure 14B:
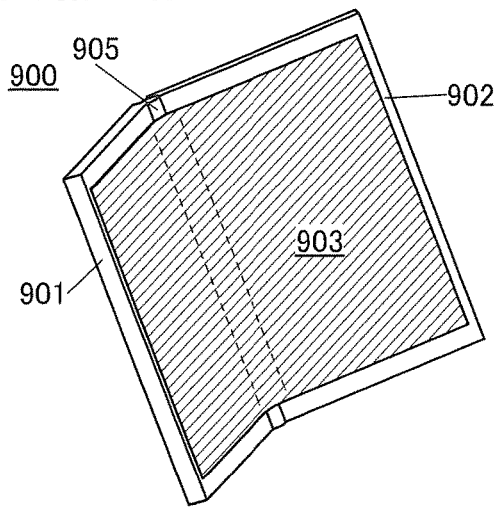

A portable information terminal 900 illustrated in FIGS. 14A and 14B includes a housing 901, a housing 902, a display portion 903, a hinge portion 905, and the like.

The housing 901 and the housing 902 are joined together with the hinge portion 905. The portable information terminal 900 can be opened as illustrated in FIG. 14B from a closed state (FIG. 14A). Thus, the portable information terminal 900 has high portability when carried and excellent visibility when used because of its large display region.

In the portable information ten final 900, the flexible display portion 903 is provided across the housing 901 and the housing 902 which are joined to each other by the hinge portion 905.

The light-emitting device manufactured using one embodiment of the present invention can be used for the display portion 903. Thus, the portable information terminal can be manufactured with high yield.

The display portion 903 can display at least one of a text, a still image, a moving image, and the like. When a text is displayed on the display portion, the portable information terminal 900 can be used as an e-book reader.

When the portable information terminal 900 is opened, the display portion 903 is significantly curved. For example, the display portion 903 is held while including a curved portion with a radius of curvature of greater than or equal to 1 mm and less than or equal to 50 mm, preferably greater than or equal to 5 mm and less than or equal to 30 mm. Part of the display portion 903 can display an image while being bent since pixels are continuously arranged from the housing 901 to the housing 902.

The display portion 903 functions as a touch panel and can be controlled with a finger, a stylus, or the like.

The display portion 903 is preferably formed using one flexible display. Thus, a continuous image can be displayed between the housing 901 and the housing 902. Note that each of the housing 901 and the housing 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which the housing 901 and the housing 902 become locked (they are not opened any further) is preferably greater than or equal to 90° and less than 180° and can be typically 90°, 120°, 135°, 150°, 175°, or the like. In that case, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be provided.

A power button, an operation button, an external connection port, a speaker, a microphone, or the like may be provided for the housing 901 and the housing 902.

Either of the housing 901 and the housing 902 is provided with a wireless communication module, and data can be transmitted and received through a computer network such as the Internet, a local area network (LAN), or Wireless Fidelity (Wi-Fi: registered trademark).

Figure 14C:
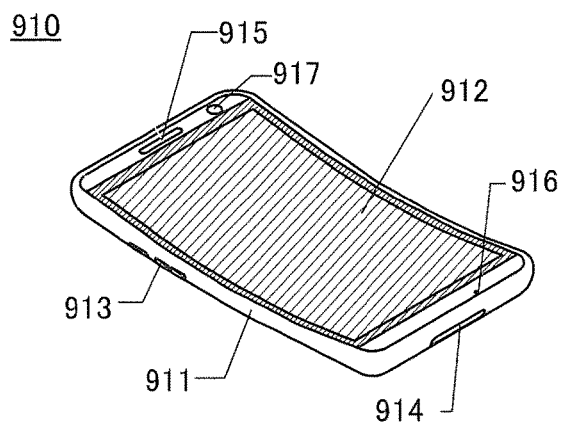

A portable information terminal 910 illustrated in FIG. 14C includes a housing 911, a display portion 912, an operation button 913, an external connection port 914, a speaker 915, a microphone 916, a camera 917, and the like.

The light-emitting device manufactured using one embodiment of the present invention can be used for the display portion 912. Thus, the portable information terminal can be manufactured with high yield.

The portable information terminal 910 includes a touch sensor in the display portion 912. Operations such as making a call and inputting a character can be performed by touch on the display portion 912 with a finger, a stylus, or the like.

With the operation button 913, the power can be turned on or off. In addition, types of images displayed on the display portion 912 can be switched; for example, switching an image from a mail creation screen to a main menu screen is performed with the operation button 913.

When a detection device such as a gyroscope sensor or an acceleration sensor is provided inside the portable information terminal 910, the direction of display on the screen of the display portion 912 can be automatically changed by determining the orientation of the portable information terminal 910 (whether the portable information terminal 910 is placed horizontally or vertically). Furthermore, the direction of display on the screen can be changed by touch on the display portion 912, operation with the operation button 913, sound input using the microphone 916, or the like.

The portable information terminal 910 functions as, for example, one or more of a telephone set, a notebook, and an information browsing system. Specifically, the portable information terminal 910 can be used as a smartphone. The portable information terminal 910 is capable of executing a variety of applications such as mobile phone calls, e-mailing, viewing and editing texts, music reproduction, reproducing a moving image, Internet communication, and computer games, for example.

Figure 14D:
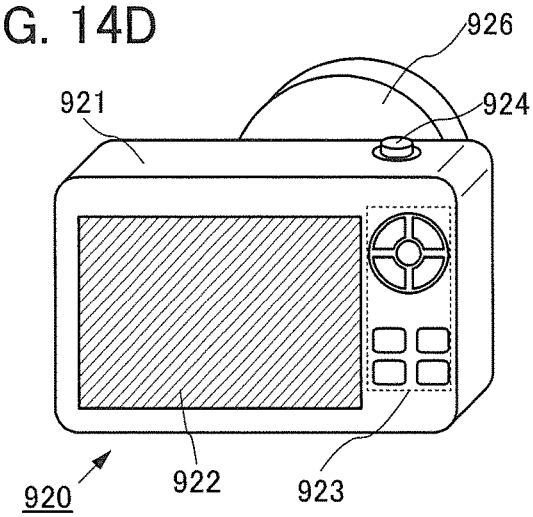

A camera 920 illustrated in FIG. 14D includes a housing 921, a display portion 922, operation buttons 923, a shutter button 924, and the like. Furthermore, an attachable lens 926 is attached to the camera 920.

The light-emitting device manufactured using one embodiment of the present invention can be used for the display portion 922. Thus, the camera can be manufactured with high yield.

Although the lens 926 of the camera 920 here is detachable from the housing 921 for replacement, the lens 926 may be incorporated into the housing 921.

A still image or a moving image can be taken with the camera 920 at the press of the shutter button 924. In addition, images can also be taken by the touch of the display portion 922 which has a function of a touch panel.

Note that a stroboscope, a viewfinder, or the like can be additionally attached to the camera 920. Alternatively, these may be incorporated into the housing 921.

FIGS. 15A to 15E illustrate electronic devices. These electronic devices each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The light-emitting device manufactured using one embodiment of the present invention can be favorably used for the display portion 9001. Thus, the electronic devices can be manufactured with high yield.

The electronic devices illustrated in FIGS. 15A to 15E can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that the functions of the electronic devices illustrated in FIGS. 15A to 15E are not limited to the above, and the electronic devices may have other functions.

Figure 15A:
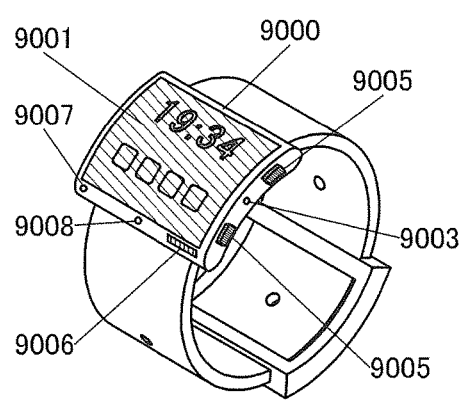
FIGS. 15A to 15E are schematic views of electronic devices of one embodiment of the present invention.
Figure 15B:
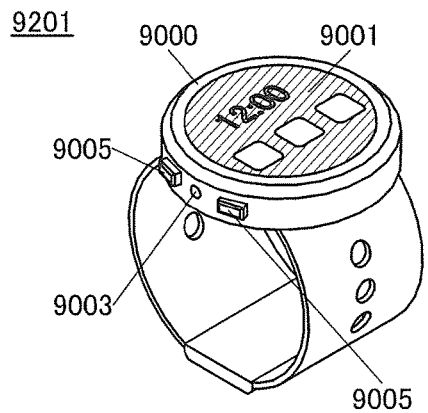

FIG. 15A is a perspective view of a watch-type portable information terminal 9200. FIG. 15B is a perspective view of a watch-type portable information terminal 9201.

The portable information terminal 9200 illustrated in FIG. 15A is capable of executing a variety of applications such as mobile phone calls, e-mailing, viewing and editing texts, music reproduction, Internet communication, and computer games. The display surface of the display portion 9001 is bent, and an image can be displayed on the bent display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal illustrated in FIG. 15A, the display surface of the display portion 9001 is not curved in the portable information terminal 9201 illustrated in FIG. 15B. Furthermore, the external state of the display portion of the portable information terminal 9201 is a non-rectangular shape (a circular shape in FIG. 15B).

Figure 15C:
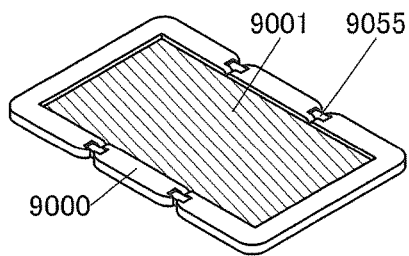
Figure 15D:
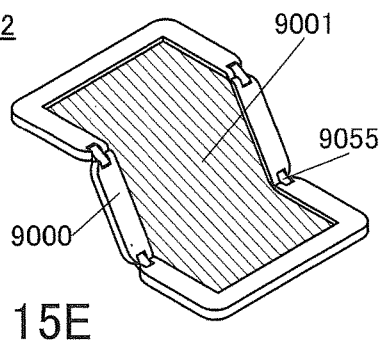
Figure 15E:
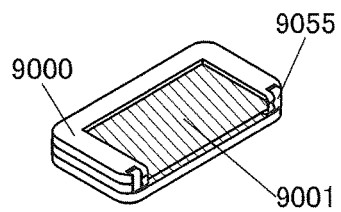

FIGS. 15C to 15E are perspective views of a foldable portable information terminal 9202. FIG. 15C is a perspective view illustrating the portable information terminal 9202 that is opened. FIG. 15D is a perspective view illustrating the portable information terminal 9202 that is being opened or being folded. FIG. 15E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

This embodiment can be combined with any of other embodiments as appropriate.

Embodiment 7

In this embodiment, examples in which the light-emitting element of one embodiment of the present invention is used for various electronic devices and lighting devices will be described with reference to FIGS. 16A to 16C and FIG. 17.

An electronic device or a lighting device that has a light-emitting region with a curved surface can be obtained with use of the light-emitting element of one embodiment of the present invention which is fabricated over a substrate having flexibility.

Furthermore, a light-emitting device in which the light-emitting element of one embodiment of the present invention is used can also be used for lighting for motor vehicles, examples of which are lighting for a windshield, a ceiling, and the like.

Figure 16A:
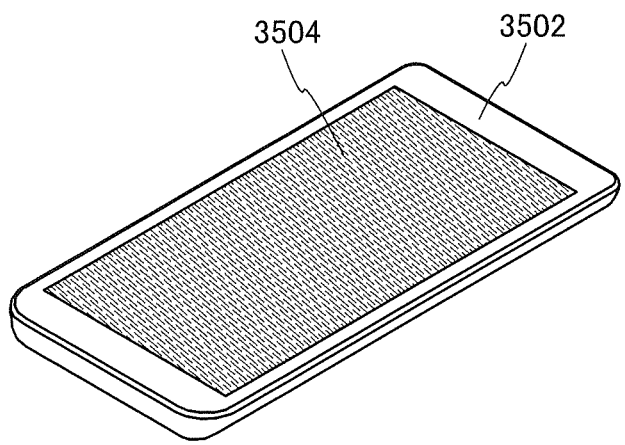
FIGS. 16A to 16C illustrate electronic devices of one embodiment of the present invention.
Figure 16B:
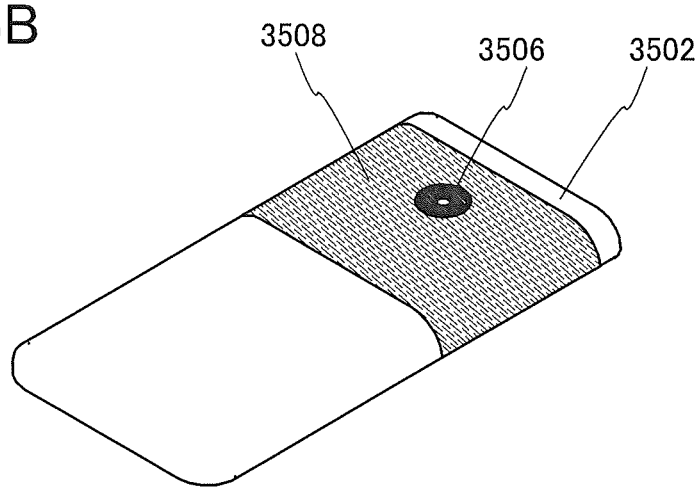

FIG. 16A is a perspective view illustrating one surface of a multifunction terminal 3500, and FIG. 16B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 16A and 16B can have a variety of functions as in the electronic devices illustrated in FIGS. 14A to 14C.

The housing 3502 can include a speaker, a sensor (a sensor having a function of measuring or sensing force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone, and the like. When a detection device including a sensor for detecting inclination, such as a gyroscope sensor or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 16C:
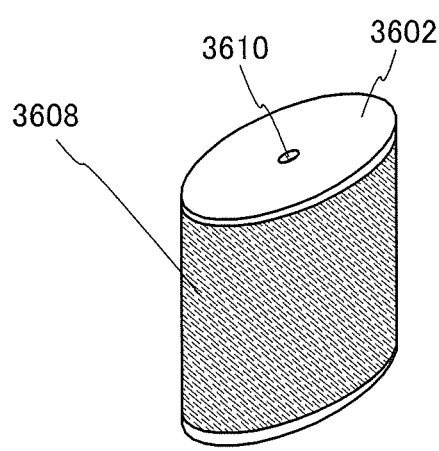

FIG. 16C is a perspective view of a security light 3600. The light 3600 includes lighting 3608 on the outside of the housing 3602, and a speaker 3610 and the like are incorporated in the housing 3602. The light-emitting element of one embodiment of the present invention can be used for the lighting 3608.

The light 3600 emits light when the lighting 3608 is gripped or held, for example. An electronic circuit that can control the manner of light emission from the light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may be incorporated.

The light 3600 can emit light in various directions; therefore, it is possible to intimidate a thug or the like with light, or light and sound. Moreover, the light 3600 may include a camera such as a digital still camera to have a photography function.

Figure 17:
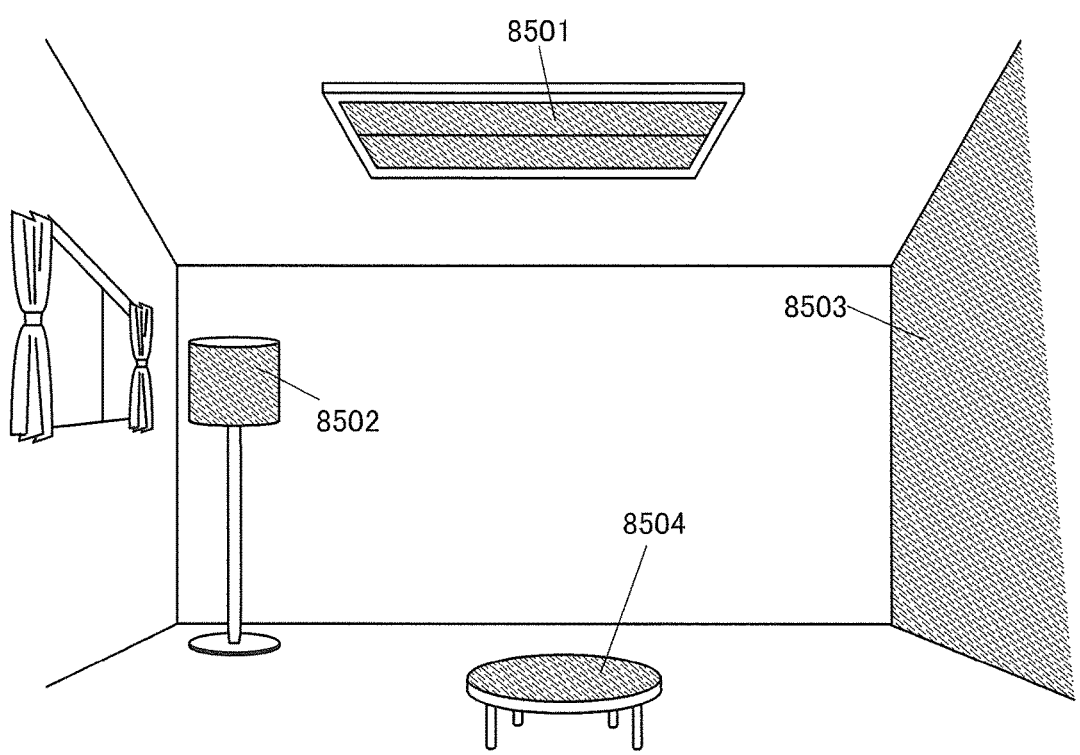
FIG. 17 illustrates lighting devices of one embodiment of the present invention.

FIG. 17 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, lighting devices and electronic devices can be obtained by application of the light-emitting element of one embodiment of the present invention. Note that the light-emitting device can be used for lighting devices and electronic devices in a variety of fields without being limited to the lighting devices and the electronic devices described in this embodiment.

The structure described in this embodiment can be used in appropriate combination with any of the structures described in the other embodiments.

Example 1

Figure 18:
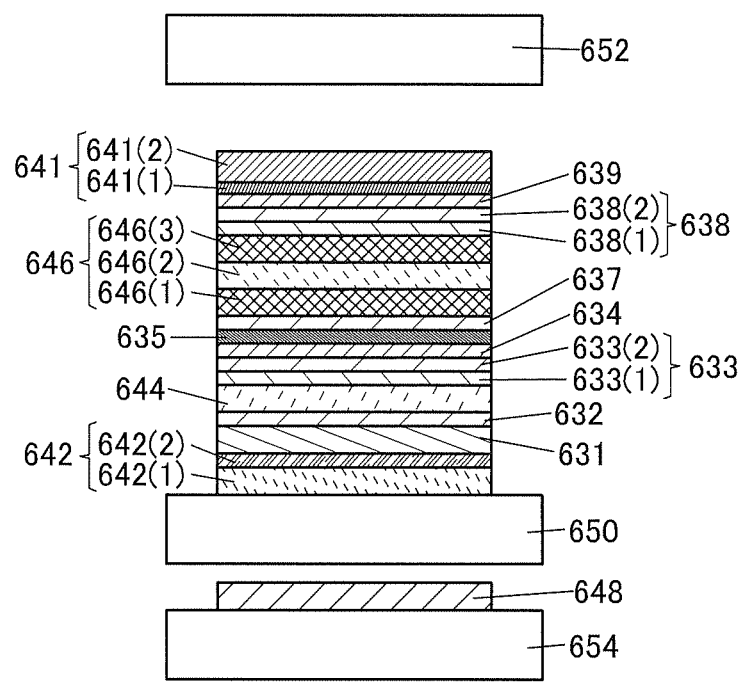
FIG. 18 is a schematic view of a light-emitting element in Example.

In this example, examples of fabricating light-emitting elements 1 to 3, each of which is a light-emitting element of one embodiment of the present invention, and a light-emitting device 1 are described. FIG. 18 is a schematic cross-sectional view of the light-emitting element fabricated in this example, and Tables 1 and 2 show details of the element structures. In each of the light-emitting elements 1 to 3, a red light-emitting layer, a green light-emitting layer, and a red light-emitting layer of the light-emitting layer 646 are stacked in this order from an anode side. As comparative examples, comparative light-emitting elements 4 to 6 and a comparative light-emitting device 2 each of which includes one red light-emitting layer and one green light-emitting layer in the light-emitting layer 646 are also fabricated. Tables 3 and 4 show the details of the element structures. Chemical formulae of materials used in this example are shown below.

[Chemical formula 1]

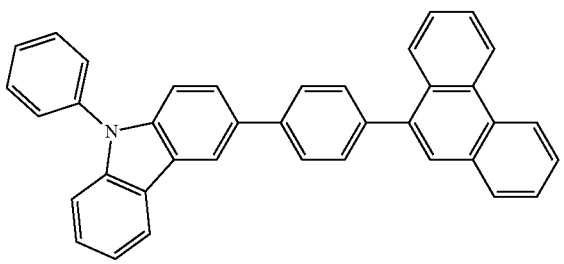

PCPPn

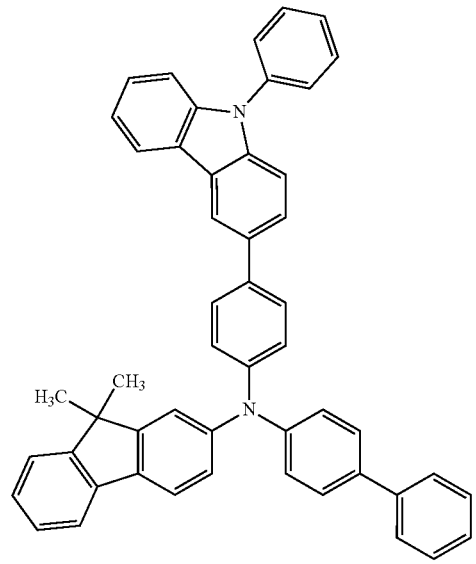

PCBBiF

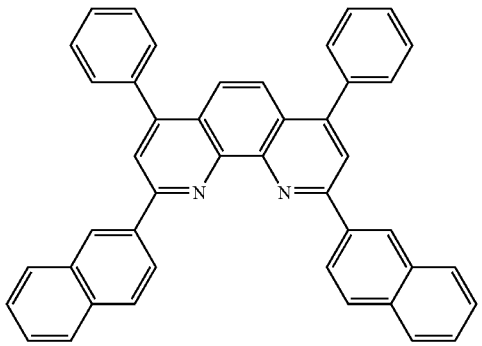

NBphen

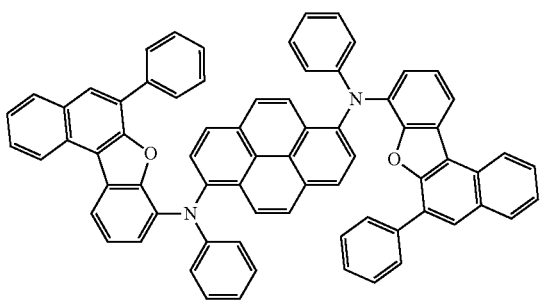

1,6BnfAPrn-03

-continued
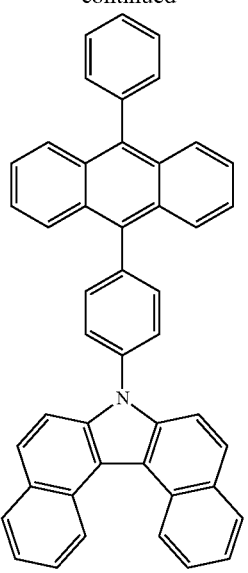
PCBBiF
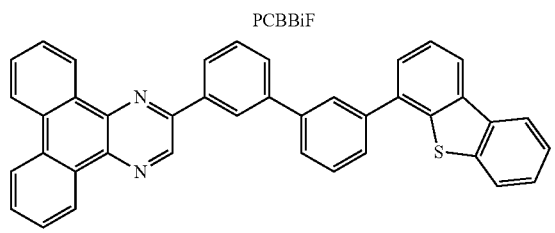
2mDBTBPDBq-II
[Chemical formula 2]
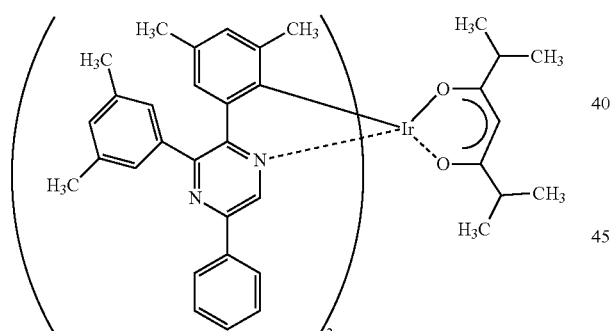
Ir(dmdppr-P)₂(dibm)
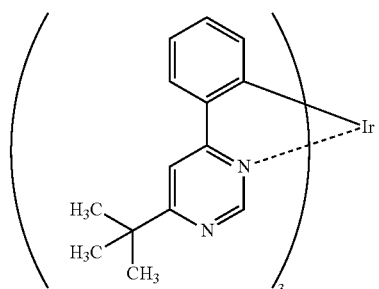
Ir(tBuppm)₃
-continued
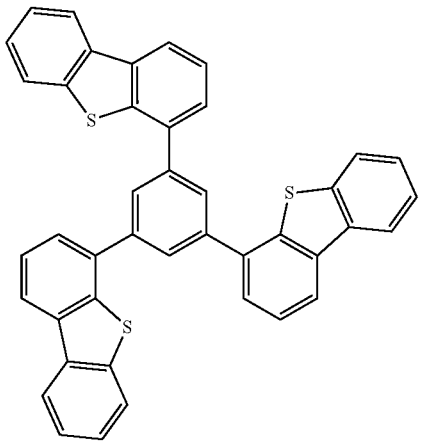
DBT3P-II
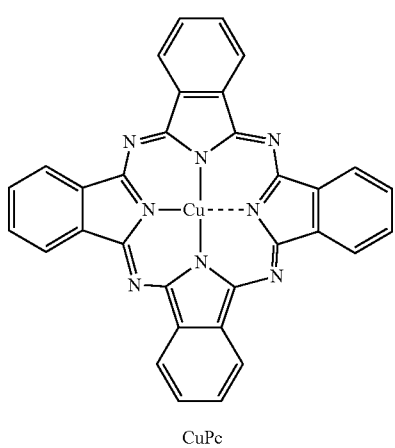
CuPc
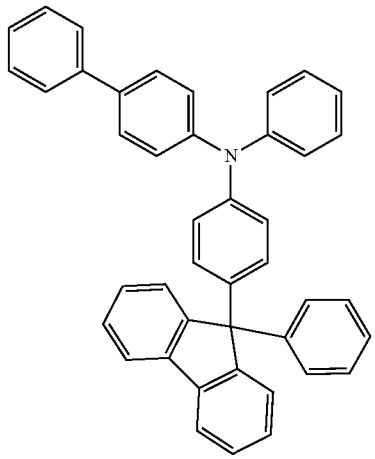
BPAFLP

TABLE 1

| | Layer | Reference numeral | Film thickness (nm) | Material | Weight ratio |
|---|---|---|---|---|---|
| Light-emitting element 1 | Electrode | 641(2) | 70 | ITSO | |
| | | 641(1) | 25 | Ag:Mg | 1:0.1 |
| | Electron-injection layer | 639 | 1 | LiF | — |
| | Electron-transport layer | 638(2) | 20 | NBphen | — |
| | | 638(1) | 25 | 2mDBTBPDBq-II | — |
| | Light-emitting layer | 646(3) | 5 | 2mDBTBPDBq-II:PCBBiF:Ir(dmdppr-P)$_2$(dibm) | 0.6:0.4:0.06 |
| | | 646(2) | 30 | 2mDBTBPDBq-II:PCBBiF:Ir(tBuppm)$_3$ | 0.8:0.2:0.06 |
| | | 646(1) | 10 | 2mDBTBPDBq-II:PCBBiF:Ir(dmdppr-P)$_2$(dibm) | 0.6:0.4:0.06 |
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6BnfAPrn-03 | 1:0.03 |
| | Hole-transport layer | 632 | 10 | PCPPn | — |
| | Hole-injection layer | 631 | 22.5 | PCPPn:MoO$_3$ | 1:0.5 |
| | Electrode | 642(2) | 95 | ITSO | — |
| | | 642(1) | 200 | APC | — |
| Light-emitting element 2 | Electrode | 641(2) | 70 | ITSO | |
| | | 641(1) | 25 | Ag:Mg | 1:0.1 |
| | Electron-injection layer | 639 | 1 | LiF | — |
| | Electron-transport layer | 638(2) | 20 | NBphen | — |
| | | 638(1) | 25 | 2mDBTBPDBq-II | — |
| | Light-emitting layer | 646(3) | 5 | 2mDBTBPDBq-II:PCBBiF:Ir(dmdppr-P)$_2$(dibm) | 0.6:0.4:0.06 |
| | | 646(2) | 30 | 2mDBTBPDBq-II:PCBBiF:Ir(tBuppm)$_3$ | 0.8:0.2:0.06 |
| | | 646(1) | 10 | 2mDBTBPDBq-II:PCBBiF:Ir(dmdppr-P)$_2$(dibm) | 0.6:0.4:0.06 |
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBC2PA:1,6BnfAPrn-03 | 1:0.03 |
| | Hole-transport layer | 632 | 10 | PCPPn | — |
| | Hole-injection layer | 631 | 17.5 | PCPPn:MoO$_3$ | 1:0.5 |
| | Electrode | 642(2) | 45 | ITSO | — |
| | | 642(1) | 200 | APC | — |

TABLE 2

| | Layer | Reference numeral | Film thickness (nm) | Material | Weight ratio |
|---|---|---|---|---|---|
| Light-emitting element 3 | Electrode | 641(2) | 70 | ITSO | |
| | | 641(1) | 25 | Ag:Mg | 1:0.1 |
| | Electron-injection layer | 639 | 1 | LiF | — |
| | Electron-transport layer | 638(2) | 20 | NBPhen | — |
| | | 638(1) | 25 | 2mDBTBPDBq-II | — |

TABLE 2-continued

| Layer | Reference numeral | Film thickness (nm) | Material | Weight ratio |
|---|---|---|---|---|
| Light-emitting layer | 646(3) | 5 | 2mDBTBPDBq-II:PCBBiF:Ir(dmdppr-P)$_2$(dibm) | 0.6:0.4:0.06 |
|  | 646(2) | 30 | 2mDBTBPDBq-II:PCBBiF:Ir(tBuppm)$_3$ | 0.8:0.2:0.06 |
|  | 646(1) | 10 | 2mDBTBPDBq-II:PCBBiF:Ir(dmdppr-P)$_2$(dibm) | 0.6:0.4:0.06 |
| Hole-transport layer | 637 | 15 | BPAFLP | — |
| Intermediate layer | 635 | 10 | DBT3P-II:MoO$_3$ | 1:0.5 |
| Electron-injection layer | 634(2) | 2 | CuPc | — |
|  | 634(1) | 0.1 | Li$_2$O | — |
| Electron-transport layer | 633(2) | 15 | NBPhen | — |
|  | 633(1) | 10 | cgDBCzPA | — |
| Light-emitting layer | 644 | 25 | cgDBCzPA:1,6BnfAPrn-03 | 1:0.03 |
| Hole-transport layer | 632 | 10 | PCPPn | — |
| Hole-injection layer | 631 | 30 | PCPPn:MoO$_3$ | 1:0.5 |
| Electrode | 642(2) | 95 | ITSO | — |
|  | 642(1) | 200 | APC | — |

TABLE 3

|  | Layer | Reference numeral | Film thickness (nm) | Material | Weight ratio |
|---|---|---|---|---|---|
| Comparative light-emitting element 4 | Electrode | 641(2) | 70 | ITSO | — |
|  |  | 641(1) | 25 | Ag:Mg | 1:0.1 |
|  | Electron-injection layer | 639 | 1 | LiF | — |
|  | Electron-transport layer | 638(2) | 20 | NBPhen | — |
|  |  | 638(1) | 35 | 2mDBTBPDBq-II | — |
|  | Light-emitting layer | 646(2) | 20 | 2mDBTBPDBq-II:PCBBiF:Ir(tBuppm)$_3$ | 0.7:0.3:0.06 |
|  |  | 646(1) | 15 | 2mDBTBPDBq-II:PCBBiF:Ir(dmdppr-P)$_2$(dibm) | 0.6:0.4:0.04 |
|  | Hole-transport layer | 637 | 15 | BPAFLP | — |
|  | Intermediate layer | 635 | 10 | DBT3P-II:MoO$_3$ | 1:0.5 |
|  | Electron-injection layer | 634(2) | 2 | CuPc | — |
|  |  | 634(1) | 0.1 | Li$_2$O | — |
|  | Electron-transport layer | 633(2) | 15 | NBPhen | — |
|  |  | 633(1) | 10 | cgDBCzPA | — |
|  | Light-emitting layer | 644 | 25 | cgDBCzPA:1,6BnfAPrn-03 | 1:0.03 |
|  | Hole-transport layer | 632 | 10 | PCPPn | — |
|  | Hole-injection layer | 631 | 15 | PCPPn:MoO$_3$ | 1:0.5 |
|  | Electrode | 642(2) | 95 | ITSO | — |
|  |  | 642(1) | 200 | APC | — |
| Comparative light-emitting element 5 | Electrode | 641(2) | 70 | ITSO | — |
|  |  | 641(1) | 25 | Ag:Mg | 1:0.1 |
|  | Electron-injection layer | 639 | 1 | LiF | — |
|  | Electron-transport layer | 638(2) | 15 | NBPhen | — |
|  |  | 638(1) | 35 | 2mDBTBPDBq-II | — |
|  | Light-emitting layer | 646(2) | 20 | 2mDBTBPDBq-II:PCBBiF:Ir(tBuppm)$_3$ | 0.7:0.3:0.06 |
|  |  | 646(1) | 15 | 2mDBTBPDBq-II:PCBBiF:Ir(dmdppr-P)$_2$(dibm) | 0.6:0.4:0.04 |
|  | Hole-transport layer | 637 | 15 | BPAFLP | — |
|  | Intermediate layer | 635 | 10 | DBT3P-II:MoO$_3$ | 1:0.5 |

TABLE 3-continued

| Layer | Reference numeral | Film thickness (nm) | Material | Weight ratio |
|---|---|---|---|---|
| Electron-injection layer | 634(2) | 2 | CuPc | — |
| | 634(1) | 0.1 | $Li_2O$ | — |
| Electron-transport layer | 633(2) | 15 | NBPhen | — |
| | 633(1) | 10 | cgDBCzPA | — |
| Light-emitting layer | 644 | 25 | cgDBCzPA:1,6BnfAPrn-03 | 1:0.03 |
| Hole-transport layer | 632 | 10 | PCPPn | — |
| Hole-injection layer | 631 | 12.5 | $PCPPn:MoO_3$ | 1:0.5 |
| Electrode | 642(2) | 45 | ITSO | — |
| | 642(1) | 200 | APC | — |

TABLE 4

| | Layer | Reference numeral | Film thickness (nm) | Material | Weight ratio |
|---|---|---|---|---|---|
| Comparative light-emitting element 6 | Electrode | 641(2) | 70 | ITSO | — |
| | | 641(1) | 25 | Ag:Mg | 1:0.1 |
| | Electron-injection layer | 639 | 1 | LiF | — |
| | Electron-transport layer | 638(2) | 15 | NBPhen | — |
| | | 638(1) | 25 | 2mDBTBPDBq-II | — |
| | Light-emitting layer | 646(2) | 20 | 2mDBTBPDBq-II:Ir(dmdppr-P)$_2$(dibm) | 1:0.04 |
| | | 646(1) | 20 | 2mDBTBPDBq-II:PCBBiF:Ir(tBuppm)$_3$ | 0.8:0.2:0.06 |
| | Hole-transport layer | 637 | 15 | BPAFLP | — |
| | Intermediate layer | 635 | 10 | $DBT3P\text{-}II:MoO_3$ | 1:0.5 |
| | Electron-injection layer | 634(2) | 2 | CuPc | — |
| | | 634(1) | 0.1 | $Li_2O$ | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6BnfAPrn-03 | 1:0.03 |
| | Hole-transport layer | 632 | 10 | PCPPn | — |
| | Hole-injection layer | 631 | 12.5 | $PCPPn:MoO_3$ | 1:0.5 |
| | Electrode | 642(3) | 10 | ITSO | — |
| | | 642(2) | 200 | APC | — |

<Fabrication of Light-Emitting Elements>
<<Fabrication of Light-Emitting Element 1>>

An electrode 642 was formed such that an alloy of silver, palladium, and copper (also referred to as Ag—Pd—Cu or APC) and an ITSO film were deposited over a substrate 650 in this order to a thickness of 200 nm and a thickness of 95 nm, respectively. The ITSO film is a conductive film having a function of transmitting light, the APC film is a conductive film having functions of reflecting light and transmitting light. The electrode area of the electrode 642 was set to 4 mm$^2$ (2 mm×2 mm).

As a hole-injection layer 631, 3-[4-(9-phenanthryl)-phenyl]-9-phenyl-9H-carbazole (abbreviation: PCPPn) and molybdenum oxide ($MoO_3$) were deposited over the electrode 642 by co-evaporation in a weight ratio of PCPPn: $MoO_3$=1:0.5 to a thickness of 22.5 nm.

As a hole-transport layer 632, PCPPn was deposited over the hole-injection layer 631 by evaporation to a thickness of 10 nm.

Next, as a light-emitting layer 644, 7-[4-(10-phenyl-9-anthryl)phenyl]-7H-dibenzo[c,g]carbazole (abbreviation: cgDBCzPA) and N,N'-(pyrene-1,6-diyl)bis[(6,N-diphenyl-benzo[b]naphtho[1,2-d]furan)-8-amine] (abbreviation: 1,6BnfAPrn-03) were deposited over the hole-transport layer 632 by co-evaporation in a weight ratio of cgDBCzPA: 1,6BnfAPrn-03=1:0.03 to a thickness of 25 nm. Here, 1,6BnfAPrn-03 is a guest material and emits blue right.

Next, as an electron-transport layer 633, cgDBCzPA and 2,9-bis(naphthalen-2-yl)-4,7-diphenyl-1,10-phenanthroline (abbreviation: NBPhen) were sequentially deposited over the light-emitting layer 644 by evaporation to thicknesses of 10 nm and 15 nm, respectively.

As an electron-injection layer 634, lithium oxide (abbreviation: $Li_2O$) and copper phthalocyanine (abbreviation: CuPc) were sequentially deposited over the electron-transport layer 633 by evaporation to thicknesses of 0.1 nm and 2 nm, respectively.

As a charge-generation layer 635 serving as a hole-injection layer, 4,4',4"-(benzene-1,3,5-triyl)tri(dibenzothio-phene) (abbreviation: DBT3P-II) and molybdenum oxide ($MoO_3$) were deposited by co-evaporation in a weight ratio of DBT3P-II: $MoO_3$=1:0.5 to a thickness of 10 nm.

Then, as a hole-transport layer 637, 4-phenyl-4'-(9-phenylfluoren-9-yl)triphenylamine (abbreviation: BPAFLP) was deposited over the charge-generation layer 635 by evaporation to a thickness of 15 nm.

Next, a light-emitting layer 646 was formed in the following manner. First, 2-[3'-(dibenzothiophen-4-yl)biphenyl-3-yl]dibenzo[f,h]quinoxaline (abbreviation: 2mDBTBP-DBq-II), N-(1,1'-biphenyl-4-yl)-N-[4-(9-phenyl-9H-carbazol-3-yl)phenyl]-9,9-dimethyl-9H-fluoren-2-amine (abbreviation: PCBBiF), and bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: Ir(dmdppr-P)$_2$(dibm)) were deposited by co-evaporation in a weight ratio of 2mDBTBPDBq-II:PCBBiF:Ir(dmdppr-P)$_2$(dibm) 0.6:0.4:0.06 to a thickness of 10 nm. Then, 2mDBTBPDBq-II, PCBBiF, and tris[2-(6-tert-butyl-4-pyrimidinyl-κN$^3$)phenyl-κC]iridium(III) (abbreviation: Ir(tBuppm)$_3$) were deposited by co-evaporation in a weight ratio of 2mDBTBPDBq-II:PCBBiF:Ir(tBuppm)$_3$=0.8:0.2:0.06 to a thickness of 30 nm. Then, 2mDBTBPDBq-II, PCBBiF, and Ir(tBuppm)$_2$(acac) were deposited by co-evaporation in a weight ratio of 2mDBTBPDBq-II:PCBBiF:Ir(tBuppm)$_2$(acac)=0.6:0.4:0.06 to a thickness of 5 nm. Here, Ir(dmdppr-P)$_2$(dibm) and Ir(tBuppm)$_3$ were light-emitting (guest) materials and emit red light and green light, respectively.

Next, as an electron-transport layer 638, 2mDBTBPDBq-II and NBPhen were sequentially deposited over the light-emitting layer 646 by evaporation to thicknesses of 25 nm and 20 nm, respectively. As an electron-injection layer 639, lithium fluoride (LiF) was deposited over the electron-transport layer 638 by evaporation to a thickness of 1 nm.

Then, as an electrode 641, silver (Ag) and magnesium (Mg) were deposited over the electron-injection layer 639 by co-evaporation in a weight ratio of Ag:Mg=1:0.1 to a thickness of 25 nm. In addition, ITSO was formed to a thickness of 70 nm.

Next, in a glove box containing a nitrogen atmosphere, a light-emitting element 1 was sealed by fixing a substrate 652 to the substrate 650 over which the organic material was deposited using a sealant for an organic EL device. Specifically, after the sealant was applied to surround the organic materials over the substrate 650 and the substrate 652 was bonded to the substrate 650, the sealant was irradiated with ultraviolet light having a wavelength of 365 nm at 6 J/cm$^2$ and heat treatment was performed at 80° C. for 1 hour. Through the process, the light-emitting element 1 was obtained.

As an optical element 648 with which the light-emitting element 1 overlaps, a red color filter (CF red) was formed to a thickness of 2.6 μm over a substrate 654.

<<Fabrication of Light-Emitting Elements 2 and 3>>

A light-emitting element 2 was fabricated through the same steps as those for the light-emitting element 1 described above except for the steps of forming the electrode 642, the hole-injection layer 631, and the optical element 648. A light-emitting element 3 was fabricated through the same steps as those for the light-emitting element 1 described above except for the steps of forming the hole-injection layer 631 and the optical element 648.

The electrode 642 of the light-emitting element 2 was formed such that an APC film and an ITSO film were deposited over the substrate 650 in this order to thicknesses of 200 nm and 45 nm, respectively.

The hole-injection layer 631 of the light-emitting element 2 was deposited by co-evaporation of PCPPn and MoO$_3$ in a weight ratio of PCPPn:MoO$_3$=1:0.5 to a thickness of 17.5 nm.

As the optical element 648 with which the light-emitting element 2 overlaps, a green color filter (CF Green) was formed to a thickness of 1.0 μm over a substrate 654.

The hole-injection layer 631 of the light-emitting element 3 was deposited by co-evaporation of PCPPn and MoO$_3$ in a weight ratio of PCPPn:MoO$_3$=1:0.5 to a thickness of 30 nm.

As the optical element 648 with which the light-emitting element 3 overlaps, a blue color filter (CF Blue) was formed to a thickness of 0.8 μm over a substrate 654.

<<Fabrication of Comparative Light-Emitting Element 4>>

A comparative light-emitting element 4 was fabricated through the same steps as those for the light-emitting element 1 described above except for the steps of faulting the hole-injection layer 631, the light-emitting layer 646, and the electron-transport layer 638.

The hole-injection layer 631 of the comparative light-emitting element 4 was deposited by co-evaporation of PCPPn and MoO$_3$ in a weight ratio of PCPPn:MoO$_3$=1:0.5 to a thickness of 15 nm.

The light-emitting layer 646 of the comparative light-emitting element 4 was formed in the following manner. First, 2mDBTBPDBq-II, PCBBiF, and Ir(dmdppr-P)$_2$(dibm) were deposited by co-evaporation in a weight ratio of 2mDBTBPDBq-II:PCBBiF:Ir(dmdppr-P)$_2$(dibm)=0.6:0.4:0.04 to a thickness of 15 nm. Then, 2mDBTBPDBq-II, PCBBiF, and Ir(tBuppm)$_3$ were deposited by co-evaporation in a weight ratio of 2mDBTBPDBq-II:PCBBiF:Ir(tBuppm)$_3$=0.7:0.3:0.06 to a thickness of 20 nm.

Next, as the electron-transport layer 638, 2mDBTBP-DBq-II and NBPhen were sequentially deposited over the light-emitting layer 646 by evaporation to thicknesses of 35 nm and 20 nm, respectively.

As the optical element 648 with which the comparative light-emitting element 4 overlaps, a red color filter (CF red) was formed to a thickness of 2.6 μm over the substrate 654.

<<Fabrication of Comparative Light-Emitting Element 5>>

A comparative light-emitting element 5 was fabricated through the same steps as those for the comparative light-emitting element 4 described above except for the steps of forming the electrode 642, the hole-injection layer 631, and the optical element 648.

The electrode 642 of the comparative light-emitting element 5 was formed such that an APC film and an ITSO film were deposited over the substrate 650 in this order to thicknesses of 200 nm and 45 nm, respectively.

As the hole-injection layer 631 of the comparative light-emitting element 5 was deposited by co-evaporation of PCPPn and MoO$_3$ in a weight ratio of PCPPn:MoO$_3$=1:0.5 to a thickness of 12.5 nm.

As the optical element 648 with which the comparative light-emitting element 5 overlaps, a green color filter (CF Green) was formed to a thickness of 1.0 μm over the substrate 654.

<<Fabrication of Comparative Light-Emitting Element 6>>

A comparative light-emitting element 6 was fabricated through the same steps as those for the light-emitting element 1 described above except for the steps of forming the electrode 642, the hole-injection layer 631, the light-emitting layer 646, the electron-transport layer 638, and the optical element 648.

The electrode 642 of the comparative light-emitting element 6 was formed such that an APC film and an ITSO film were deposited over the substrate 650 in this order to thicknesses of 200 nm and 10 nm, respectively.

The hole-injection layer 631 of the comparative light-emitting element 6 was deposited by co-evaporation of PCPPn and $MoO_3$ in a weight ratio of PCPPn:$MoO_3$=1:0.5 to a thickness of 12.5 nm.

The light-emitting layer 646 of the comparative light-emitting element 6 was formed in the following manner. First, 2mDBTBPDBq-II, PCBBiF, and Ir(tBuppm)$_3$ were deposited by co-evaporation in a weight ratio of 2mDBT-BPDBq-II:PCBBiF:Ir(tBuppm)$_3$=0.8:0.2:0.06 to a thickness of 20 nm. Then, 2mDBTBPDBq-II and Ir(dmdppr-P)$_2$(dibm) were deposited by co-evaporation in a weight ratio of 2mDBTBPDBq-II:Ir(dmdppr-P)$_2$(dibm)=1:0.04 to a thickness of 20 nm.

Next, as the electron-transport layer 638, 2mDBTBP-DBq-II and NBPhen were sequentially deposited over the light-emitting layer 646 by evaporation to thicknesses of 25 nm and 15 nm, respectively.

As the optical element 648 with which the comparative light-emitting element 6 overlaps, a blue color filter (CF Blue) was formed to a thickness of 0.8 μm over the substrate 654.

<Characteristics of Light-Emitting Elements 1 to 3>

Figure 19:
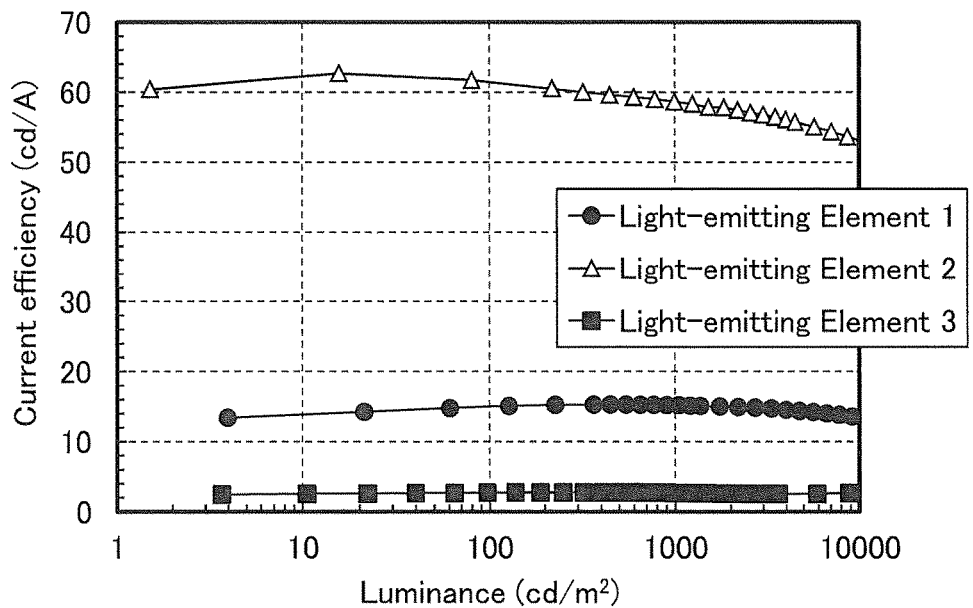
FIG. 19 is a graph showing current efficiency-luminance characteristics of light-emitting elements in Example.
Figure 20:
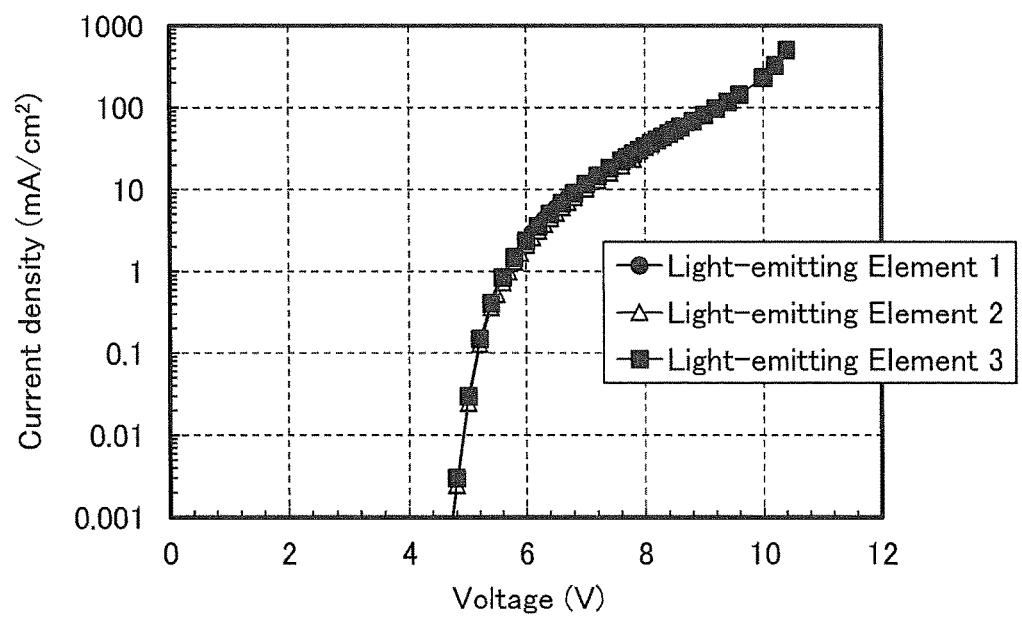
FIG. 20 is a graph showing current density-voltage characteristics of light-emitting elements in Example.
Figure 21:
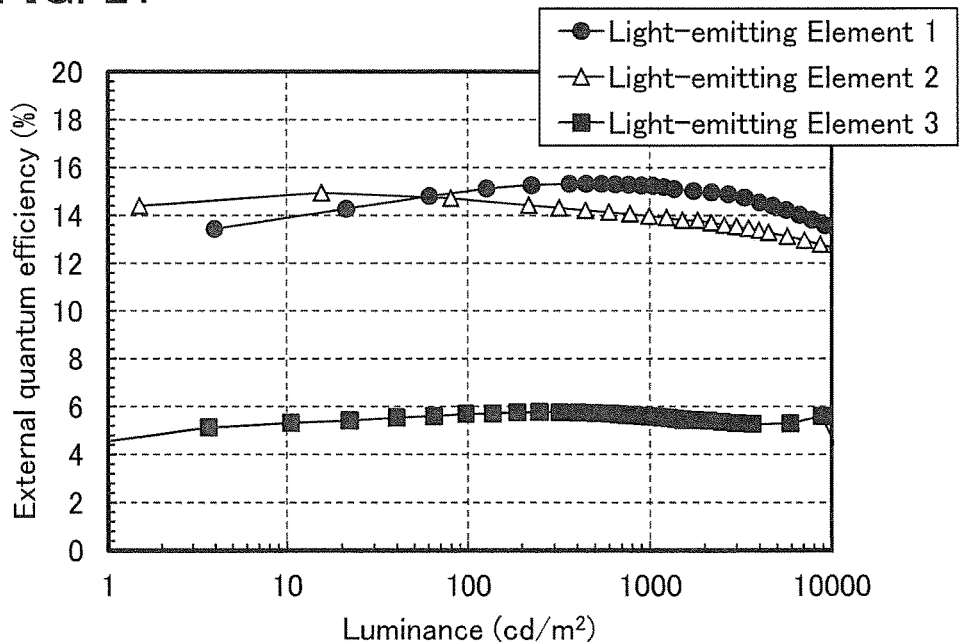
FIG. 21 is a graph showing external quantum efficiency-luminance characteristics of light-emitting elements in Example.

FIG. 19 shows current efficiency-luminance characteristics of the fabricated light-emitting elements 1 to 3. FIG. 20 shows current density-voltage characteristics thereof. FIG. 21 shows external quantum efficiency-luminance characteristics thereof. The measurements of the light-emitting elements were performed at room temperature (in an atmosphere kept at 23° C.).

Figure 22:
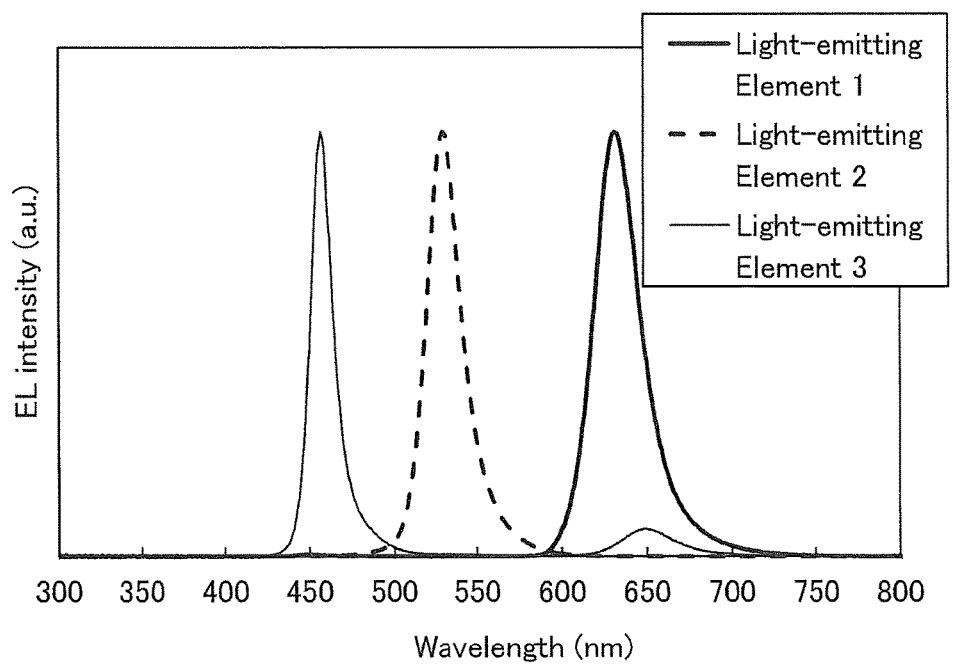
FIG. 22 is a graph showing emission spectra of light-emitting elements in Example.

FIG. 22 shows emission spectra (EL spectra) of the light-emitting elements 1 to 3 at around 1000 cd/m². Note that in FIG. 22, the vertical axis represents the emission intensity (EL intensity) normalized by the maximum values of the emission spectra.

Table 5 shows element characteristics of the light-emitting elements 1 to 3 at around 1000 cd/m².

TABLE 5

|  | Voltage (V) | Current density (mA/cm²) | CIE chromaticity (x, y) | Luminance (cd/m²) | Current efficiency (cd/A) |
| --- | --- | --- | --- | --- | --- |
| Light-emitting element 1 | 6.6 | 6.86 | (0.700, 0.296) | 1045 | 15 |
| Light-emitting element 2 | 5.9 | 1.69 | (0.195, 0.775) | 995 | 58 |
| Light-emitting element 3 | 8.1 | 36.6 | (0.161, 0.038) | 987 | 2.7 |

As shown in FIG. 22, the light-emitting element 1 has a peak wavelength of the emission spectrum of 631 nm and emits red light, the light-emitting element 2 has a peak wavelength of 529 nm and emits green light, and the light-emitting element 3 has a peak wavelength of 457 nm and emits blue light. In addition, in the light-emitting elements 1, 2, and 3, the full widths at half maximum of the electroluminescence spectra are 31 nm, 25 nm, and 15 nm, respectively. Each light-emitting element enabled light to be emitted with high color purity.

The light-emitting layer 646 in each of the light-emitting elements 1 to 3 includes three layers of the light-emitting layers 646(1) to 646(3), and the emission wavelength of the light-emitting layer 646(2) is longer than those of the light-emitting layers 646(1) and 646(3). Furthermore, the light-emitting elements 1 to 3 each have a microcavity structure. Thus, a light-emitting element with high color purity and high emission efficiency can be obtained. Thus, each structure of the light-emitting elements can be suitably used for the light-emitting device.

<Characteristics of Comparative Light-Emitting Elements 4 to 6>

Figure 23:
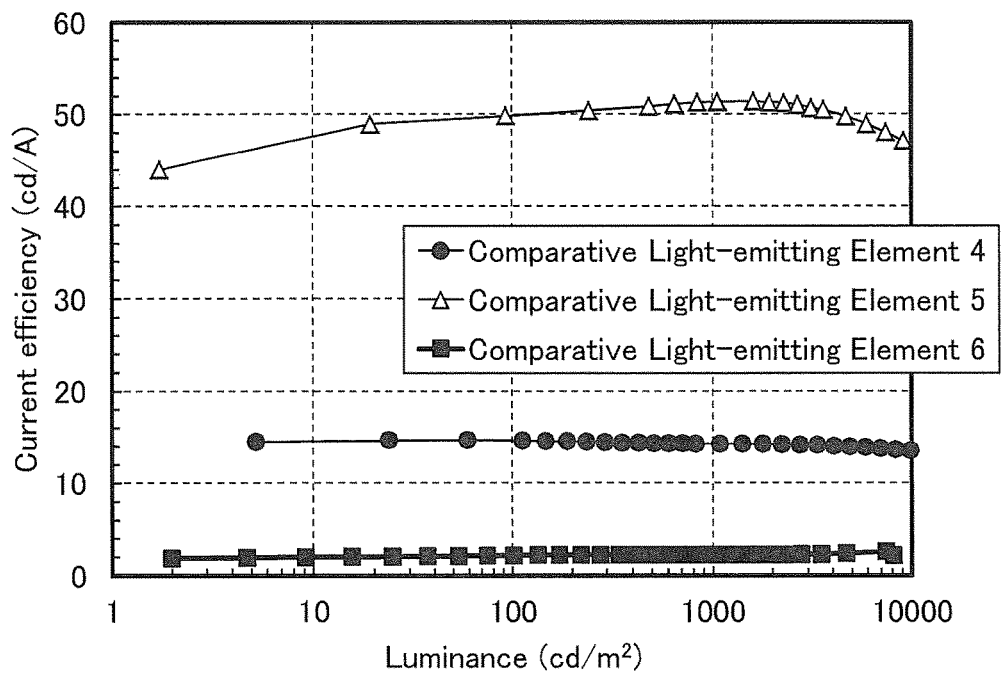
FIG. 23 is a graph showing current efficiency-luminance characteristics of comparative light-emitting elements in Example.
Figure 24:
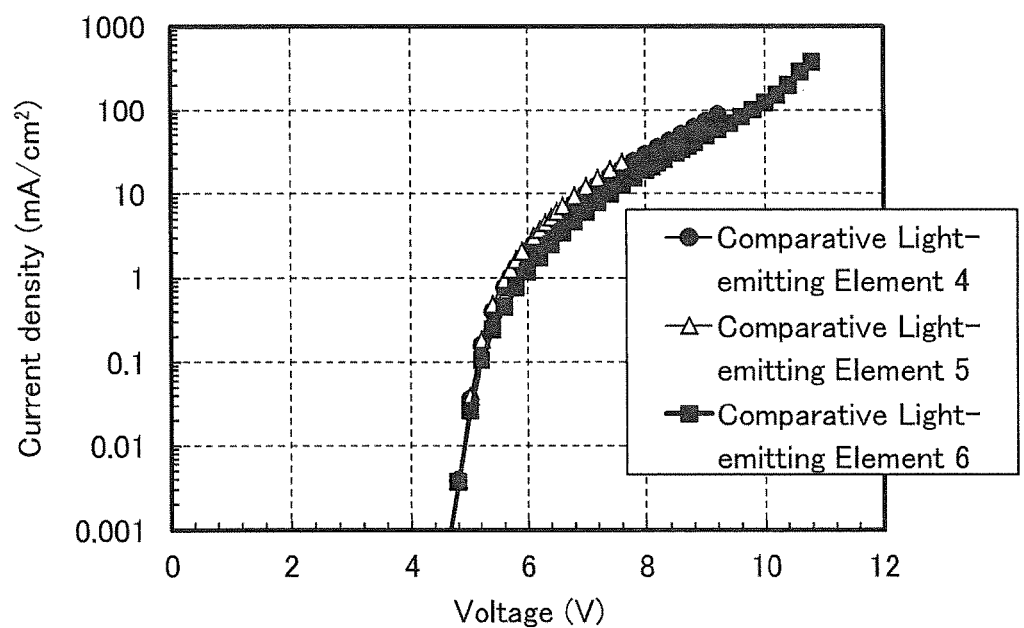
FIG. 24 is a graph showing current density-voltage characteristics of comparative light-emitting elements in Example.
Figure 25:
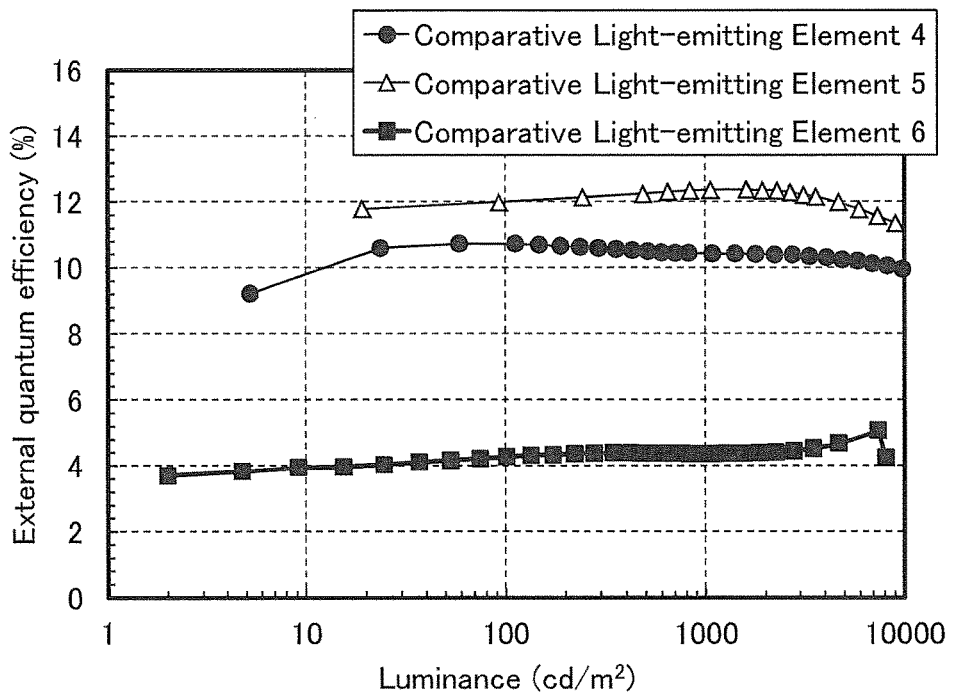
FIG. 25 is a graph showing external quantum efficiency-luminance characteristics of comparative light-emitting elements in Example.

FIG. 23 shows current efficiency-luminance characteristics of the fabricated comparative light-emitting elements 4 to 6. FIG. 24 shows current density-voltage characteristics thereof. FIG. 25 shows external quantum efficiency-luminance characteristics thereof. The measurements of the light-emitting elements were performed at room temperature (in an atmosphere kept at 23° C.).

Figure 26:
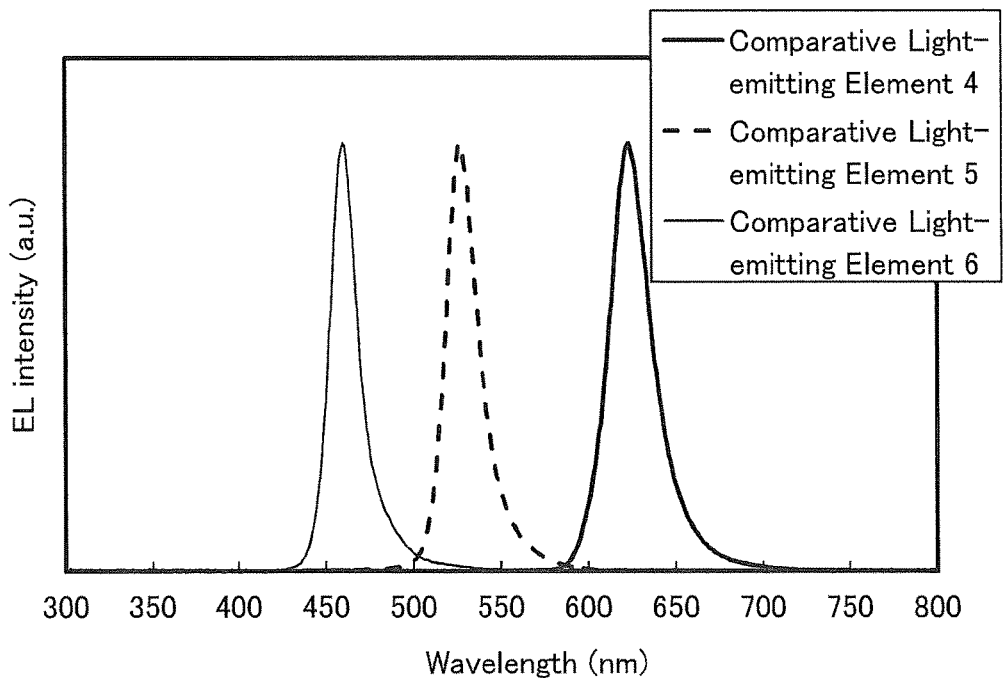
FIG. 26 is a graph showing emission spectra of comparative light-emitting elements in Example.

FIG. 26 shows emission spectra (EL spectra) of the comparative light-emitting elements 4 to 6 at around 1000 cd/m². Note that in FIG. 26, the vertical axis represents the emission intensity (EL intensity) normalized by the maximum values of the emission spectra.

Table 6 shows element characteristics of the comparative light-emitting elements 4 to 6 at around 1000 cd/m².

TABLE 6

|  | Voltage (V) | Current density (mA/cm²) | CIE chromaticity (x, y) | Luminance (cd/m²) | Current efficiency (cd/A) |
| --- | --- | --- | --- | --- | --- |
| Comparative light-emitting element 4 | 6.5 | 4.96 | (0.686, 0.313) | 709.7 | 14 |
| Comparative light-emitting element 5 | 6.1 | 3.12 | (0.178, 0.790) | 1604 | 51 |
| Comparative light-emitting element 6 | 8.9 | 44.9 | (0.142, 0.044) | 1001 | 2.2 |

As shown in FIG. 26, the comparative light-emitting element 4 has a peak wavelength of the emission spectrum of 623 nm and emits red light, the comparative light-emitting element 5 has a peak wavelength of 527 nm and emits green light, and the comparative light-emitting element 6 has a peak wavelength of 460 nm and emits blue light. In addition, in the comparative light-emitting elements 4, 5, and 6, the full widths at half maximum of the electroluminescence spectra are 27 nm, 21 nm, and 18 nm, respectively. Each light-emitting element enabled light to be emitted with high color purity.

<Estimation of Power Consumption of Light-Emitting Device>

Next, the power consumption of the light-emitting device including the above light-emitting element and having R, G, and B subpixels was estimated.

A light-emitting device 1 includes the light-emitting elements 1 to 3, and a comparative light-emitting device 2 includes the comparative light-emitting elements 4 to 6. The structures of the light-emitting devices are shown in Table 7.

TABLE 7

|  | Subpixel 1(R) | Subpixel 2(G) | Subpixel 3(B) |
| --- | --- | --- | --- |
| Light-emitting device 1 | Light-emitting element 1 | Light-emitting element 2 | Light-emitting element 3 |
| Comparative light-emitting device 2 | Comparative light-emitting element 4 | Comparative light-emitting element 5 | Comparative light-emitting element 6 |

In this example, the power consumption of the light-emitting devices was estimated on the assumption that the display region of the light-emitting device had an aspect ratio of 16:9, a diagonal of 4.3 inches, and an area of 50.97 cm², and the aperture ratio was 35%. Table 8 shows characteristics of the light-emitting elements and the light-emitting devices with the above specifications in the case where the entire surface of the display region displayed white (chromaticity coordinates (x,y)=(0.313,0.329)) with a color temperature of 6500 K at 300 cd/m².

length of the light-emitting layer 646(2) is shorter than those of the light-emitting layers 646(1) and 646(3), whereby in each color (red and green) of the microcavity structure, more efficient optical design is possible.

<Results of Reliability Test>

Constant current driving tests were performed on the light-emitting elements 1 to 3 included in the light-emitting device 1 and the comparative light-emitting elements 4 and

TABLE 8

|  |  | Voltage (V) | Current density (mA/cm²) | CIE chromaticity (x, y) | Luminance (cd/m²) | Current efficiency (cd/A) | Power efficiency (mW) |
|---|---|---|---|---|---|---|---|
| Light-emitting device 1 | Light-emitting element 1 | 6.3 | 4.0 | (0.699, 0.298) | 612 | 15.3 | 149 |
|  | Light-emitting element 2 | 6.2 | 3.2 | (0.194, 0.776) | 1823 | 57.8 | 116 |
|  | Light-emitting element 3 | 6.4 | 5.0 | (0.162, 0.040) | 137 | 2.8 | 189 |
| Comparative light-emitting device 2 | Comparative light-emitting element 4 | 6.5 | 5.1 | (0.685, 0.313) | 727 | 14.3 | 197 |
|  | Comparative light-emitting element 5 | 6.1 | 3.3 | (0.178, 0.790) | 1692 | 51.4 | 120 |
|  | Comparative light-emitting element 6 | 7.1 | 6.9 | (0.142, 0.046) | 153 | 2.2 | 292 |

As shown in Table 8, white color (chromaticity coordinates (x,y)=(0.313,0.329)) with a color temperature of 6500 K was able to be displayed at 300 cd/m² on the entire display region in the light-emitting device 1 having the above specifications when luminance of the light-emitting element 1 was 612 cd/m², luminance of the light-emitting element 2 was 1923 cd/m², and luminance of the light-emitting element 3 was 137 cd/m². At this time, power consumption of the light-emitting device 1 was able to be estimated to be 454 mW.

Furthermore, as shown in Table 8, white color (chromaticity coordinates (x,y)=(0.313,0.329)) with a color temperature of 6500 K was able to be displayed at 300 cd/m² on the entire display region in the comparative light-emitting device 2 having the above specifications when luminance of the comparative light-emitting element 4 was 727 cd/m², luminance of the comparative light-emitting element 5 was 1692 cd/m², and luminance of the comparative light-emitting element 6 was 153 cd/m². At this time, power consumption of the comparative light-emitting device 2 was able to be estimated to be 609 mW.

It is found that the area of a triangle formed by connecting the CIE 1931 chromaticity coordinates of RGB obtained from the comparative light-emitting device 2 is 89% of the area of a triangle formed by connecting the CIE 1931 chromaticity coordinates of RGB of the BT.2020 standard, and the comparative light-emitting device 2 has high color reproducibility. Similarly, it is found that the area of a triangle formed by connecting the CIE 1931 chromaticity coordinates of RGB obtained from the light-emitting device 1 is 96% of the area of a triangle formed by connecting the CIE 1931 chromaticity coordinates of RGB of the BT.2020 standard, and the light-emitting device 1 has higher color reproducibility than the comparative light-emitting device 2.

As described above, the light-emitting device 1 has higher color reproducibility and lower power consumption than the comparative light-emitting device 2. This is because the light-emitting layer 646 includes three layers of the light-emitting layers 646(1) to 646(3) and the emission wave-

Figure 27:
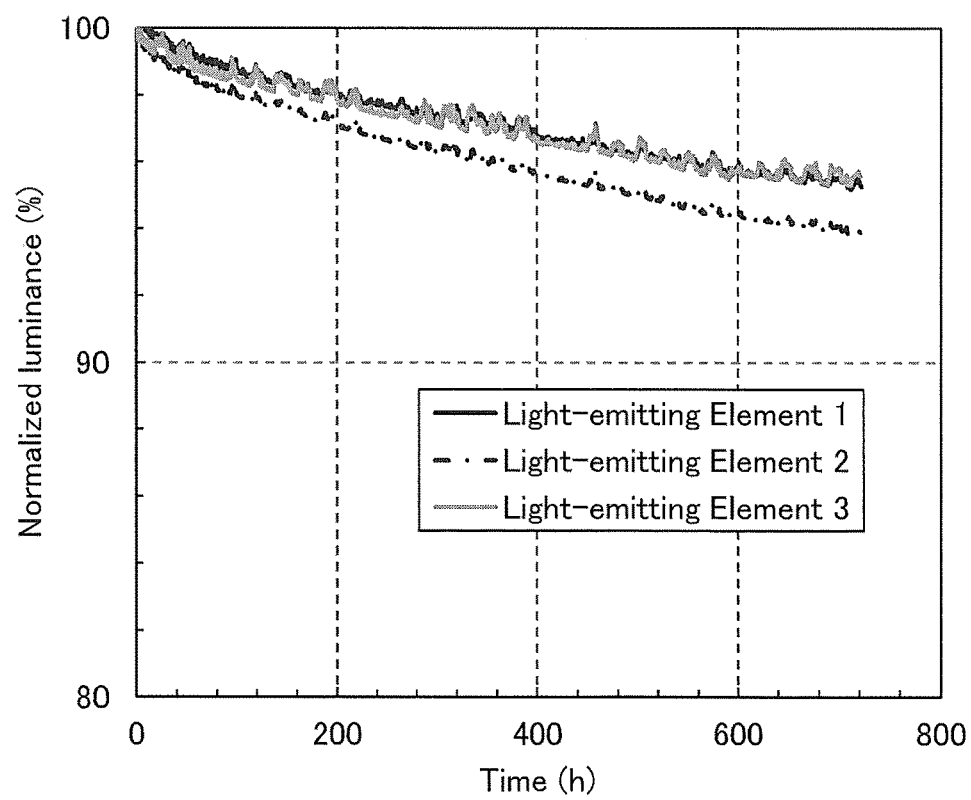
FIG. 27 is a graph showing reliability test results of light-emitting elements in Example.
Figure 28:
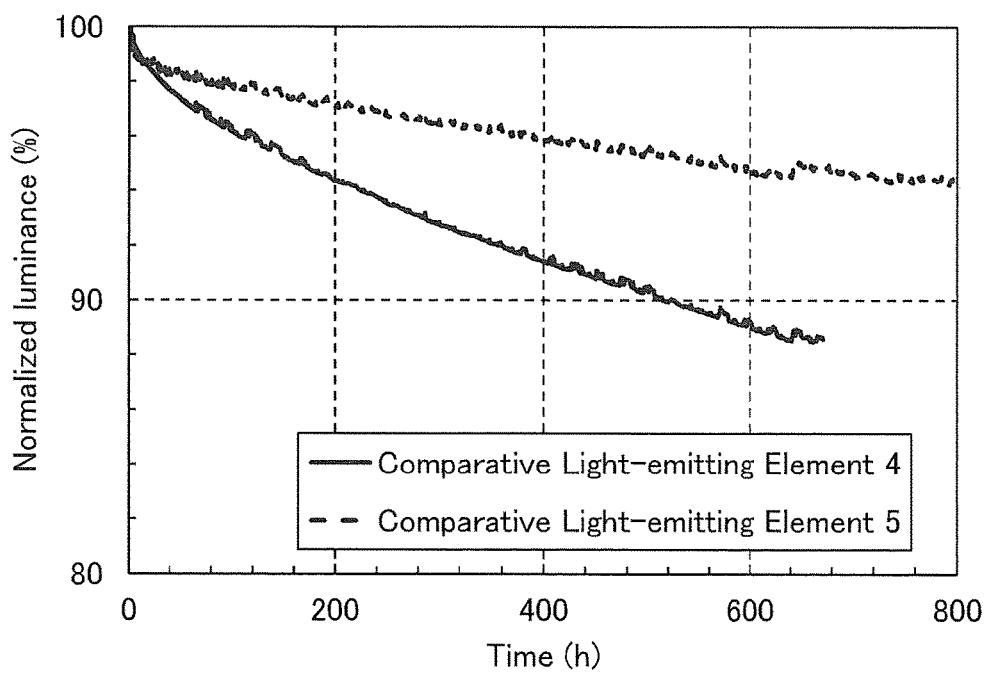
FIG. 28 is a graph showing reliability test results of comparative light-emitting elements in Example.

5 included in the comparative light-emitting device 2. The constant current densities of the elements were values in Table 8. That is, in each of the light-emitting devices, the current density of each light-emitting element in the case where the entire surface of the display region displayed white (chromaticity coordinates (x,y)=(0.313,0.329)) with a color temperature of 6500 K at 300 cd/m² was used. Results thereof are shown in FIG. 27 and FIG. 28. From FIG. 27 and FIG. 28, it is found that the light-emitting element 1 has a longer lifetime than the comparative light-emitting element 4. In addition, it is found that luminance degradation curves of the light-emitting elements 1 and 2 are similar to each other, whereas luminance degradation curves of the comparative light-emitting elements 4 and 5 are different from each other and the speed of degradation of the comparative light-emitting element 4 was higher than that of the comparative light-emitting element 5. Furthermore, luminance degradation curves of the light-emitting elements 1 to 3 are approximately similar to each other. Thus, with the use of the light-emitting element of one embodiment of the present invention, a highly reliable light-emitting device which has less change in chromaticity during driving can be provided.

In this manner, the light-emitting element has a stacked-layer structure of the first light-emitting layer, the second light-emitting layer, and the third light-emitting layer, and light emitted from the first light-emitting layer and light emitted from the third light-emitting layer have the same color and each have a longer wavelength than light emitted from the second light-emitting layer, whereby a highly reliable light-emitting device with high color reproducibility and low power consumption can be provided.

Example 2

In this example, a 13.3-inch AMOLED display fabricated using the light-emitting element of one embodiment of the present invention is described. This 13.3-inch AMOLED display includes a light-emitting layer having the same structure as that of the light-emitting element 1 in Example 1.

For a driver circuit portion of the 13.3-inch AMOLED display, an FET using an oxide semiconductor was used. Furthermore, a backplane with small parasitic capacitance is advantageous to achieve a 120-Hz 12-bit display; thus, a top-gate self-aligned (TGSA) structure in which parasitic capacitance is small was employed.

Figure 29:
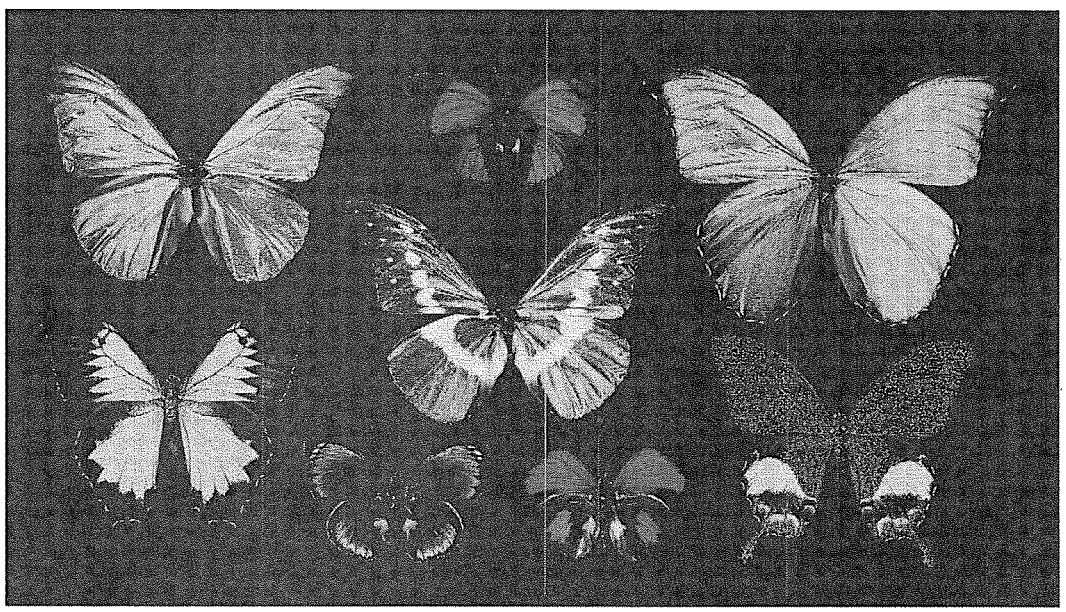
FIG. 29 shows an image displayed by an AMOLED display in Example.

FIG. 29 shows an image displayed by the fabricated 13.3-inch AMOLED display. In addition, Table 9 shows main specifications and characteristics of this display.

TABLE 9

| | |
|---|---|
| Screen diagonal | 13.3 inches |
| Driving method | Active matrix |
| Resolution | 7680 × RGB × 4320 (8K4K) |
| Pixel size | 12.75 μm × 38.25 μm |
| Pixel density | 664 ppi |
| Aperture ratio | 30.10% |
| Flame rate | 120 Hz |
| Gray scale | 12 bit |
| Pixel arrangement | RGB stripe |
| Source driver | COG |
| Emission type | Top emission |

Example 3

Figure 30:
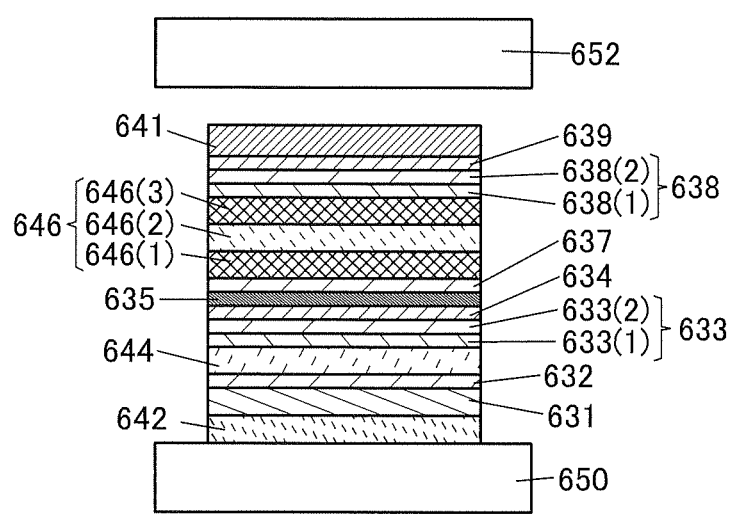
FIG. 30 is a schematic view of a light-emitting element in Example.

In this example, examples of fabricating light-emitting elements 7 and 8, each of which is a light-emitting element of another embodiment of the present invention are described. FIG. 30 is a schematic cross-sectional view of the light-emitting element fabricated in this example, and Table 10 shows details of the element structures. Chemical formulae and abbreviations of materials used in this example are shown below. Note that Example 1 can be referred to for structures and abbreviations of other compounds.

[Chemical formula 3]

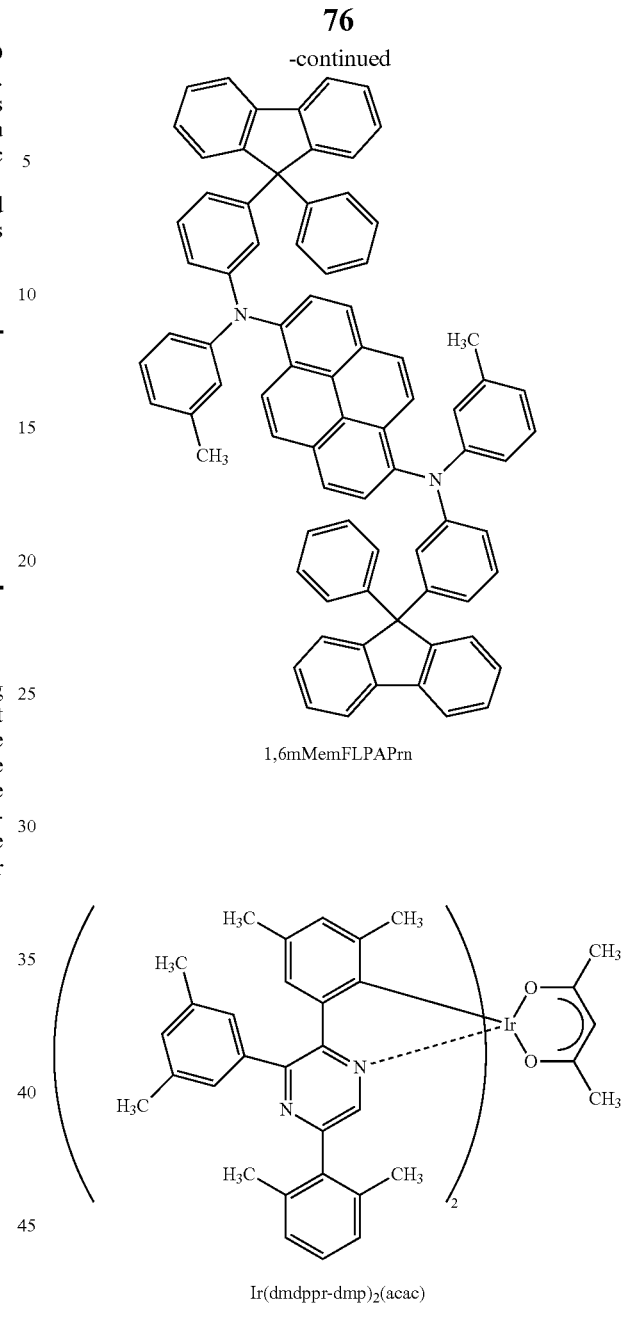

1,6mMemFLPAPrn

Ir(tBuppm)$_2$(acac)

Ir(dmdppr-dmp)$_2$(acac)

TABLE 10

| Layer | | Reference numeral | Film thickness (nm) | Material | Weight ratio |
|---|---|---|---|---|---|
| Light-emitting element 7 | Electrode | 641 | 120 | Al | — |
| | Electron-injection layer | 639 | 1 | LiF | — |
| | Electron-transport layer | 638(2) | 15 | NBphen | — |
| | | 638(1) | 25 | 2mDBTBPDBq-II | — |
| | Light-emitting layer | 646(3) | 10 | 2mDBTBPDBq-II:PCBBiF:Ir(tBuppm)$_3$ | 0.8:0.2:0.06 |
| | | 646(2) | 10 | 2mDBTBPDBq-II:PCBBiF:Ir(dmdppr-P)$_2$(dibm) | 0.8:0.2:0.04 |
| | | 646(1) | 20 | 2mDBTBPDBq-II:PCBBiF:Ir(tBuppm)$_3$ | 0.8:0.2:0.06 |

TABLE 10-continued

| | Layer | Reference numeral | Film thickness (nm) | Material | Weight ratio |
|---|---|---|---|---|---|
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6BnfAPrn-03 | 1:0.03 |
| | Hole-transport layer | 632 | 10 | PCPPn | — |
| | Hole-injection layer | 631 | 10 | PCPPn:MoO$_3$ | 1:0.5 |
| | Electrode | 642 | 70 | ITSO | — |
| Light-emitting element 8 | Electrode | 641 | 120 | Al | — |
| | Electron-injection layer | 639 | 1 | LiF | — |
| | Electron-transport layer | 638(2) | 15 | NBphen | — |
| | | 638(1) | 25 | 2mDBTBPDBq-II | — |
| | Light-emitting layer | 646(3) | 10 | 2mDBTBPDBq-II:PCBBiF:Ir(tBuppm)$_2$(acac) | 0.8:0.2:0.06 |
| | | 646(2) | 10 | 2mDBTBPDBq-II:PCBBiF:Ir(dmdppr-dmp)$_2$(acac) | 0.8:0.2:0.06 |
| | | 646(1) | 20 | 2mDBTBPDBq-II:PCBBiF:Ir(tBuppm)$_2$(acac) | 0.8:0.2:0.06 |
| | Hole-transport layer | 637 | 15 | BPAFLP | — |
| | Intermediate layer | 635 | 10 | DBT3P-II:MoO$_3$ | 1:0.5 |
| | Electron-injection layer | 634(2) | 2 | CuPc | — |
| | | 634(1) | 0.1 | Li$_2$O | — |
| | Electron-transport layer | 633(2) | 15 | NBPhen | — |
| | | 633(1) | 10 | cgDBCzPA | — |
| | Light-emitting layer | 644 | 25 | cgDBCzPA:1,6mMemFLPAPrn | 1:0.03 |
| | Hole-transport layer | 632 | 10 | PCPPn | — |
| | Hole-injection layer | 631 | 40 | PCPPn:MoO$_3$ | 1:0.5 |
| | Electrode | 642 | 70 | ITSO | — |

<Fabrication of Light-Emitting Elements>
<<Fabrication of Light-Emitting Element 7>>

The electrode 642 was formed such that an ITSO film was deposited over the substrate 650 to a thickness of 70 nm. The electrode area of the electrode 642 was set to 4 mm$^2$ (2 mm×2 mm).

As the hole-injection layer 631, PCPPn and molybdenum oxide (MoO$_3$) were deposited over the electrode 642 by co-evaporation in a weight ratio of PCPPn:MoO$_3$=1:0.5 to a thickness of 10 nm.

As the hole-transport layer 632, PCPPn was deposited over the hole-injection layer 631 by evaporation to a thickness of 10 nm.

Next, as the light-emitting layer 644, cgDBCzPA and 1,6BnfAPm-03 (emission peak wavelength in rarefied toluene solution: 450 nm) were deposited over the hole-transport layer 632 by co-evaporation in a weight ratio of cgDBCzPA:1,6BnfAPrn-03=1:0.03 to a thickness of 25 nm. Here, 1,6BnfAPrn-03 is a guest material and emits blue right.

Next, as the electron-transport layer 633, cgDBCzPA and NBPhen were sequentially deposited over the light-emitting layer 644 by evaporation to thicknesses of 10 nm and 15 nm, respectively.

As the electron-injection layer 634, lithium oxide (abbreviation: Li$_2$O) and copper phthalocyanine (abbreviation: CuPc) were sequentially deposited over the electron-transport layer 633 by evaporation to thicknesses of 0.1 nm and 2 nm, respectively.

As the charge-generation layer 635 serving as a hole-injection layer, DBT3P-II and molybdenum oxide (MoO$_3$) were deposited by co-evaporation in a weight ratio of DBT3P-II:MoO$_3$=1:0.5 to a thickness of 10 nm.

Then, as the hole-transport layer 637, BPAFLP was deposited over the charge-generation layer 635 by evaporation to a thickness of 15 nm.

Next, the light-emitting layer 646 was formed in the following manner. First, 2mDBTBPDBq-II, PCBBiF, and Ir(tBuppm)$_3$ (emission peak wavelength in 0.1 mM of dichloromethane solution: 540 nm) were deposited by co-evaporation in a weight ratio of 2mDBTBPDBq-II:PCBBiF:Ir(tBuppm)$_3$=0.8:0.2:0.06 to a thickness of 20 nm. Then, 2mDBTBPDBq-II, PCBBiF, and Ir(dmdppr-P)$_2$(dibm) (emission peak wavelength in 0.1 mM of dichloromethane solution: 640 nm) were deposited by co-evaporation in a weight ratio of 2mDBTBPDBq-II:PCBBiF:Ir(dmdppr-P)$_2$(dibm)=0.8:0.2:0.04 to a thickness of 10 nm. Then, 2mDBTBPDBq-II, PCBBiF, and Ir(tBuppm)$_3$ were deposited by co-evaporation in a weight ratio of 2mDBTBPDBq-II:PCBBiF:Ir(tBuppm)$_3$=0.8:0.2:0.06 to a thickness of 10 nm.

Next, as the electron-transport layer 638, 2mDBTBPDBq-II and NBPhen were sequentially deposited over the light-emitting layer 646 by evaporation to thicknesses of 25 nm and 15 nm, respectively. As the electron-injection layer 639, lithium fluoride (LiF) was deposited over the electron-transport layer 638 by evaporation to a thickness of 1 nm.

As the electrode 641, aluminum (Al) was deposited over the electron-injection layer 639 to a thickness of 120 nm.

Next, in a glove box containing a nitrogen atmosphere, a light-emitting element 7 was sealed by fixing a substrate 652 to the substrate 650 over which the organic material was deposited using a sealant for an organic EL device. Specifically, after the sealant was applied to surround the organic materials over the substrate 650 and the substrate 652 was bonded to the substrate 650, the sealant was irradiated with ultraviolet light having a wavelength of 365 nm at 6 $J/cm^2$ and heat treatment was performed at 80° C. for 1 hour. Through the process, the light-emitting element 7 was obtained.

<<Fabrication of Light-Emitting Element 8>>

A light-emitting element 8 was fabricated through the same steps as those for the light-emitting element 7 described above except for the steps of forming the hole-injection layer 631, the light-emitting layer 644, and the light-emitting layer 646.

As the hole-injection layer 631 of the light-emitting element 8, PCPPn and molybdenum oxide ($MoO_3$) were deposited over the electrode 642 by co-evaporation in a weight ratio of PCPPn:$MoO_3$=1:0.5 to a thickness of 40 nm.

As the light-emitting layer 644, cgDBCzPA and N,N'-bis (3-methylphenyl)-N,N'-bis[3-(9-phenyl-9H-fluoren-9-yl) phenyl]pyrene-1,6-diamine (abbreviation: 1,6mMemFLPA-Prn) (emission peak wavelength in rarefied toluene solution: 461 nm) were deposited over the hole-transport layer 632 by co-evaporation in a weight ratio of cgDBCzPA:1,6mMem-FLPAPrn=1:0.03 to a thickness of 25 nm.

The light-emitting layer 646 was formed in the following manner. First, 2mDBTBPDBq-II, PCBBiF, and Ir(tBuppm)$_2$(acac) (emission peak wavelength in 0.1 mM of dichloromethane solution: 546 nm) were deposited by co-evaporation in a weight ratio of 2mDBTBPDBq-II:PCBBiF:Ir (tBuppm)$_2$(acac)=0.8:0.2:0.06 to a thickness of 20 nm. Then, 2mDBTBPDBq-II, PCBBiF, and bis{4,6-dimethyl-2-[5-(2,6-dimethylphenyl)-3-(3,5-dimethylphenyl)-2-pyrazinyl-κN]phenyl-κC}(2,4-pentanedionato-κ$^2$O,O')iridium (III) (abbreviation: Ir(dmdppr-dmp)$_2$(acac)) (emission peak wavelength in 0.1 mM of dichloromethane solution: 610 nm) were deposited by co-evaporation in a weight ratio of 2mDBTBPDBq-II:PCBBiF:Ir(dmdppr-dmp)$_2$(acac)=0.8: 0.2:0.06 to a thickness of 10 nm. Then, 2mDBTBPDBq-II, PCBBiF, and Ir(tBuppm)$_2$(acac) were deposited by co-evaporation in a weight ratio of 2mDBTBPDBq-II:PCBBiF: Ir(tBuppm)$_2$(acac)=0.8:0.2:0.06 to a thickness of 10 nm.

<Characteristics of Light-Emitting Elements 7 and 8>

Figure 31:
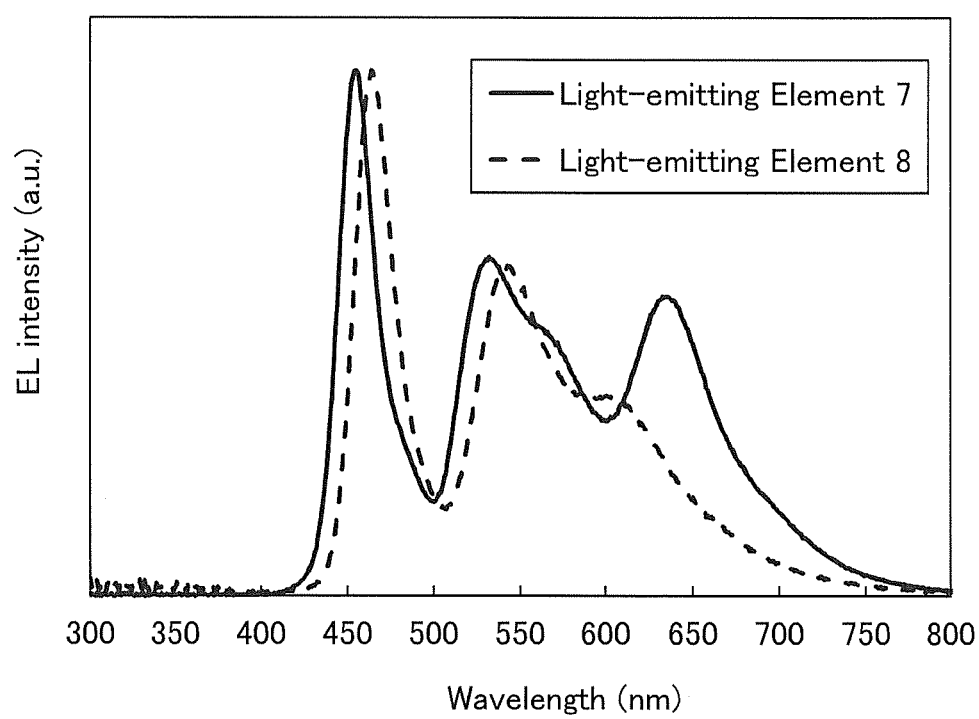
FIG. 31 is a graph showing emission spectra of light-emitting elements in Example.

FIG. 31 shows emission spectra (EL spectra) of the light-emitting elements 7 and 8. Note that in FIG. 31, the vertical axis represents the emission intensity (EL intensity) normalized by the maximum values of the emission spectra. The measurement was carried out at room temperature.

As shown in FIG. 31, the emission spectra of the light-emitting elements 7 and 8 each have emission peaks in regions of red, green, and blue, and the light-emitting elements 7 and 8 emit white light in which the three colors are mixed. When the positions of the peaks in emission spectra of the light-emitting elements 7 and 8 are compared with each other, the light-emitting element 7 has peaks at shorter wavelength sides in the blue and green regions and a peak at a longer wavelength side in the red region than the light-emitting element 8. The differences depend on the difference in peak wavelength of the light-emitting materials.

REFERENCE NUMERALS

50: adhesive layer, 51: adhesive layer, 52: adhesive layer, 100: EL layer, 101: electrode, 101*a*: conductive layer, 101*b*: conductive layer, 101*c*: conductive layer, 102: electrode, 103: electrode, 103*a*: conductive layer, 103*b*: conductive layer, 104: electrode, 104*a*: conductive layer, 104*b*: conductive layer, 106: light-emitting unit, 110: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: light-emitting layer, 120*a*: light-emitting layer, 120*b*: light-emitting layer, 120*c*: light-emitting layer, 121: host material, 121_1: organic compound, 121_2: organic compound, 122: light-emitting material, 123B: light-emitting layer, 123G: light-emitting layer, 123R: light-emitting layer, 140: light-emitting layer, 140*a*: light-emitting layer, 140*b*: light-emitting layer, 140*c*: light-emitting layer, 141*a*: host material, 141*a* 1: electron-transport material, 141*a*2: hole-transport material, 141*b*: host material, 141*b*_1: electron-transport material, 141*b*_2: hole-transport material, 141*c*: host material, 141*c*_1: electron-transport material, 141*c*_2: hole-transport material, 142: light-emitting material, 142*a*: light-emitting material, 142*b*: light-emitting material, 142*c*: light-emitting material, 145: partition wall, 146: light-emitting region, 150: light-emitting element, 170: light-emitting layer, 190: light-emitting layer, 200: substrate, 201: resin layer, 202: resin layer, 205: transistor, 206: transistor, 207: connection portion, 213: light-emitting layer, 220: substrate, 221B: region, 221G: region, 221R: region, 222B: region, 222G: region, 222R: region, 223: light-blocking layer, 224B: optical element, 224G: optical element, 224R: optical element, 250: light-emitting element, 260*a*: light-emitting element, 260*b*: light-emitting element, 262*a*: light-emitting element, 262*b*: light-emitting element, 300: light-emitting device, 311: electrode, 311*a*: conductive layer, 311*b*: electrode, 312: liquid crystal, 340: liquid crystal element, 351: substrate, 360: light-emitting element, 360*b*: light-emitting element, 360*g*: light-emitting element, 360*r*: light-emitting element, 360*w*: light-emitting element, 361: substrate, 362: display portion, 364: circuit portion, 365: wiring, 366: circuit portion, 367: wiring, 372: FPC, 373: IC, 374: FPC, 375: IC, 400: light-emitting device, 401: transistor, 402: transistor, 403: transistor, 405: capacitor, 406: connection portion, 407: wiring, 410: pixel, 411: insulating layer, 412: insulating layer, 413: insulating layer, 414: insulating layer, 415: insulating layer, 416: spacer, 417: adhesive layer, 419: connection layer, 421: electrode, 422: EL layer, 423: electrode, 424: optical adjustment layer, 425: coloring layer, 426: light-blocking layer, 451: opening, 476: insulating layer, 478: insulating layer, 501: transistor, 503: transistor, 505: capacitor, 506: connection portion, 511: insulating layer, 512: insulating layer, 513: insulating layer, 514: insulating layer, 517: adhesive layer, 519: connection layer, 529: liquid crystal element, 543: connector, 562: electrode, 563: liquid crystal, 564*a*: alignment film, 564*b*: alignment film, 576: insulating layer, 578: insulating layer, 599: polarizing plate, 601: source side driver circuit, 602: pixel portion, 603: gate side driver circuit, 604: sealing substrate, 605: sealant, 607: space, 608: wiring, 610: element substrate, 611: switching TFT, 612: current controlling TFT, 613: electrode, 614: insulator, 616: EL layer, 617:

electrode, 618: light-emitting element, 623: n-channel TFT, 624: p-channel TFT, 631: hole-injection layer, 632: hole-transport layer, 633: electron-transport layer, 634: electron-injection layer, 635: charge-generation layer, 637: hole-transport layer, 638: electron-transport layer, 639: electron-injection layer, 641: electrode, 642: electrode, 644: light-emitting layer, 646: light-emitting layer, 648: optical element, 650: substrate, 652: substrate, 654: substrate, 700: display panel, 701: resin layer, 702: resin layer, 800: display panel, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation button, 924: shutter button, 926: lens, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024W: electrode, 1025B: lower electrode, 1025G: lower electrode, 1025R: lower electrode, 1025W: lower electrode, 1026: partition wall, 1028: EL layer, 1029: electrode, 1031: sealing substrate, 1032: sealant, 1033: base material, 1034B: coloring layer, 1034G: coloring layer, 1034R: coloring layer, 1035: black layer, 1036: overcoat layer, 1037: interlayer insulating film, 1040: pixel portion, 1041: driver circuit portion, 1042: peripheral portion, 1931: CIE, 3500: multifunction terminal, 3502: housing, 3504: display portion, 3506: camera, 3508: lighting, 3600: light, 3602: housing, 3608: lighting, 3610: speaker, 8501: lighting device, 8502: lighting device, 8503: lighting device, 8504: lighting device, 9000: housing, 9001: display portion, 9003: speaker, 9005: operation key, 9006: connection terminal, 9007: sensor, 9008: microphone, 9055: hinge, 9200: portable information terminal, 9201: portable information terminal, 9202: portable information terminal.

This application is based on Japanese Patent Application Serial No. 2016-232765 filed with Japan Patent Office on Nov. 30, 2016, the entire contents of which are hereby incorporated by reference.

The invention claimed is:

1. A light-emitting element comprising:
an EL layer between an anode and a cathode,
wherein the EL layer has a structure where a first light-emitting layer, a second light-emitting layer, and a third light-emitting layer are stacked in this order from the anode side,
wherein light emitted from the first light-emitting layer and light emitted from the third light-emitting layer have the same color,
wherein a wavelength of each of the light emitted from the first light-emitting layer and the light emitted from the third light-emitting layer is longer than a wavelength of light emitted from the second light-emitting layer, and
wherein emission spectra of the light emitted from the first light-emitting layer and the light emitted from the third light-emitting layer each have a half width of greater than or equal to 5 nm and less than or equal to 120 nm and a peak wavelength at greater than or equal to 620 nm and less than or equal to 680 nm.

2. The light-emitting element according to claim 1,
wherein emission spectra of the light emitted from the first light-emitting layer and the light emitted from the third light-emitting layer each have at least one peak wavelength at greater than or equal to 600 nm and less than or equal to 740 nm, and wherein an emission spectrum of the light emitted from the second light-emitting layer has at least one peak wavelength at greater than or equal to 480 nm and less than or equal to 550 nm.

3. The light-emitting element according to claim 1,
wherein the first light-emitting layer and the third light-emitting layer comprise the same light-emitting material.

4. The light-emitting element according to claim 1,
wherein the first light-emitting layer and the third light-emitting layer each comprise a light-emitting material, and
wherein the light-emitting material is capable of converting triplet excitation energy into light emission.

5. The light-emitting element according to claim 1,
wherein the first light-emitting layer and the third light-emitting layer each comprise a light-emitting material, and
wherein the light-emitting material is a substance emitting phosphorescence.

6. The light-emitting element according to claim 1,
wherein the first light-emitting layer comprises a first hole-transport material and a first electron-transport material,
wherein the second light-emitting layer comprises a second hole-transport material and a second electron-transport material, and
wherein the third light-emitting layer comprises a third hole-transport material and a third electron-transport material.

7. The light-emitting element according to claim 6,
wherein the first hole-transport material, the second hole-transport material, and the third hole-transport material are the same, and
wherein the first electron-transport material, the second electron-transport material, and the third electron-transport material are the same.

8. The light-emitting element according to claim 6,
wherein the first hole-transport material and the first electron-transport material form an exciplex,
wherein the second hole-transport material and the second electron-transport material form an exciplex, and
wherein the third hole-transport material and the third electron-transport material form an exciplex.

9. The light-emitting element according to claim 1,
wherein a thickness of the second light-emitting layer is larger than each thickness of the first light-emitting layer and the third light-emitting layer.

10. The light-emitting element according to claim 1,
wherein one of the anode and the cathode is a reflective electrode, and
wherein the other of the anode and the cathode is a transflective electrode.

11. A light-emitting element comprising:
a first light-emitting unit and a second light-emitting unit between an anode and a cathode,
wherein the first light-emitting unit and the second light-emitting unit are stacked with an intermediate layer positioned between the first light-emitting unit and the second light-emitting unit,
wherein the second light-emitting unit comprises an EL layer,
wherein the EL layer has a structure where a first light-emitting layer, a second light-emitting layer, and a third light-emitting layer are stacked in this order, wherein light emitted from the first light-emitting layer and light emitted from the third light-emitting layer have the same color, wherein a wavelength of each of the light emitted from the first light-emitting layer and the light emitted from the third light-emitting layer is longer than a wavelength of light emitted from the second light-emitting layer, and wherein emission spectra of the light emitted from the first light-emitting layer and the light emitted from the third light-emitting layer each have a half width of greater than or equal to 5 nm and less than or equal to 120 nm and a peak wavelength at greater than or equal to 620 nm and less than or equal to 680 nm.

12. The light-emitting element according to claim 11, wherein emission spectra of the light emitted from the first light-emitting layer and the light emitted from the third light-emitting layer each have at least one peak wavelength at greater than or equal to 600 nm and less than or equal to 740 nm, and wherein an emission spectrum of the light emitted from the second light-emitting layer has at least one peak wavelength at greater than or equal to 480 nm and less than or equal to 550 nm.

13. The light-emitting element according to claim 11, wherein the first light-emitting layer and the third light-emitting layer comprise the same light-emitting material.

14. The light-emitting element according to claim 11, wherein the first light-emitting layer and the third light-emitting layer each comprise a light-emitting material, and wherein the light-emitting material is capable of converting triplet excitation energy into light emission.

15. The light-emitting element according to claim 11, wherein the first light-emitting layer and the third light-emitting layer each comprise a light-emitting material, and wherein the light-emitting material is a substance emitting phosphorescence.

16. The light-emitting element according to claim 11, wherein the first light-emitting layer comprises a first hole-transport material and a first electron-transport material, wherein the second light-emitting layer comprises a second hole-transport material and a second electron-transport material, and wherein the third light-emitting layer comprises a third hole-transport material and a third electron-transport material.

17. The light-emitting element according to claim 16, wherein the first hole-transport material, the second hole-transport material, and the third hole-transport material are the same, and wherein the first electron-transport material, the second electron-transport material, and the third electron-transport material are the same.

18. The light-emitting element according to claim 16, wherein the first hole-transport material and the first electron-transport material form an exciplex, wherein the second hole-transport material and the second electron-transport material form an exciplex, and wherein the third hole-transport material and the third electron-transport material form an exciplex.

19. The light-emitting element according to claim 11, wherein a thickness of the second light-emitting layer is larger than each thickness of the first light-emitting layer and the third light-emitting layer.

20. The light-emitting element according to claim 11, wherein the first light-emitting unit and the second light-emitting unit emit light with different colors.

21. The light-emitting element according to claim 11, wherein one of the anode and the cathode is a reflective electrode, and wherein the other of the anode and the cathode is a transflective electrode.

* * * * *